United States Patent
Omatsu et al.

(10) Patent No.: US 11,759,749 B2
(45) Date of Patent: *Sep. 19, 2023

(54) FILTERING DEVICE, PURIFICATION DEVICE, AND METHOD FOR MANUFACTURING CHEMICAL LIQUID

(71) Applicant: FUJIFILM Corporation, Tokyo (JP)

(72) Inventors: Tadashi Omatsu, Haibara-gun (JP); Tetsuya Kamimura, Haibara-gun (JP); Tetsuya Shimizu, Haibara-gun (JP); Satomi Takahashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 99 days.

This patent is subject to a terminal disclaimer.

(21) Appl. No.: 16/992,499

(22) Filed: Aug. 13, 2020

(65) Prior Publication Data
US 2020/0368693 A1 Nov. 26, 2020

Related U.S. Application Data

(63) Continuation of application No. PCT/JP2019/008541, filed on Mar. 5, 2019.

(30) Foreign Application Priority Data

Mar. 22, 2018 (JP) ................. 2018-055064

(51) Int. Cl.
B01D 61/08 (2006.01)
B01D 61/18 (2006.01)
(Continued)

(52) U.S. Cl.
CPC ............. B01D 61/58 (2013.01); B01D 3/145 (2013.01); B01D 61/08 (2013.01); B01D 61/18 (2013.01);
(Continued)

(58) Field of Classification Search
CPC .... B01D 61/145; B01D 61/147; B01D 61/58; B01D 65/02; B01D 71/36; B01D 2311/2623; G03F 7/26
See application file for complete search history.

(56) References Cited

U.S. PATENT DOCUMENTS 4,788,043 A * 11/1988 Kagiyama ................ B01D 3/36
422/292
5,242,468 A * 9/1993 Clark ................ H01L 21/67023
95/12
(Continued)

FOREIGN PATENT DOCUMENTS

CN 106398443 A 2/2017
CN 106659948 A 5/2017
(Continued)

OTHER PUBLICATIONS

Ogiwara, Tsutomu et al—JP 2016-073922 Machine Translation—May 12, 2016 (Year: 2016).*
(Continued)

Primary Examiner — Bradley R Spies
(74) Attorney, Agent, or Firm — Sughrue Mion, PLLC

(57) ABSTRACT

A filtering device for obtaining a chemical liquid by purifying a liquid to be purified has an inlet portion, an outlet portion, a filter A, at least one filter B different from the filter A, and a flow path which includes the filter A and the filter B arranged in series between the inlet portion and the outlet portion and extends from the inlet portion to the outlet portion, in which the filter A has a porous base material made of polyfluorocarbon and a coating layer which is disposed to cover the porous base material and contains a first resin having a hydrophilic group.

24 Claims, 23 Drawing Sheets

(51) Int. Cl.
  B01D 61/58 (2006.01)
  B01D 69/02 (2006.01)
  B01D 71/26 (2006.01)
  G03F 7/26 (2006.01)
  H01L 21/67 (2006.01)
  B01D 3/14 (2006.01)
  B01D 65/02 (2006.01)
  B01D 69/12 (2006.01)
  B01D 71/36 (2006.01)
  B01D 71/56 (2006.01)

(52) U.S. Cl.
  CPC ............ *B01D 65/02* (2013.01); *B01D 69/02* (2013.01); *B01D 69/12* (2013.01); *B01D 71/26* (2013.01); *B01D 71/36* (2013.01); *B01D 71/56* (2013.01); *H01L 21/67017* (2013.01); *B01D 2311/25* (2013.01); *B01D 2311/2669* (2013.01); *B01D 2313/50* (2013.01); *B01D 2317/025* (2013.01); *B01D 2317/08* (2013.01); *B01D 2325/02* (2013.01); *B01D 2325/36* (2013.01); *B01D 2325/42* (2013.01); *G03F 7/26* (2013.01)

(56) References Cited

U.S. PATENT DOCUMENTS

| | | | | |
|---|---|---|---|---|
| 2006/0014098 | A1* | 1/2006 | Hada | B01D 71/26 430/270.1 |
| 2007/0265478 | A1* | 11/2007 | Ji | C07C 17/208 570/161 |
| 2009/0039019 | A1* | 2/2009 | Raman | B01D 69/147 210/490 |
| 2014/0131278 | A1* | 5/2014 | Sakamoto | B01D 41/04 210/257.2 |
| 2015/0144557 | A1* | 5/2015 | Ly | B01D 69/12 210/260 |
| 2016/0288059 | A1 | 10/2016 | Aamer et al. | |
| 2016/0288061 | A1 | 10/2016 | Aamer et al. | |
| 2016/0288063 | A1 | 10/2016 | Ait-Haddou et al. | |
| 2017/0197184 | A1 | 7/2017 | Aamer et al. | |
| 2017/0247265 | A1 | 8/2017 | Fujita et al. | |
| 2018/0193805 | A1 | 7/2018 | Ogura et al. | |
| 2019/0033718 | A1 | 1/2019 | Kamimura | |
| 2019/0060782 | A1 | 2/2019 | Shimizu | |

FOREIGN PATENT DOCUMENTS

| | | |
|---|---|---|
| JP | 2003-251120 A | 9/2003 |
| JP | 2013-218308 A | 10/2013 |
| JP | 2016-073922 A | 5/2016 |
| JP | 2016-194038 A | 11/2016 |
| JP | 2016-196625 A | 11/2016 |
| JP | 2016-199733 A | 12/2016 |
| KR | 10-2016-0117133 A | 10/2016 |
| WO | 2017/022836 A1 | 2/2017 |
| WO | 2017/175856 A1 | 10/2017 |
| WO | 2017/188209 A1 | 11/2017 |
| WO | 2018/043697 A1 | 3/2018 |

OTHER PUBLICATIONS

Notification of Reason for Refusal dated Nov. 22, 2021 from the Korean Patent Office in Korean Application No. 10-2020-7024712.
Communication dated Sep. 14, 2021 from the Japanese Patent Office in Application No. 2020-508152.
International Search Report dated May 28, 2019 in International Application No. PCT/JP2019/008541.
Written Opinion of the International Searching Authority dated May 28, 2019 in International Application No. PCT/JP2019/008541.
International Preliminary Report on Patentability dated Sep. 22, 2020 in International Application No. PCT/JP2019/008541.
Office Action dated Dec. 2, 2021 from the China National Intellectual Property Administration in CN Application No. 201980016131.X.
Office Action dated May 16, 2022 from the Taiwanese Intellectual Property Office in TW Application No. 108107706.
Office Action dated May 23, 2022 from the Korean Intellectual Property Office in KR Application No. 10-2020-7024712.
Office Action dated Jun. 1, 2022 issued by the Chinese Patent Office in Chinese Application No. 201980016131.X.
Notice of Final Rejection dated Sep. 6, 2022 in Korean Application No. 10-2020-7024712.
Written Decision on Dismissal of Amendment dated Sep. 6, 2022 in Korean Application No. 10-2020-7024712.
Communication dated Oct. 14, 2022, issued in Chinese Application No. 201980016131.X.
Office Action dated Feb. 2, 2023 from the China National Intellectual Property Administration in CN Application No. 201980016131.X.

* cited by examiner

FILTERING DEVICE, PURIFICATION DEVICE, AND METHOD FOR MANUFACTURING CHEMICAL LIQUID

CROSS-REFERENCE TO RELATED APPLICATIONS

This application is a Continuation of PCT International Application No. PCT/JP2019/008541 filed on Mar. 5, 2019, which claims priority under 35 U.S.C. § 119(a) to Japanese Patent Application No. 2018-055064 filed on Mar. 22, 2018. Each of the above application(s) is hereby expressly incorporated by reference, in its entirety, into the present application.

BACKGROUND OF THE INVENTION

1. Field of the Invention

The present invention relates to a filtering device, a purification device, and a method for manufacturing a chemical liquid.

2. Description of the Related Art

In a case where semiconductor devices are manufactured by a wiring forming process including photolithography, as a prewet solution, a resist solution (resist resin composition), a developer, a rinsing solution, a peeling solution, a chemical mechanical polishing (CMP) slurry, a post-CMP washing solution or the like or as a diluted solution of these, a chemical liquid containing water and/or an organic solvent is used.

In recent years, as photolithography techniques have become advanced, patterns have been further miniaturized.

The chemical liquid used in such a wiring forming process is required to have further improved defect inhibition performance. Generally, such a chemical liquid is considered to be obtained by purifying a liquid to be purified, which contains requisite components for the chemical liquid as main components, by using a filter or the like so as to remove impurities and the like.

As a filter that can be used for purifying such a chemical liquid, JP2016-199733A and JP2016-194038A describe a hydrophilic composite porous membrane which includes a porous fluoropolymer support and a coating including a copolymer which includes a predetermined repeating unit.

SUMMARY OF THE INVENTION

The inventors of the present invention obtained a chemical liquid by purifying a liquid to be purified by using the aforementioned filter and evaluated the defect inhibition performance of the chemical liquid. As a result, the inventors have found that sometimes a sufficient defect inhibition performance is not obtained. Therefore, an object of the present invention is to provide a filtering device capable of manufacturing a chemical liquid having excellent defect inhibition performance. Another object of the present invention is to provide a purification device and a method for manufacturing a chemical liquid.

In the present specification, "defect inhibition performance" of a chemical liquid means the performance of the chemical liquid evaluated by the method described in Examples. A chemical liquid used for manufacturing a semiconductor substrate is required to have "defect inhibition performance" corresponding to the type and role of the chemical liquid.

In the present specification, for a chemical liquid such as a prewet solution, a developer, or a rinsing solution that is used for forming a resist film, the residue defect inhibition performance described in [Test Example 1] in Examples, which will be described later, is adopted as one of the typical indices of defects in a lithography process and is regarded as "defect inhibition performance". Furthermore, for a resist resin composition containing a resin and used for forming a resist film, the bridge defect described in [Test Example 3] in Examples, which will be described later, is adopted as one of the typical indices of defects derived from the resist resin composition in a lithography process, and the bridge defect inhibition performance is regarded as "defect inhibition performance". In addition, for a chemical liquid used as an etching solution, a resist peeling solution, or the like, the particle defect described in [Test Example 2] in Examples, which will be described later, is adopted as one of the typical indices of defects derived from the chemical liquid, and the particle defect inhibition performance is regarded as "defect inhibition performance".

Hereinafter, in a case where a characteristic is simply referred to as "defect inhibition performance", this means the defect inhibition performance (residue defect inhibition performance, bridge defect inhibition performance, or particle defect inhibition performance) corresponding to the type of the chemical liquid.

In order to achieve the aforementioned objects, the inventors of the present invention carried out intensive examinations. As a result, the inventors have found that the objects are achieved by the following constitution.

[1] A filtering device for obtaining a chemical liquid by purifying a liquid to be purified, the filtering device having an inlet portion, an outlet portion, a filter A, at least one filter B different from the filter A, and a flow path which includes the filter A and the filter B arranged in series between the inlet portion and the outlet portion and extends from the inlet portion to the outlet portion, in which the filter A has a porous base material made of polyfluorocarbon and a coating layer which is disposed to cover the porous base material and contains a first resin having a hydrophilic group.

[2] The filtering device described in [1], in which the hydrophilic group is a polyoxyalkylene group.

[3] The filtering device described in [1] or [2], in which the filter B includes at least one filter BU disposed on an upstream side of the filter A on the flow path.

[4] The filtering device described in [3], in which at least one filter BU has a pore size larger than a pore size of the filter A.

[5] The filtering device described in [3] or [4], in which at least one filter BU has a pore size equal to or greater than 20 nm.

[6] The filtering device described in any one of [3] to [5], in which at least one filter BU contains a resin having an ion exchange group.

[7] The filtering device described in [6], in which the ion exchange group is at least one selected from the group consisting of an acid group, a base group, an amide group, and an imide group.

[8] The filtering device described in any one of [3] to [7], in which at least one filter BU is different from the filter A at least in terms of material.

[9] The filtering device described in any one of [3] to [8], further having a return flow path capable of returning a liquid to be purified to an upstream side of a first reference filter from a downstream side of the first reference filter, in which the first reference filter consists of at least one selected from the group consisting of the filter A and the filter BU.

[10] The filtering device described in any one of [1] to [9], in which the filter B includes at least a filter BD disposed on a downstream side of the filter A on the flow path.

[11] The filtering device described in [10], in which at least one filter BD has a pore size smaller than a pore size of the filter A.

[12] The filtering device described in [10] or [11], in which at least one filter BD has a pore size equal to or smaller than 20 nm.

[13] The filtering device described in any one of [10] to [12], in which the filter BD contains at least one kind of compound selected from the group consisting of polyolefin, polyamide, polyfluorocarbon, polystyrene, polysulfone, and polyethersulfone.

[14] The filtering device described in any one of [10] to [13], in which the filter BD contains a second resin having a hydrophilic group.

[15] The filtering device described in any one of [10] to [14], further having a return flow path capable of returning a liquid to be purified to an upstream side of a second reference filter from a downstream side of the second reference filter, in which the second reference filter consists of at least one kind of filter selected from the group consisting of the filter A and the filter BD.

[16] The filtering device described in any one of [1] to [15], further having a tank arranged in series with the filter A on the flow path.

[17] The filtering device described in [16], further having a filter C which is arranged in series with the tank on an upstream side of the tank in the flow path and has a pore size equal to or greater than 20 nm.

[18] The filtering device described in any one of [1] to [17], in which the chemical liquid is at least one selected from the group consisting of a developer, a rinsing solution, a wafer washing solution, a line washing solution, a prewet solution, a wafer rinsing solution, a resist solution, a solution for forming an underlayer film, a solution for forming an overlayer film, and a solution for forming a hardcoat or at least one selected from the group consisting of an aqueous developer, an aqueous rinsing solution, a peeling solution, a remover, an etching solution, an acidic washing solution, phosphoric acid, and a phosphoric acid-aqueous hydrogen peroxide mixture.

[19] A purification device having the filtering device described in any one of [1] to [17] and at least one distiller connected to the inlet portion of the filtering device.

[20] The purification device described in [19], in which at least one distiller includes a plurality of distillers connected in series.

[21] A method for manufacturing a chemical liquid that is for obtaining a chemical liquid by purifying a liquid to be purified, the method having a filtration step of purifying the liquid to be purified by using the filtering device described in any one of [1] to [17] so as to obtain a chemical liquid.

[22] The method for manufacturing a chemical liquid described in [21], further having a filter washing step of washing the filter A and the filter B before the filtration step.

[23] The method for manufacturing a chemical liquid described in [21] or [22], further having a device washing step of washing a liquid contact portion of the filtering device before the filtration step.

[24] A method for manufacturing a chemical liquid that is for obtaining a chemical liquid by purifying a liquid to be purified, the method having a step of filtering the liquid to be purified by using a filter A including a porous base material made of polyfluorocarbon and a coating layer which is disposed to cover the porous base material and contains a first resin having a hydrophilic group and a filter B different from the filter A so as to obtain a chemical liquid.

According to the present invention, it is possible to provide a filtering device capable of manufacturing a chemical liquid having excellent defect inhibition performance. Furthermore, the present invention can also provide a purification device and a method for manufacturing a chemical liquid.

DESCRIPTION OF THE PREFERRED EMBODIMENTS

Figure 1:
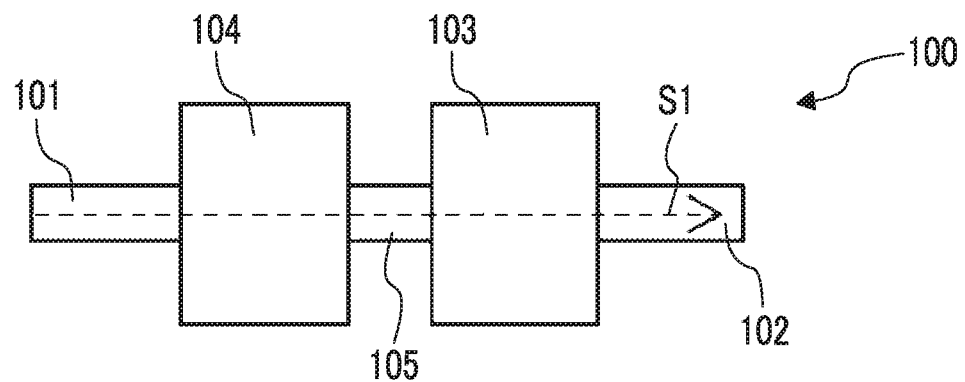
FIG. 1 is a schematic view illustrating a filtering device according to a first embodiment of the present invention.

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values described before and after "to" as a lower limit and an upper limit respectively.

[Filtering Device]

The filtering device according to an embodiment of the present invention has an inlet portion, an outlet portion, a filter A, at least one filter B different from the filter A, and a flow path (path through which a liquid to be purified flows) which includes the filter A and the filter B arranged in series between the inlet portion and the outlet portion and extends from the inlet portion to the outlet portion (in other words, the filtering device has a flow path which includes a filter A and at least one filter B different from the filter A arranged in series between an inlet portion and an outlet portion and extends from the inlet portion to the outlet portion), in which the filter A has a porous base material made of polyfluorocarbon and a coating layer that is disposed to cover the base material and contains a first resin having a hydrophilic group. The filtering device has a flow path extending from the inlet portion to the outlet portion, in which the filter A and at least one filter B different from the filter A are arranged in series between the inlet portion and the outlet portion.

In the present specification, "the filter A and the filter B are different from each other" means that these filters are different from each other in terms of at least one kind of item selected from the group consisting of pore size, pore structure, and material (such as a material component contained in each filter).

Generally, as impurities in a chemical liquid involved in the defect inhibition performance of the chemical liquid, for example, a gel-like organic compound (particularly, a polymer compound) component, inorganic fine particles, inorganic ions, and the like are considered.

It is considered that among these, the gel-like polymer compound or the inorganic fine particles that can be solid contents in the chemical liquid may be easily removed by a sieving effect of a filter, and thus the defect inhibition performance of the obtained chemical liquid may be improved.

In contrast, it is considered that the inorganic components other than particles and the ionic components may be easily removed by an adsorption function of a filter (such as the adsorption by the interaction between ions and the adsorption by the hydrophilic and hydrophobic interaction), and thus the defect inhibition performance of the obtained chemical liquid may be improved.

By the inventors of the present invention, it has been found, for the first time, that in a case where a filter having a sieving effect and a filter having an adsorption effect are arranged in series on a flow path of a filtering device, a chemical liquid is obtained which has a defect inhibition performance improved further than in a case where the each of the above filters is used singly. According to the inventors of the present invention, the mechanism yielding the above result is assumed to be as below.

According to the study of the inventors of the present invention, it has been revealed that sometimes defects occur in a case where microgel (containing an organic compound) which is not a source of defect alone interacts with inorganic fine particles and/or inorganic ions, in a case where inorganic fine particles, trace metals, and the like which are not a source of defect alone interact with a gel-like organic compound, or in a case where microgel interacts with inorganic fine particles, trace metals, and the like.

Particularly, by the filtration based on a molecular sieving effect, microgel is not thoroughly removed due to the influence of solvation in a chemical liquid. In a case where the chemical liquid is applied to a wafer and then dried, the effect of solvation is reduced, and thus gel is formed, which is considered as one of the causes of the occurrence of defects.

For such a complex source of defect, it is effective to remove each of the causative components interacting with each other. It is considered that in a case where the microgel component and the inorganic ultrafine particle component and the inorganic ion component capable of interacting with the microgel component are removed by the sieving effect and the adsorption effect, defects could be further reduced.

Presumably, by the combination of the sieving effect brought about by the porous polyfluorocarbon (for example, polytetrafluoroethylene: PTFE membrane) coated with the first resin having a hydrophilic group and the effect of removing the source of ions and/or the inorganic fine particles brought about by filters combined with the filter A, the filtering device according to the present embodiment can efficiently remove the substances easily causing defects by interactions from a liquid to be purified, and thus the effect of reducing defects in the chemical liquid could be further improved.

Hereinafter, the filtering device will be described using drawings. In the filtering device according to the embodiment of the present invention, because the filter A and the filter B are arranged in series on the flow path, the liquid to be purified is sequentially filtered through the filter A and the filter B (or the filter B and the filter A). Hereinafter, the filtering device according to the embodiment of the present invention will be described. In the following section, a filtering device for a dead-end filtration method that filters the entirety of a liquid to be purified introduced into a filter by using the filter will be described for example. However, the filtering device according to the embodiment of the present invention is not limited thereto, and may be a filtering device for a cross-flow method that divides the introduced liquid to be purified into a liquid to be purified having undergone purification and a concentrate (sometimes the concentrate is introduced again into a filter as a liquid to be purified) or may be a filtering device for a method as a combination of the dead-end filtration method and the cross-flow method.

First Embodiment

FIG. 1 is a schematic view illustrating a filtering device according to a first embodiment of the present invention.

A filtering device 100 is a filtering device in which a filter 103 as a filter A and a filter 104 (corresponding to a filter BU) different from the filter 103 are arranged in series through a piping 105 between an inlet portion 101 and an outlet portion 102.

The inlet portion 101, the filter 104, a piping 202, the filter 103, and the outlet portion 102 are constituted such that a liquid to be purified can flow in each of these members. These members are connected to one another and form a flow path S1 (path through which the liquid to be purified flows).

The shape of the inlet portion 101 and the outlet portion 102 is not particularly limited as long as the liquid to be purified can be introduced into and discharged from the filtering device. Typically, examples thereof include a hollow cylindrical piping (inlet portion and outlet portion) having an inlet port and an outlet port. Hereinafter, an embodiment in which each of the outlet portion and the inlet portion is a piping will be described for example. The shapes of the inlet portion 101, the piping 105, and the outlet portion 102 are not particularly limited. Typically, examples thereof include a hollow cylinder shape in which the liquid to be purified can flow in these members. Although the material of these is not particularly limited, it is preferable that a liquid contact portion (a portion that is likely to contact the liquid to be purified in a case where the liquid to be purified is filtered) thereof contains an anticorrosive material, which will be described later, as a material component (constituent component). In other words, it is preferable that the liquid contact portion is formed of the anticorrosive material which will be described later.

The liquid to be purified introduced from the inlet portion 101 of the filtering device 100 flows in the filtering device 100 along the flow path S1. In the meantime, the liquid to be purified is sequentially filtered through the filter 103 (filter A) and the filter 104 (filter BU) and then discharged out of the filtering device 100 from the outlet portion 102. The form of the liquid to be purified will be described later.

For the purpose of allowing the liquid to be purified to flow, the filtering device 100 may have a pump, a damper, a valve, and the like, which are not shown in the drawing, on the flow path S1 (for example, in the inlet portion 101, the piping 105, the outlet portion 102, and the like). The method of allowing the liquid to be purified to flow along the flow path in the filtering device 100 is not limited to the above, and may be a method of introducing the liquid to be purified into the inlet portion by applying pressure thereto.

The shape of the filter 103 (filter A) and the filter 104 (filter BU) is not particularly limited. For example, the filter A and the filter B have a flat shape, a pleated shape, a spiral shape, a hollow cylindrical shape, and the like. Particularly, in view of further improving handleability, typically, the filter A and the filter B are preferably in the form of a cartridge filter having a core, which is formed of a material permeable to the liquid to be purified and/or has a structure permeable to the liquid to be purified, and a filter which is disposed on the core in a state of being wound around the core. In this case, although the material of the core is not particularly limited, it is preferable that the core is formed of the anticorrosive material which will be described later.

The method of arranging the filters is not particularly limited. Typically, it is preferable to arrange the filters in a housing not shown in the drawing that has at least one entrance, at least one exit, and at least one flow path formed between the entrance and the exit. In this case, the filters are arranged to cross the flow path in the housing. The flow path formed in the housing forms a portion of the flow path S1. While flowing through the flow path S1, the liquid to be purified is filtered through the filters that are arranged to cross the flow path S1.

The material of the housing is not particularly limited. Examples thereof include any appropriate hard and impermeable materials including impermeable thermoplastic materials compatible with the liquid to be purified. For example, the housing can be prepared from a metal such as stainless steel or a polymer. In an embodiment, the housing is a polymer such as polyacrylate, polypropylene, polystyrene, or polycarbonate.

Furthermore, in view of obtaining a filtering device having further improved effects of the present invention, at least a portion of a liquid contact portion of the housing, which is preferably 90% and more preferably 99% of the surface area of the liquid contact portion, is preferably formed of the anticorrosive material which will be described later. In the present specification, the liquid contact portion means a portion which is likely to contact the liquid to be purified (here, the filter is not included in the liquid contact portion), and means the inner wall of a unit such as the housing and the like.

<Filter A>

The filter A has a porous base material made of polyfluorocarbon and a coating layer which is disposed to cover the porous base material and contains a first resin having a hydrophilic group. It is preferable that the entirety of the surface of the porous base material is covered with the coating layer. However, the surface of the porous base material may have a portion as a region that is not covered with the coating layer. The surface also includes the surface of pores of the porous base material.

As the porous base material made of polyfluorocarbon, known porous base materials can be used without particular limitation.

Examples of the polyfluorocarbon include polytetrafluoroethylene, perfluoroalkoxyalkane, a perfluoroethylene propene copolymer, an ethylene/tetrafluoroethylene copolymer, an ethylene-chlorotrifluoroethylene copolymer, polychlorotrifluoroethylene, polyvinylidene fluoride, polyvinyl fluoride, and the like. Among these, polytetrafluoroethylene (PTFE) is preferable. As the filter A, those commercially available as porous base materials made of PTFE can be used as appropriate.

The pore size of the filter A is not particularly limited. Generally, the pore size of the filter A is preferably 0.1 to 200 nm, more preferably 1 to 50 nm, and even more preferably 3 to 30 nm.

In the present specification, "pore size" means a pore size determined by the bubble point of isopropanol (IPA) or HFE-7200 ("NOVEC 7200", manufactured by 3M, hydrofluoroether, $C_4F_9OC_2H_5$).

The method for manufacturing the filter A is not particularly limited. Typically, it is preferable to use a method of bringing the porous base material made of polyfluorocarbon (for example, PTFE) into contact with a composition for forming a coating layer containing the first resin having a hydrophilic group (for example, by means of coating and/or spraying) such that the coating layer is formed on the surface of the porous base material (including the inner surface of pores).

The coating layer contains the first resin having a hydrophilic group. As the resin, known resins can be used without particular limitation. From the viewpoint of solvent resistance and the like, polynorbonene or a copolymer thereof is particularly preferable.

The hydrophilic group is not particularly limited, and examples thereof include a hydroxyl group, an ether group, an oxyalkylene group, a polyoxyalkylene group, a carboxylic acid group, an ester group, a carbonic acid ester group, a thiol group, a thioether group, a phosphoric acid group, and a phosphoric acid ester group, an amide group, an imide group, a group obtained by combining these (for example, a group having a thioether group and a hydroxyl group), and the like. In view of further improving the effects of the present invention, a polyoxyalkylene group is preferable.

Hereinafter, an embodiment of the filter A having a coating layer containing polynorbonene, which contains a polyoxyalkylene group as a hydrophilic group, or a copolymer thereof will be specifically described.

First Embodiment of Filter A

Examples of a first embodiment of the filter A include a filter having a porous base material made of polyfluorocarbon and a coating layer which is disposed to cover the porous base material and contains a copolymer (I) having a hydrophilic group.

The copolymer (I) has the following repeating units (hereinafter also simply referred to as "units") A and B. The unit A is represented by the following formula.

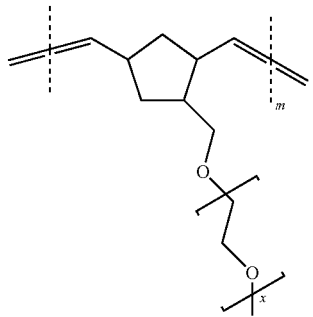

Furthermore, the unit B is represented by the following formula.

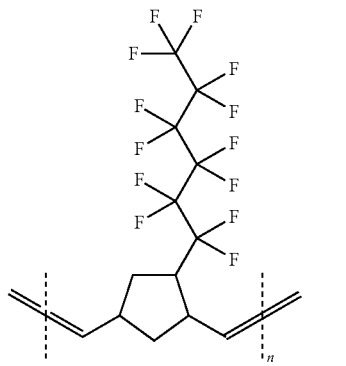

or

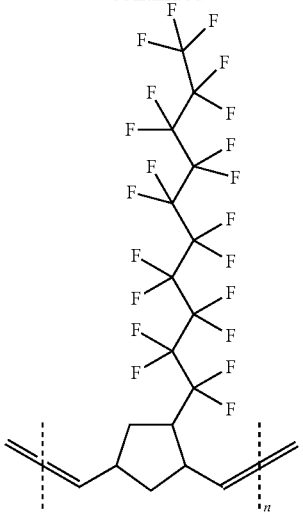

In the above formulas, the copolymer (I) is a block copolymer or a random copolymer, x is 3 to 10, and n and m are the number of repeating units A and B present in the copolymer (I). n and m are in a range of 1 to 1,000, and add up to 10 or greater. The copolymer (I) may be crosslinked.

In the above formulas, the dotted line in the formulas of the units shows that the copolymer (I) can be a block copolymer or a random copolymer. The block copolymer is represented by a bracket (repeating unit). The random copolymer is represented by a square bracket [repeating unit].

In an embodiment, n and m represent a degree of polymerization of each monomer. n and m are preferably independently 10 to 1,000, and more preferably independently 20 to 50.

In another embodiment, n and m represent a molar fraction of monomers present in the copolymer (I). n and m are preferably independently in a range of 1 to 99 mol %, and more preferably independently in a range of 20 to 50 mol %.

According to an embodiment, the copolymer (I) is represented by one of the following formulas.

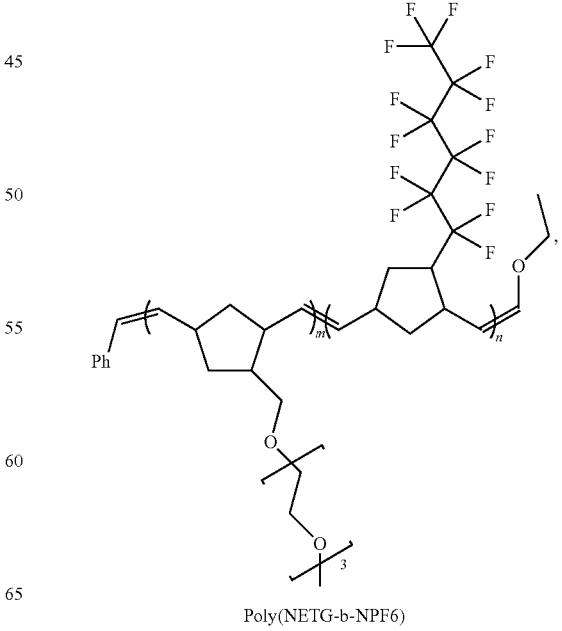

Poly(NETG-b-NPF6)

-continued

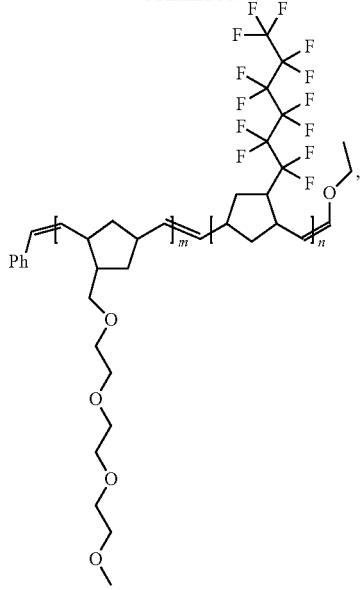

Poly(NTEG-r-NPF6)

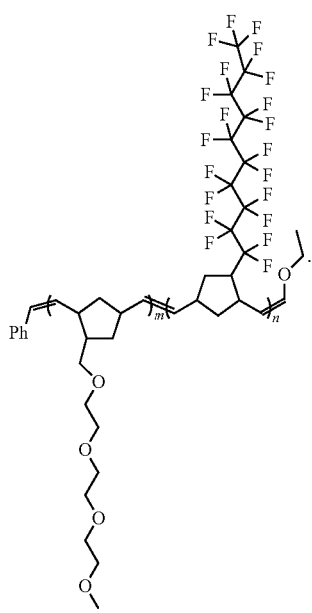

Poly(NTEG-b-NPF10)

In an embodiment, the present invention is a hydrophilic composite porous membrane which includes a porous base material made of polytetrafluoroethylene and a coating layer including a copolymer (I), in which the copolymer (I) includes units A and B and one or more chelating functional groups or ion exchange functional groups bonded to one or more units A, and the unit A is represented by the following formula.

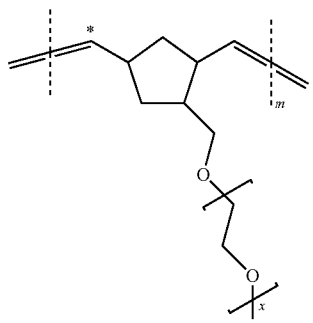

The unit B is represented by the following formula.

[structures shown]

or

[structure shown];

\* is a binding point of a chelating functional group or an ion exchange functional group. The copolymer (I) is a block copolymer or a random copolymer. x is 3 to 10, and n and m are the number of units A and B present in the copolymer (I). n and m are in a range of 1 to 1,000, and add up to 10 or greater. The copolymer (I) is optionally crosslinked.

In an embodiment, the chelating functional group or the ion exchange functional group is selected from carboxyalkylthio, sulfonealkylthio, and glycerylthio groups and a combination of these.

Examples of the copolymer (I) according to the above embodiment include the following copolymers.

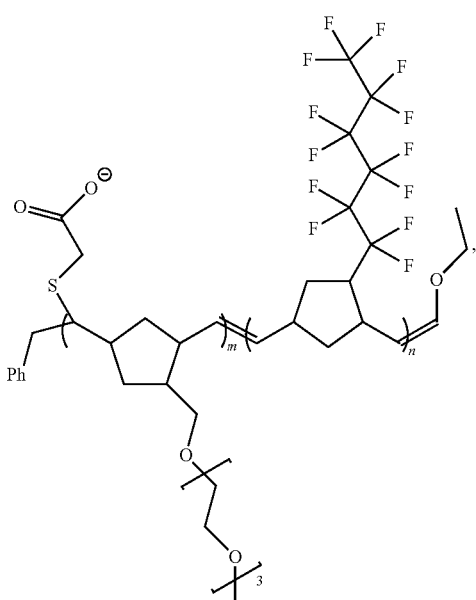

Poly(NTEG-b-NPF6)/MAcOH

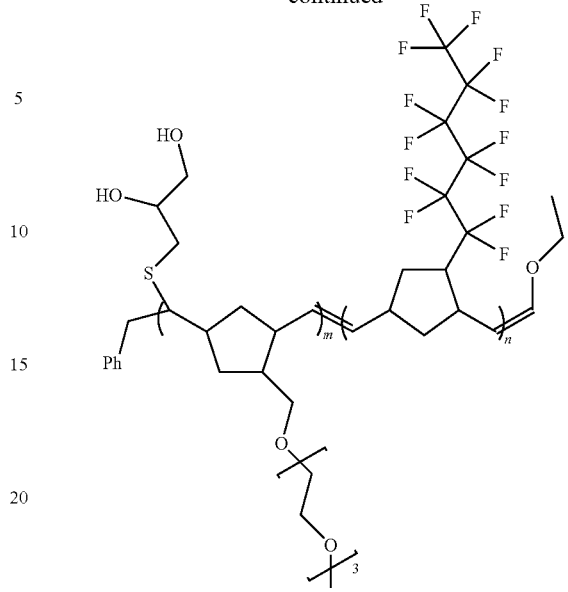

Poly(NTEG-b-NPF6)/thioglycerol

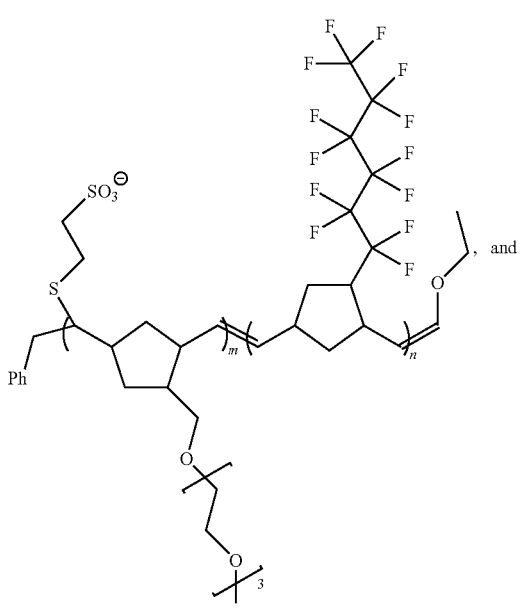

Poly(NTEG-b-NPF6)/MeSNa

The copolymer (I) can be a block copolymer or a random copolymer. The block copolymer (I) is a diblock copolymer (A-B), a triblock copolymer (A-B-A or B-A-B), or a multiblock copolymer ((A-B)x). The copolymer (I) can include a third segment C, for example, a triblock copolymer or a random copolymer such as A-B-C.

The copolymer (I) has any suitable molecular weight. For example, in an embodiment, the number-average molecular weight or weight-average molecular weight (Mn or Mw) of the copolymer (I) is preferably 10,000 to 1,000,000, more preferably 75,000 to 500,000, and even more preferably 250,000 to 500,000.

The filter A according to the above embodiment can be manufactured by a known method. The method described in paragraphs "0018" to "0036" of JP2016-199733A can be referred to.

The surface tension of the obtained membrane can be measured as follows. For example, in a case where a polytetrafluoroethylene (PTFE) membrane sheet is preliminarily wet with an isopropanol (IPA) solvent and immersed in a polymer solution having a concentration in a range of 0.1% to 10% by mass, the PTFE membrane sheet is coated at room temperature. The coating time for the PTFE membrane sheet is in a range of about 1 minute to 12 hours. After the immersion, the PTFE membrane sheet is dried in a convection oven at 100° C. to 160° C. The drying time is in a range of about 10 minutes to 12 hours. The wetting characteristics of the PTFE membrane are evaluated by measuring the critical wetting surface tension.

The change in surface modification relative to the surface tension can be investigated by measuring the critical wetting surface tension. The critical wetting surface tension is measured by a method relying on a set of solutions having a certain composition. Each solution has a specific surface tension. The surface tension of these solutions is in a range of 25 to $92 \times 10^{-5}$ N/cm with small unequal increments. In order to measure the surface tension of the membrane, the membrane is placed on a white light table, a drop of solution having a certain surface tension is applied to the surface of the membrane, and the time taken for the solution droplet to permeate the membrane and then turns bright white showing that light has been transmitted through the membrane is recorded. In a case where the time taken for the solution droplet to permeate the membrane is equal to or shorter than 10 seconds, it is considered that the solution instantaneously wets the membrane. In a case where the time is longer than 10 seconds, it is considered that the solution partially wets the membrane.

Crosslinks can be formed using any suitable method, for example, a photoinitiator and high energy radiation such as ultraviolet. It is considered that the crosslinks will result in an extremely stable polymer network structure for the membrane.

The crosslinks can be formed as follows. A polymer-coated PTFE sheet is optionally preliminarily wet with IPA, and then washed with a solvent in which a photoinitiator is prepared, such that IPA is exchanged with the solvent. Thereafter, the sheet may be immersed in a photoinitiator solution having a certain concentration for a certain period of time and then irradiated with UV. The time of immersion in the photoinitiator solution is preferably in a range of 1 minute to 24 hours. The UV irradiation time is preferably in a range of 30 seconds to 24 hours. Then, by determining the critical wetting surface tension and performance characteristics of the membrane and/or performing an SPM test, the characteristics of the membrane can be evaluated. In the present specification, "SPM" means a high-temperature sulfuric acid-hydrogen peroxide mixture at 120° C. to 180° C. (the ratio of $H_2SO_4$ (96%):$H_2O_2$ (30%) is 80:20 by volume).

According to an embodiment, the hydrophilic PTFE membrane is a porous membrane, for example, a nanoporous membrane with pores having a diameter of 1 nm to 100 nm or a microporous membrane with pores having a diameter of 1 μm to 10 μm.

Second Embodiment of Filter A

A second embodiment of the filter A is a hydrophilic composite porous membrane including a porous base material made of polytetrafluoroethylene and a coating layer including a copolymer (II) which includes repeating units C and D. The unit C is represented by the following formula.

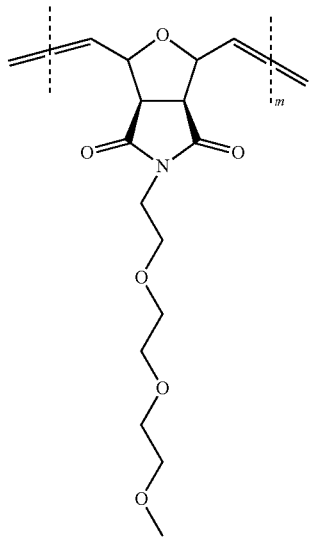

The unit D is represented by the following formula.

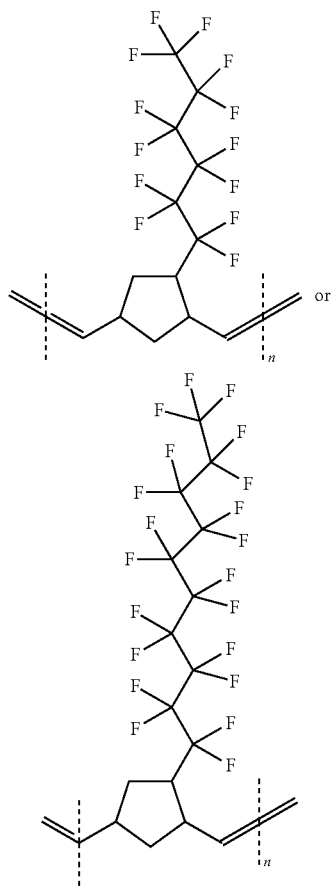

In the above formulas, the copolymer (II) is a block copolymer or a random copolymer, and n and m are the number of units C and D present in the copolymer. n and m are in a range of 1 to 1,000, and add up to 10 or greater. The copolymer (II) is optionally crosslinked.

In an embodiment, n and m represent a degree of polymerization of each monomer. n and m are preferably independently 10 to 1,000, and more preferably independently 20 to 50.

In another embodiment, n and m represent a molar fraction of monomers present in the copolymer (II). n and m are preferable independently 1 to 99 mol %, and more preferably independently 20 to 50 mol %.

The copolymer (II) may be a block copolymer or a random copolymer. The block copolymer can be a diblock copolymer (C-D), a triblock copolymer (C-D-C or D-C-D), or a multiblock copolymer ((C-D)x). The copolymer can optionally include a third segment C, for example, a triblock copolymer or a random copolymer such as C-D-C.

The copolymer has any suitable molecular weight. For example, in an embodiment, the number-average molecular weight or weight-average molecular weight (Mn or Mw) of the copolymer is preferably 10,000 to 1,000,000, more preferably 75,000 to 500,000, and even more preferably 250,000 to 500,000.

Each unit (block) can be present in the copolymer (II) in any suitable proportion represented by % by mass.

The copolymer (II) can have any suitable molecular chain end, for example, a molecular chain end which is selected from an aryl group and an alkoxy group and preferably selected from a phenyl group and an ethoxy group.

According to an embodiment, the copolymer (II) is represented by the following formula.
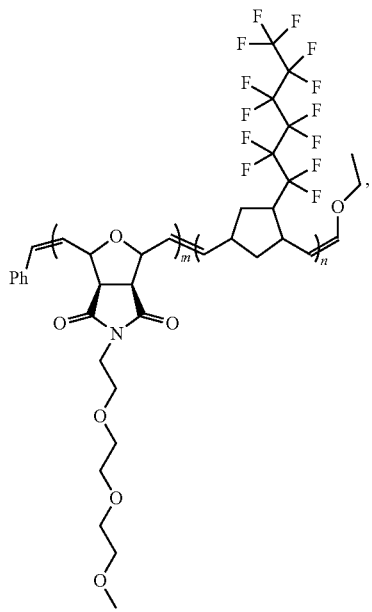
Poly(M8-b-NPF6)
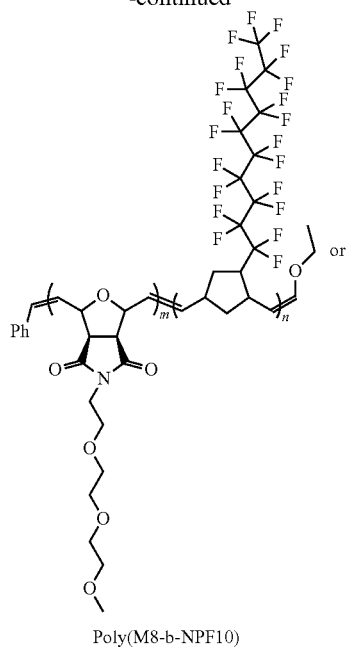
Poly(M8-b-NPF10)
Poly(M8-r-NPF6)
Poly(M8-r-NPF10)

According to an embodiment, the copolymer (II) may further include one or more units E.

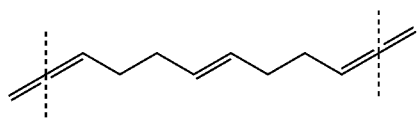

Examples of the copolymer (II) according to the above embodiment include the following copolymer.

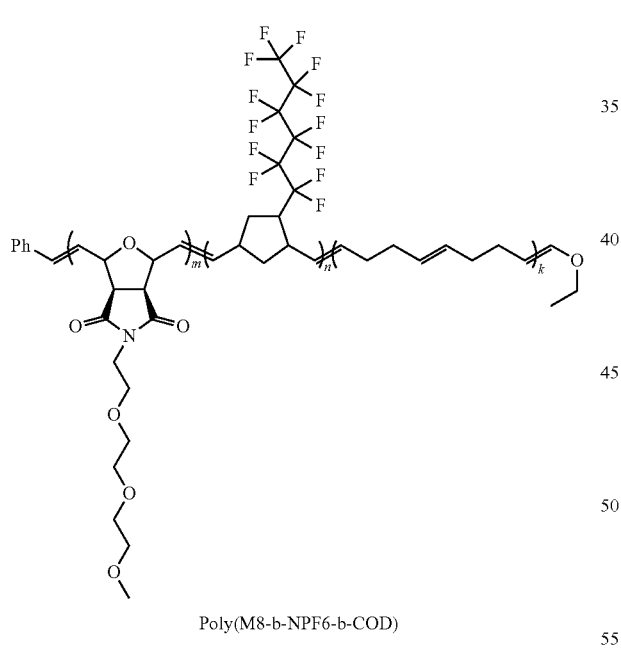

Poly(M8-b-NPF6-b-COD)

In the formula, k=1 to 1,000.

Any of the embodiments of the copolymer (II) can further include one or more chelating functional groups or ion exchange functional groups bonded to any repeating unit, particularly, the unit C and/or the unit D.

Therefore, the filter A according to the present embodiment is a hydrophilic composite porous membrane including a porous base material made of polytetrafluoroethylene and a coating layer including the copolymer (II) which includes the unit C, the unit D, and one or more chelating functional groups or ion exchange functional groups bonded to one or more units C and D. The unit C is represented by the following formula.

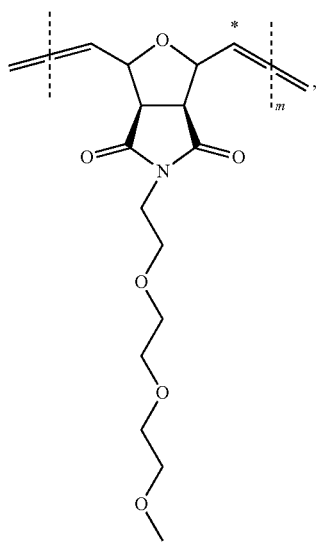

The unit D is represented by the following formula.

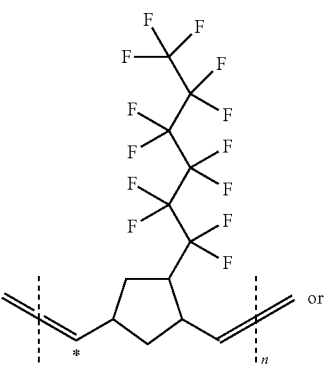

-continued

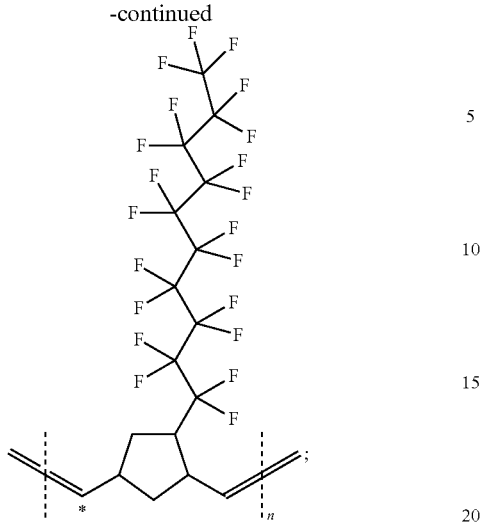

\* is a binding point of a chelating functional group or an ion exchange functional group. The copolymer (II) is a block copolymer or a random copolymer, and n and m are the number of repeating units C and D present in the copolymer (II). n and m are in a range of 1 to about 1,000, and add up to 10 or greater. The copolymer (II) is optionally crosslinked.

Examples of the copolymer (II) include the following copolymers.

-continued

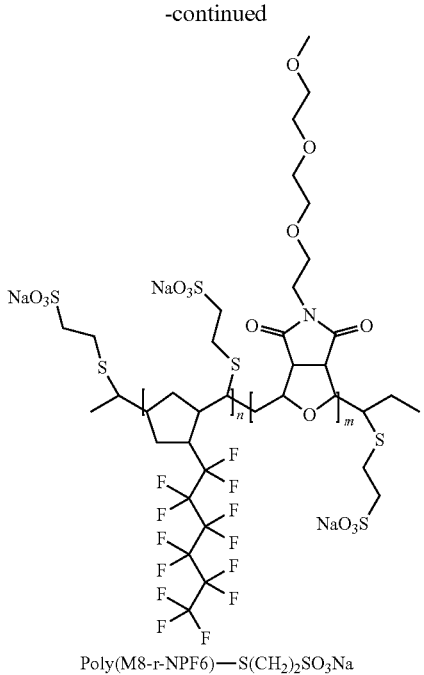

Poly(M8-r-NPF6)—S(CH$_2$)$_2$SO$_3$Na

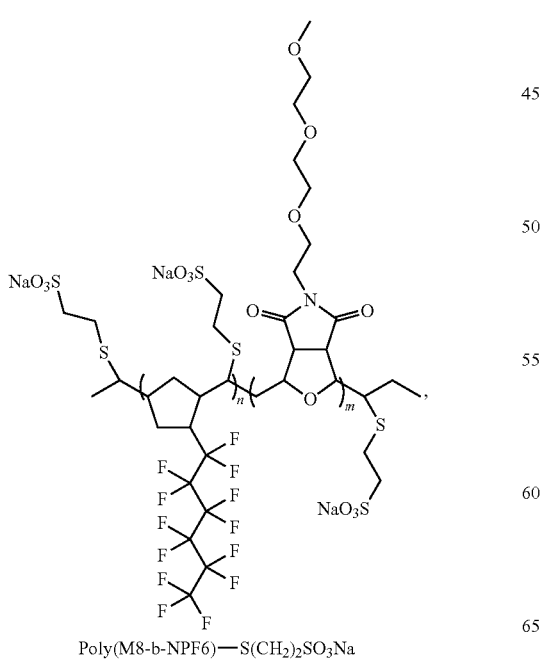

Poly(M8-b-NPF6)—S(CH$_2$)$_2$SO$_3$Na

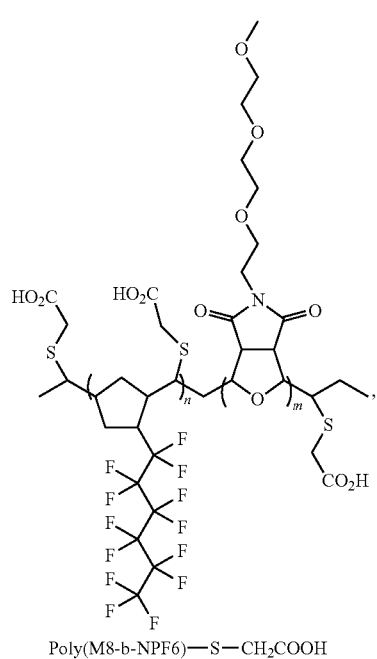

Poly(M8-b-NPF6)—S—CH$_2$COOH

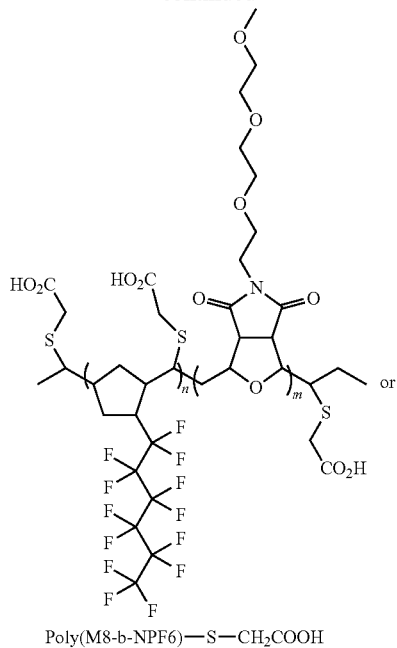

Poly(M8-b-NPF6)—S—CH₂COOH

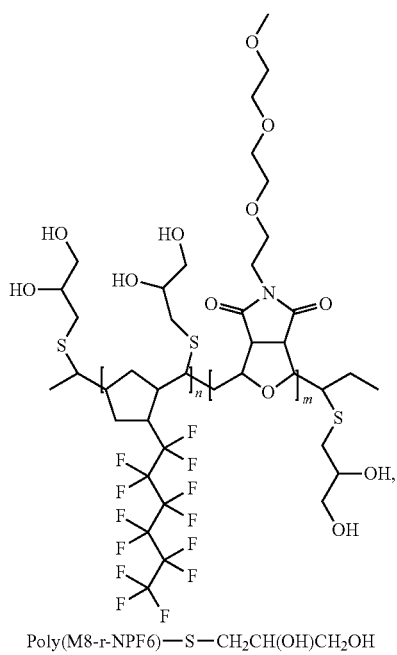

Poly(M8-r-NPF6)—S—CH₂CH(OH)CH₂OH

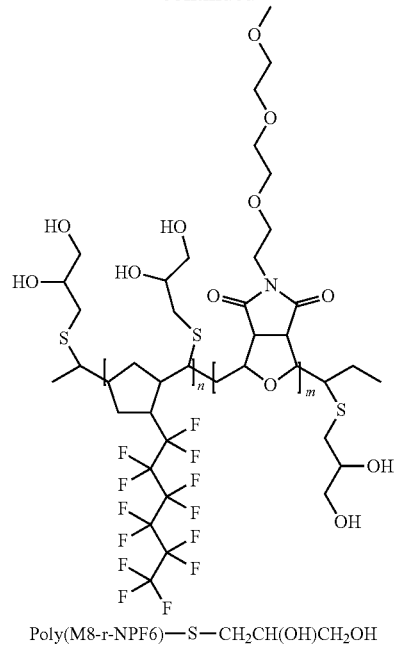

Poly(M8-r-NPF6)—S—CH₂CH(OH)CH₂OH

As a method for manufacturing the filter according to the above embodiment, a known manufacturing method can be used without particular limitation. As the known manufacturing method, for example, the description in paragraphs "0024" to "0055" of JP2016-194038A can be referred to.

The method of measuring the critical wetting surface tension of the obtained membrane is the same as that described above. Therefore, the method will not be described.

Crosslinks can be formed using any suitable method, for example, a photoinitiator and high energy radiation such as UV. It is considered that the crosslinks will result in an extremely stable polymer network structure for the membrane.

In an embodiment, the solution including the copolymer (II) further includes a crosslinker, for example, a polymer represented by Formula C.

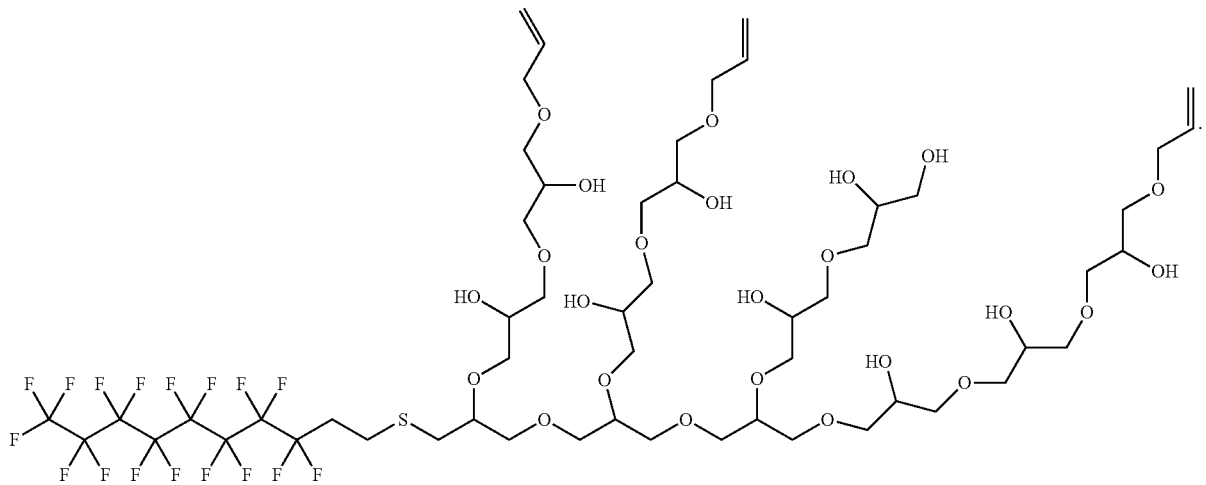

(C)

The polymer C can be prepared by stirring an appropriate amount of mixture of perfluorodecanethiol, glycidol, and allyl glycidyl ether for 20 hours at a temperature of 80° C. to 100° C. The excess of glycidol and allyl glycidyl ether are removed by evaporation, and the product is dried overnight in a vacuum oven at 40° C. For example, in an embodiment, perfluorodecanethiol (30 g) was mixed with glycidol (20 g), allyl glycidyl ether (50 g), and potassium carbonate (1.2 g). The reaction mixture may be stirred at 80° C. for 20 hours, the excess of glycidol and allyl glycidyl ether may be evaporated, and the product may be dried overnight in a vacuum oven at 40° C.

The crosslinking of the coating layer can be performed as follows. A polymer-coated PTFE sheet is optionally preliminarily wet with IPA, and then washed with a solvent in which a photoinitiator is prepared, such that IPA is exchanged with the solvent. Thereafter, the sheet may be immersed in a photoinitiator solution having a certain concentration for a certain period of time and then irradiated with ultraviolet.

According to an embodiment, the hydrophilic PTFE membrane is a porous membrane, for example, a nanoporous membrane with pores having a diameter of 1 nm to 100 nm or a microporous membrane with pores having a diameter of 1 μm to 10 μm.

<Filter BU>

The filter BU is a filter different from the filter A, and is arranged in series with the filter A on the upstream side of the filter A on the flow path. On the flow path, the inlet portion is the upstream side, and the outlet portion is the downstream side. In the present specification, "filter different from the filter A" means a filter different from the filter A in terms of at least one kind of item selected from the group consisting of material, pore size, and pore structure.

Particularly, in view of obtaining a filtering device having further improved effects of the present invention, the filter BU is preferably different from the filter A in terms of at least one item selected from the group consisting of pore size and material, and preferably different from the filter A at least in terms of material.

In the present specification, the case where filter BU is different from the filter A in terms of material typically includes a case where the components (material components) contained in the filters are different from each other; a case where the filters consist of a resin and the types of substituents arranged on the surface of the filters are different from each other due to the difference of the surface treatment; and the like.

The pore size of the filter BU is not particularly limited as long as the filter has an arbitrary pore size used in the filtering device. Particularly, in view of obtaining a chemical liquid having further improved defect inhibition performance, the pore size of the filter BU is preferably larger than the pore size of the filter A. Especially, pore size of the filter BU is preferably equal to or smaller than 200 nm. The pore size of the filter BU is preferably equal to or greater than 10 nm, and more preferably equal to or greater than 20 nm.

According to the examination of the inventors of the present invention, it has been found that in a case where a filtering device is used in which the filter BU having a pore size equal to or greater than 20 nm is disposed on the upstream side of the filter A on the flow path S1, it is more difficult for the filter A to be clogged, and the pot life of the filter A can be further extended. As a result, a filtering device capable of stably providing a chemical liquid having further improved defect inhibition performance can be obtained.

Particularly, in a case where the filtering device has a plurality of filters BU, the pore size of the filter BU disposed on the uppermost stream side in the flow path is preferably equal to or greater than 20 nm, and more preferably equal to or greater than 50 nm. Furthermore, the pore size of the filter BU disposed on the uppermost stream side in the flow path is preferably equal to or smaller than 200 nm. It is preferable that the pore size of the filter BU (which may be a filter C that will be described later) disposed on the uppermost stream side of the flow path is within the above range, because then the pot life of the filter is further extended, and as a result, a chemical liquid having excellent defect inhibition performance can be stably produced.

The pore structure of the filter BU is not particularly limited.

In the present specification, the pore structure of a filter means a pore size distribution, a positional distribution of pores in a filter, a pore shape, and the like. Typically, the pore structure can be controlled by the manufacturing method of the filter.

For example, in a case where powder of a resin or the like is sintered to form a membrane, a porous membrane is obtained. Furthermore, in a case where methods such as electrospinning, electroblowing, and melt blowing are used to form a membrane, a fiber membrane is obtained. These have different pore structures.

"Porous membrane" means a membrane which retains components in a liquid to be purified, such as gel, particles, colloids, cells, and polyoligomers, but allows the components substantially smaller than the pores of the membrane to pass through the membrane. The retention of components in the liquid to be purified by the porous membrane depends on operating conditions, for example, the surface velocity, the use of a surfactant, the pH, and a combination of these in some cases. Furthermore, the retention of components can depend on the pore size and structure of the porous membrane, and the size and structure of particles supposed to be removed (such as whether the particles are hard particles or gel).

An ultra-high-molecular-weight polyethylene (UPE) filter is typically a sieving membrane. A sieving membrane means a membrane that traps particles mainly through a sieving retention mechanism or a membrane that is optimized for trapping particles through a sieving retention mechanism.

Typical examples of the sieving membrane include, but are not limited to, a polytetrafluoroethylene (PTFE) membrane and a UPE membrane.

"Sieving retention mechanism" refers to retention caused in a case where the particles to be removed are larger than the size of micropores of the porous membrane. Sieving retentivity can be improved by forming a filter cake (aggregate of particles to be removed on the surface of the membrane). The filter cake effectively functions as a secondary filter.

The pore structure of the porous membrane (for example, a porous membrane including UPE, PTFE, and the like) is not particularly limited. The pores have, for example, a lace shape, a string shape, a node shape, and the like.

The size distribution of pores in the porous membrane and the positional distribution of pores size in the membrane are not particularly limited. The size distribution may be narrower, and the positional distribution of pore size in the membrane may be symmetric. Furthermore, the size distribution may be wider, and the positional distribution of pore size in the membrane may be asymmetric (this membrane is also called "asymmetric porous membrane"). In the asymmetric porous membrane, the size of the pores changes in the membrane. Typically, the pore size increases toward the other surface of the membrane from one surface of the membrane. In this case, the surface containing pores having a large pore size is called "open side", and the surface containing pores having a small pore size is also called "tight side".

Examples of the asymmetric porous membrane include a membrane in which the pore size is minimized at a position in the thickness direction of the membrane (this is also called "hourglass shape").

In a case where the asymmetric porous membrane is used such that large pores are on the primary side, in other words, in a case where the primary side is used as the open side, a pre-filtration effect can be exerted.

The porous membrane layer may include a thermoplastic polymer such as polyethersulfone (PESU), perfluoroalkoxyalkane (PFA, a copolymer of tetrafluoroethylene and perfluoroalkoxyalkane), polyamide, or a polyolefin, or may include polytetrafluoroethylene and the like.

Particularly, it is preferable that the porous membrane contains ultra-high-molecular-weight polyethylene as a material component. The ultra-high-molecular-weight polyethylene means thermoplastic polyethylene having a very long chain. The molecular weight thereof is equal to or greater than 1,000,000. Typically, the molecular weight thereof is preferably 2,000,000 to 6,000,000.

For example, in a case where the liquid to be purified contains, as impurities, particles containing an organic compound, such particles are negatively charged in many cases. For removing such particles, a filter made of polyamide functions as a non-sieving membrane. Typical non-sieving membranes include, but are not limited to, nylon membranes such as a nylon-6 membrane and a nylon-6,6 membrane.

"Non-sieving" retention mechanism used in the present specification refers to retention resulting from the mechanism such as blocking, diffusion, and adsorption irrelevant to the pressure reduction of the filter or the pore size of the filter.

The non-sieving retention includes a retention mechanism such as blocking, diffusion, and adsorption for removing particles supposed to be removed from the liquid to be purified irrespective of the pressure reduction of the filter or the pore size of the filter. The adsorption of particles onto the filter surface can be mediated, for example, by the intermolecular van der Waals force and electrostatic force. In a case where the particles moving in the non-sieving membrane layer having a serpiginous path cannot sufficiently rapidly change direction so as not to contact the non-sieving membrane, a blocking effect is exerted. The transport of particles by diffusion is mainly caused by the random motion or the Brownian motion of small particles that results in a certain probability that the particles may collide with the filter medium. In a case where there is no repulsive force between the particles and the filter, the non-sieving retention mechanism can be activated.

The material of the fiber membrane is not particularly limited as long as it is a polymer capable of forming the fiber membrane. Examples of the polymer include polyamide and the like. Examples of the polyamide include nylon 6, nylon 6,6, and the like. The polymer forming the fiber membrane may be poly(ethersulfone). In a case where the fiber membrane is on the primary side of the porous membrane, it is preferable that the surface energy of the fiber membrane is higher than the surface energy of the polymer which is the material of the porous membrane on a secondary side. For example, in some cases, nylon as a material of the fiber membrane and polyethylene (UPE) as the porous membrane are combined.

As the method for manufacturing the fiber membrane, known methods can be used without particular limitation. Examples of the method for manufacturing the fiber membrane include electrospinning, electroblowing, melt blowing, and the like.

Furthermore, the filter may be subjected to surface treatment. As the surface treatment method, known methods can be used without particular limitation. Examples of the surface treatment method include a chemical modification treatment, a plasma treatment, a hydrophobization treatment, coating, a gas treatment, sintering, and the like.

The plasma treatment is preferable because the surface of the filter is hydrophilized by this treatment. Although the water contact angle on the surface of each filter hydrophilized by the plasma treatment is not particularly limited, a static contact angle measured at 25° C. by using a contact angle meter is preferably equal to or smaller than 60°, more preferably equal to or smaller than 50°, and even more preferably equal to or smaller than 30°.

As the chemical modification treatment, a method of introducing ion exchange groups into the base material is preferable.

That is, the filter is preferably obtained by using materials containing the components exemplified above as a base material and introducing ion exchange groups into the base material. Typically, it is preferable that the filter includes a layer, which includes a base material having ion exchange groups, on a surface of the base material described above. Although there is no particular limitation, as the surface-treated base material, a base material obtained by introducing ion exchange groups into the aforementioned polymer is preferable because the manufacturing of such a base material is easier.

Examples of the ion exchange groups include cation exchange groups such as a sulfonic acid group, a carboxy group, and a phosphoric acid group and anion exchange groups such as a quaternary ammonium group. The method for introducing ion exchange groups into the polymer is not particularly limited, and examples thereof include a method of reacting a compound, which has ion exchange groups and polymerizable groups, with the polymer such that the compound is grafted on the polymer typically.

The method for introducing the ion exchange groups is not particularly limited. In a case where the aforementioned resin fiber is irradiated with ionizing radiation (such as α-rays, β-rays, γ-rays, X-rays, or electron beams), active portions (radicals) are generated in the resin. The irradiated resin is immersed in a monomer-containing solution such that the monomer is graft-polymerize with the base material. As a result, a product is generated in which the monomer is bonded to polyolefin fiber as a side chain by graft polymerization. By bringing the resin having the generated polymer as a side chain into contact with a compound having an anion exchange group or a cation exchange group so as to cause a reaction, an end product is obtained in which the ion exchange group is introduced into the polymer of the graft-polymerized side chain.

Furthermore, the filter may be constituted with woven cloth or nonwoven cloth, in which ion exchange groups are formed by a radiation graft polymerization method, combined with glass wool, woven cloth, or nonwoven filter material that is conventionally used.

Although the filtering device in FIG. 1 has one filter BU, the filtering device according to the present embodiment may have a plurality of filters BU. In this case, the relationship between the pore sizes of the plurality of filters BU is not particularly limited. However, in view of easily obtaining a chemical liquid having further improved defect inhibition performance, it is preferable that a filter BU disposed in the uppermost stream on the flow path has the largest pore size. In a case where the filter BU having the largest pore size is positioned as described above, the pot life of the filters (including the filter A) disposed in the downstream of the filter BU in the uppermost stream can be further extended, and as a result, a filtering device capable of stably providing a chemical liquid having further improved defect inhibition performance is obtained.

The material of the filter BU is not particularly limited, and the filter BU may optionally contain an inorganic material (such as a metal, glass, or diatomite), an organic material, and the like. The material of the filter BU may be the same as the material of the filter A described above, or may be the same as the material of the filter BD which will be described later.

Particularly, in view of obtaining a filtering device having further improved effects of the present invention, it is preferable that the filter BU consists of a material capable of removing ions. In this case, it is preferable that the filter BU contains, as a material component, a resin having an ion exchange group.

The ion exchange group is not particularly limited. However, in view of obtaining a filtering device having further improved effects of the present invention, the ion exchange group is preferably at least one kind of ion exchange group selected from the group consisting of an acid group, a base group, an amide group, and an imide group.

As the filter BU, a material is more preferable which includes a base material such as polyfluorocarbon or polyolefin and an ion exchange group introduced into the base material.

In a case where the filter BU contains a resin having an ion exchange group as a material component, the pore size of the filter BU is not particularly limited. However, in view of obtaining a chemical liquid resulting in further improved pattern width uniformity, the pore size of the filter BU is preferably equal to or smaller than 200 nm, more preferably equal to or smaller than 100 nm, and even more preferably equal to or smaller than 50 nm. The pore size of the filter BU is preferably equal to or greater than 1 nm, and more preferably equal to or greater than 3 nm.

In a case where one filter BU of the filtering device or at least one of the plurality of filters BU of the filtering device contains a resin having an ion exchange group as a material component, the ion exchange group has stronger interaction with metal impurities (for example, metal ions and the like) contained in the liquid to be purified. As a result, the content of metal ions in the obtained chemical liquid can be reduced, and the obtained chemical liquid results in further improved pattern width uniformity.

Second Embodiment

Figure 2:
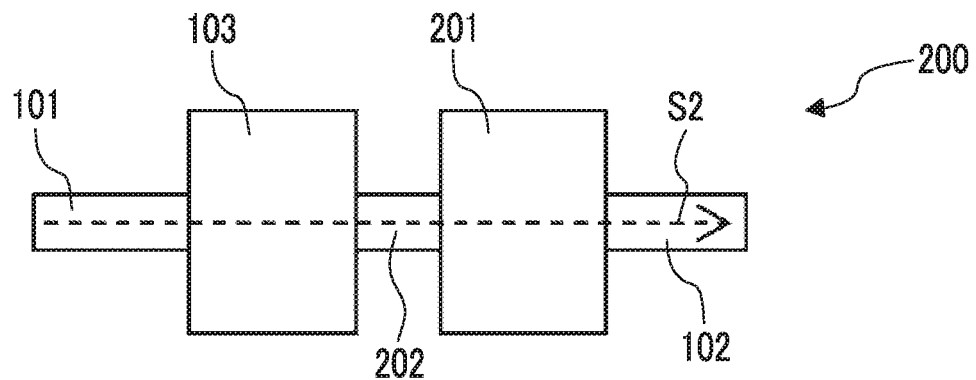
FIG. 2 is a schematic view illustrating a filtering device according to a second embodiment of the present invention.

FIG. 2 is a schematic view illustrating a filtering device according to a second embodiment of the present invention.

A filtering device 100 is a filtering device in which a filter 103 as a filter A and a filter 201 (filter BD) different from the filter 103 are arranged in series through a piping 202 between the inlet portion 101 and the outlet portion 102.

The inlet portion 101, the filter 103, the piping 202, the filter 104, and the outlet portion 102 are constituted such that a liquid to be purified can flow in the interior of each of these members. These members are connected to one another and form a flow path S2 (path through which the liquid to be purified flows).

In the filtering device 200, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

<Filter BD>

The filter BD is a filter different from the filter A, and is arranged in series with the filter A on the downstream side of the filter A on the flow path. Particularly, in view of obtaining a filtering device having further improved effects of the present invention, the filter BD is preferably different from the filter A at least in terms of pore size, and more preferably different from the filter A in terms of pore size and material.

The pore size of the filter BD according to the present embodiment is not particularly limited as long as it is smaller than the pore size of the filter A, and a filter having a pore size generally used for filtering a liquid to be purified can be used. Particularly, the pore size of the filter is preferably equal to or smaller than 200 nm, more preferably equal to or smaller than 20 nm, still more preferably equal to or smaller than 10 nm, particularly preferably equal to or smaller than 5 nm, and most preferably equal to or smaller than 3 nm. The lower limit thereof is not particularly limited, but is generally preferably equal to or greater than 1 nm from the viewpoint of productivity.

In a case where the liquid to be purified is filtered using the filter A, and fine particles are generated due to the filter A, the fine particles are mixed into the liquid to be purified. The filtering device according to the present embodiment has the filter BD at the downstream on the flow path. Therefore, even though fine particles are generated due to the filter A, the fine particles can be separated from the liquid to be purified by filtration, and a chemical liquid having further improved defect inhibition performance can be easily obtained.

Although the filtering device in FIG. 1 has one filter BD, the filtering device according to the present embodiment may have a plurality of filters BD. In this case, the relationship between the pore sizes of the plurality of filters BD is not particularly limited. However, in view of easily obtaining a chemical liquid having further improved defect inhibition performance, it is preferable that a filter BD disposed on the downmost stream side in the flow path has the smallest pore size.

In this case, the pore size of the filter BD disposed on the downmost stream side in the flow path is preferably equal to or smaller than 20 nm, more preferably equal to or smaller than 15 nm, and even more preferably equal to or smaller than 10 nm. The lower limit thereof is not particularly limited, but is preferably equal to or greater than 1 nm in view of the productivity of a chemical liquid.

Particularly, in a case where the pore size of the filter disposed on the downmost stream side is equal to or smaller than 15 nm, the obtained chemical liquid has further improved bridge defect inhibition performance.

The material of the filter BD is not particularly limited, and may be the same as or different from the material of the filter A. Particularly, in view of obtaining a filtering device having further improved effects of the present invention, it is preferable that the material of the filter BD is different from that of the filter A.

The material of the filter BD is not particularly limited, and those known as materials of filters can be used. Specifically, in a case where the material is a resin, it is preferable that the filter BD contains, as a material component, polyamide such as 6-nylon and 6,6-nylon; polyolefin such as polyethylene and polypropylene; polystyrene; polyimide; polyamidoimide; poly(meth)acrylate; polyfluorocarbons such as polytetrafluoroethylene, perfluoroalkoxyalkane, a perfluoroethylene propene copolymer, an ethylene/tetrafluoroethylene copolymer, an ethylene-chlorotrifluoroethylene copolymer, polychlorotrifluoroethylene, polyvinylidene fluoride, and polyvinyl fluoride; polyvinyl alcohol; polyester; cellulose; cellulose acetate, and the like. Particularly, in view of obtaining further improved solvent resistance and obtaining a chemical liquid having further improved defect inhibition performance, it is preferable that the filter BD contains, as a material component, at least one kind of resin selected from the group consisting of nylon (particularly preferably 6,6-nylon), polyolefin (particularly preferably polyethylene), poly(meth)acrylate, and polyfluorocarbon (particularly preferably polytetrafluoroethylene (PTFE) and perfluoroalkoxyalkane (PFA)). One kind of each of these polymers can be used singly, or two or more kinds of these polymers can be used in combination.

In addition to the resin, diatomite, glass, and the like may also be used.

Furthermore, the filter may be subjected to surface treatment. As the surface treatment method, known methods can be used without particular limitation. Examples of the surface treatment method include a chemical modification treatment, a plasma treatment, a hydrophobization treatment, coating, a gas treatment, sintering, and the like.

The plasma treatment is preferable because the surface of the filter is hydrophilized by this treatment. Although the water contact angle on the surface of each filter hydrophilized by the plasma treatment is not particularly limited, a static contact angle measured at 25° C. by using a contact angle meter is preferably equal to or smaller than 60°, more preferably equal to or smaller than 50°, and even more preferably equal to or smaller than 30°.

As the chemical modification treatment, a method of introducing ion exchange groups into the base material is preferable.

That is, the filter is preferably obtained by using materials containing the components exemplified above as a base material and introducing ion exchange groups into the base material. Typically, it is preferable that the filter includes a layer, which includes a base material having ion exchange groups, on a surface of the base material described above. Although there is no particular limitation, as the surface-treated base material, a base material obtained by introducing ion exchange groups into the aforementioned polymer is preferable because the manufacturing of such a base material is easier.

Examples of the ion exchange groups include cation exchange groups such as a sulfonic acid group, a carboxy group, and a phosphoric acid group and anion exchange groups such as a quaternary ammonium group. The method for introducing ion exchange groups into the polymer is not particularly limited, and examples thereof include a method of reacting a compound, which has ion exchange groups and polymerizable groups, with the polymer such that the compound is grafted on the polymer typically.

The method for introducing the ion exchange groups is not particularly limited. In a case where the aforementioned resin fiber is irradiated with ionizing radiation (such as α-rays, β-rays, γ-rays, X-rays, or electron beams), active portions (radicals) are generated in the resin. The irradiated resin is immersed in a monomer-containing solution such that the monomer is graft-polymerize with the base material. As a result, a product is generated in which the monomer is bonded to polyolefin fiber as a side chain by graft polymerization. By bringing the resin having the generated polymer as a side chain into contact with a compound having an anion exchange group or a cation exchange group so as to cause a reaction, an end product is obtained in which the ion exchange group is introduced into the polymer of the graft-polymerized side chain.

Furthermore, the filter may be constituted with woven cloth or nonwoven cloth, in which ion exchange groups are formed by a radiation graft polymerization method, combined with glass wool, woven cloth, or nonwoven filter material that is conventionally used.

Particularly, in view of obtaining a filtering device having further improved effects of the present invention, the filter BD preferably contains, as a material component, at least one kind of resin selected from the group consisting of polyolefin, polyamide, polyfluorocarbon, polystyrene, polysulfone, and polyethersulfone, and more preferably consists of at least one kind of resin selected from the group consisting of polyolefin, polyamide, and polyfluorocarbon.

Examples of the polyolefin include polyethylene, polypropylene, and the like. Among these, ultra-high-molecular-weight polyethylene is preferable. Examples of the polyamide include 6-nylon, 6,6-nylon, and the like. Examples of the polyfluorocarbon include polytetrafluoroethylene, perfluoroalkoxyalkane, a perfluoroethylene propene copolymer, an ethylene/tetrafluoroethylene copolymer, an ethylene-chlorotrifluoroethylene copolymer, polychlorotrifluoroethylene, polyvinylidene fluoride, polyvinyl fluoride, and the like. Among these, at least one kind of compound selected from the group consisting of polyethylene and nylon is preferable, and in another embodiment, polytetrafluoroethylene is preferable.

Furthermore, it is also preferable that the filter BD contains a second resin having a hydrophilic group as a material component. The hydrophilic group is not particularly limited, and examples thereof include a hydroxyl group, an ether group, an oxyalkylene group, a polyoxyalkylene group, a carboxylic acid group, an ester group, a carbonic acid ester group, a thiol group, a thioether group, a phosphoric acid group, and a phosphoric acid ester group, an amide group, an imide group, a group obtained by combining these, and the like. Among these, a hydrophilic group different from the hydrophilic group of the filter A is preferable, and at least one kind of hydrophilic group is preferable which is selected from the group consisting of a hydroxyl group, a carboxylic acid group, an ester group, a carbonic acid ester group, a thiol group, a thioether group, a phosphoric acid group, a phosphoric acid ester group, an amide group, and an imide group.

The second resin is not particularly limited, but is preferably at least one kind of resin selected from the group consisting of polyolefin, polyamide, polyfluorocarbon, polystyrene, polysulfone, and polyethersulfone. Furthermore, as another embodiment, polyether, novolak, a cycloolefin polymer, polylactic acid, and the like are also preferable.

The pore structure of the filter BD is not particularly limited, and may be appropriately selected according to the components of the liquid to be purified.

Particularly, in view of obtaining a chemical liquid having further improved effects of the present invention, the filter BD disposed on the downmost stream side in the flow path preferably contains, as a material component, polyfluorocarbon, more preferably contains polytetrafluoroethylene, and even more preferably consists of polytetrafluoroethylene.

In a case where the filtering device has a plurality of filters BD, each of the filters BD is expected to have a different role, that is, to remove different impurities from the liquid to be purified. For example, in a case where the filter BD is a filter made of nylon, the filter can more efficiently remove gel-like impurities. In a case where the filter BD is ultra-high-molecular-weight polyethylene, the filter can more efficiently remove particle-like impurities.

However, according to the examination of the inventors of the present invention, it has been found that although a filter such as nylon and ultra-high-molecular-weight polyethylene removes impurities from the liquid to be purified, sometimes this filter allows a trace of impurities to be eluted into the liquid to be purified in a case where the liquid to be purified passes through the filter.

In this case, by disposing a filter containing PTFE as a material component (for example, a filter made of PTFE) on the downmost stream side in the flow path, the trace of impurities mixed into the liquid to be purified due to the filter on the upstream side can be removed, and further improved defect inhibition performance can be obtained.

Modification Example of Filtering Device According to Second Embodiment

Figure 3:
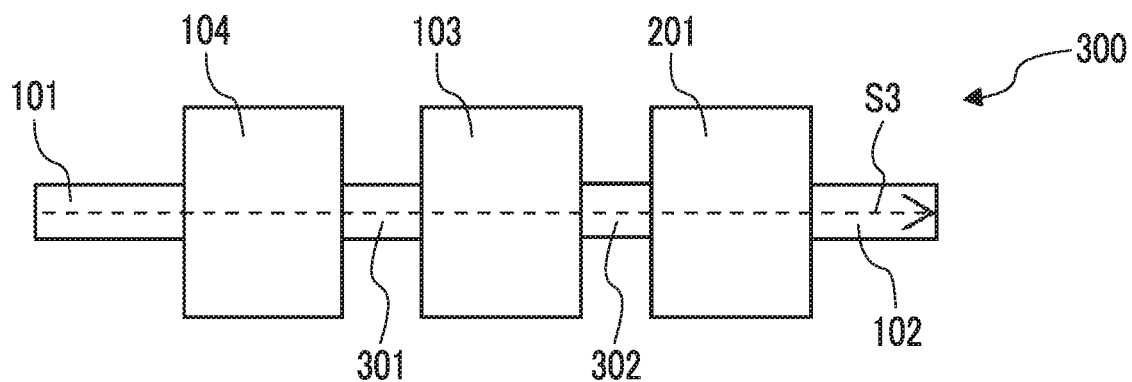
FIG. 3 is a schematic view illustrating a modification example of the filtering device according to the second embodiment of the present invention.

FIG. 3 is a schematic view of a filtering device illustrating a modification example of a filtering device according to a second embodiment of the present invention. A filtering device 300 includes a filter 103 as a filter A, a filter 104 as a filter BU, and a filter 201 as a filter BD between an inlet portion 101 and an outlet portion 102 in which the filter 104, the filter 103, and the filter 201 are arranged in series through a piping 301 and a piping 302.

In the filtering device 300, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The inlet portion 101, the filter 104, the piping 301, the filter 103, the piping 302, and the filter 201 are constituted such that a liquid to be purified can flow in the interior of each of these members. These members are connected to one another and form a flow path S3 (path through which the liquid to be purified flows). The constitutions of the piping and each filter are as described above.

The filtering device 300 has the filter BU on the upstream side of the filter A on the flow path. Therefore, the pot life of the filter A is further extended. Furthermore, the filtering device 300 has the filter BD on the downstream side of the filter A on the flow path. Therefore, the fine particles mixed into the liquid to be purified due to the filter A can be efficiently removed, and as a result, a chemical liquid having further improved defect inhibition performance can be easily obtained.

Third Embodiment

Figure 4:
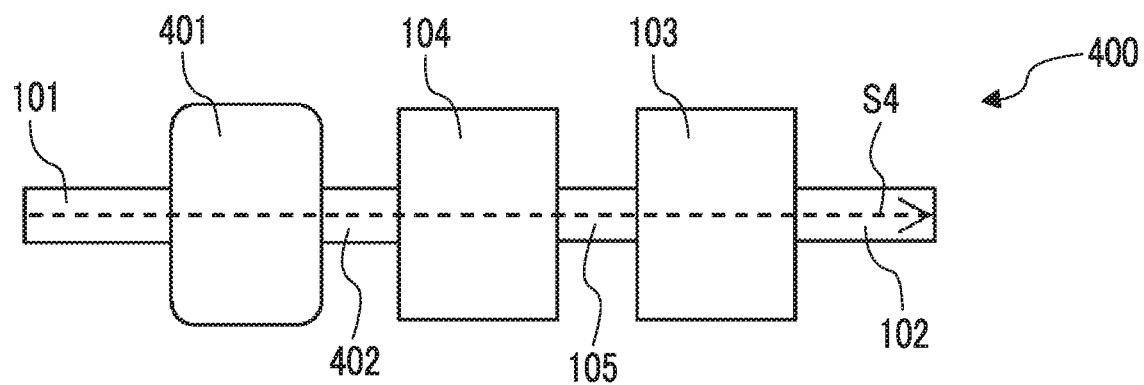
FIG. 4 is a schematic view illustrating a filtering device according to a third embodiment of the present invention.

FIG. 4 is a schematic view illustrating a filtering device according to a third embodiment of the present invention.

A filtering device 400 further includes a tank 401 disposed in series with a filter A on the upstream side of the filter 104 (filter BU) on a flow path S4 between the inlet portion 101 and the outlet portion 102. The tank 401, the filter 104 (filter BU), and the filter 103 (filter A) are arranged in series through a piping 402 and the piping 105. The tank 401 constitutes the flow path S4 together with the filters, pipings, and the like described above.

In the filtering device 400, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The filtering device according to the present embodiment has a tank on the upstream side of the filter 104. Therefore, the liquid to be purified that will flow through the filter 104 can be retained in the tank and can be homogenized. As a result, a chemical liquid having further improved defect inhibition performance is obtained. Particularly, in a case where circulation filtration, which will be described later, is performed, and the liquid to be purified is returned to the upstream of a first reference filter, which is selected from the group consisting of the filter 104 (filter BU) and the filter 103 (filter A), in the flow path S4 from at least the downstream of the first reference filter in the flow path S4, the tank 401 can be used to receive the returned liquid to be purified. In a case where the tank 401 is used as described above, the returned liquid to be purified can be retained in the tank, homogenized, and passed again through the subsequent filters. Therefore, a chemical liquid having further improved defect inhibition performance is obtained.

The material of the tank 401 is not particularly limited, and the same material as the material of the housing described above can be used. It is preferable that at least a portion of the liquid contact portion of the tank 401 (preferably 90% or more of the surface area of the liquid contact portion, and more preferably 99% or more of the surface area of the liquid contact portion) consists of the anticorrosive material which will be described later.

Modification Example of Filtering Device According to Third Embodiment

Figure 5:
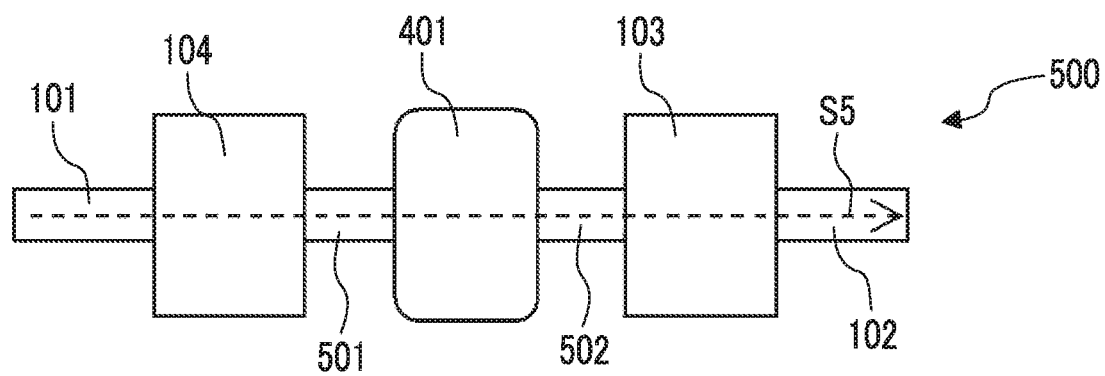
FIG. 5 is a schematic view illustrating a modification example of the filtering device according to the third embodiment of the present invention.

FIG. 5 is a schematic view illustrating a modification example of the filtering device according to the third embodiment of the present invention.

A filtering device 500 further includes the tank 401 disposed in series on the downstream side of the filter 104 (filter BU) on a flow path S5 between the inlet portion 101 and the outlet portion 102. The filter 104 (filter BU), the tank 401, and the filter 103 (filter A) are arranged in series through a piping 501 and a piping 502. The tank 401 constitutes a flow path S5 together with the filters, pipings, and the like described above.

In the filtering device 500, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The filtering device according to the present embodiment has a tank on the downstream side of the filter BU. Therefore, the liquid to be purified filtered through the filter BU can be retained in the tank. Particularly, in a case where circulation filtration, which will be described later, is performed, and the liquid to be purified is returned to the upstream side of the filter 103 in the flow path S5 from the downstream side of the filter 103 (reference filter) in the flow path S5, the tank 401 can be used to retain the returned liquid to be purified. In a case where the tank 401 is used as described above, the returned liquid to be purified can be retained in the tank, homogenized, and passed again through the filter 103. Therefore, a chemical liquid having further improved defect inhibition performance is obtained.

In the filtering device 500 according to the present embodiment, the tank 401 is disposed on the upstream side of the filter 103 (filter A) on the flow path S5. However, in the filtering device according to the present embodiment, the tank 401 may be disposed on the downstream side of the filter 103 on the flow path S5.

As described above, the tank 401 can be used to retain the returned liquid to be purified during circulation filtration. In other words, the tank 401 can be a starting point of the circulation filtration. In this case, either a filter on the downstream side of the tank 401 (filter 103 in the filtering device 500) or a filter on the upstream side of the tank 401 (filter 104 in the filtering device 500) on the flow path S5 is frequently used as a filter for circulation filtration. The starting point of the circulation filtration includes a starting point in a case where the tank constitutes a return flow path or a starting point in a case where a piping on the upstream or downstream side of the tank constitutes a return flow path.

In the filtering device 500, the tank 401 is disposed on the upstream side of the filter 103 (filter A). In a case where the tank 401 is disposed on the upstream side of the filter 103 (filter A), and filtration is repeated using a filter disposed on the downstream side of the tank 401 in the flow path S5 during circulation filtration, it is possible to adopt a flow in which particle-like impurities are finally removed using the filter 103 (filter A) from the liquid to be purified filtered through the filter BU (for example, a filter having ion exchange groups).

The filtering device according to the present embodiment may be in the form of a filtering device in which the filter A and the filter BD are arranged in series in this order (for example, the second embodiment), and in the form of a filtering device in which the filter BU, the filter A, and the filter BD are arranged in series in this order (for example, a modification example of the second embodiment), and the tank 401 is further provided on the upstream or downstream side of the filter A.

Fourth Embodiment

Figure 6:
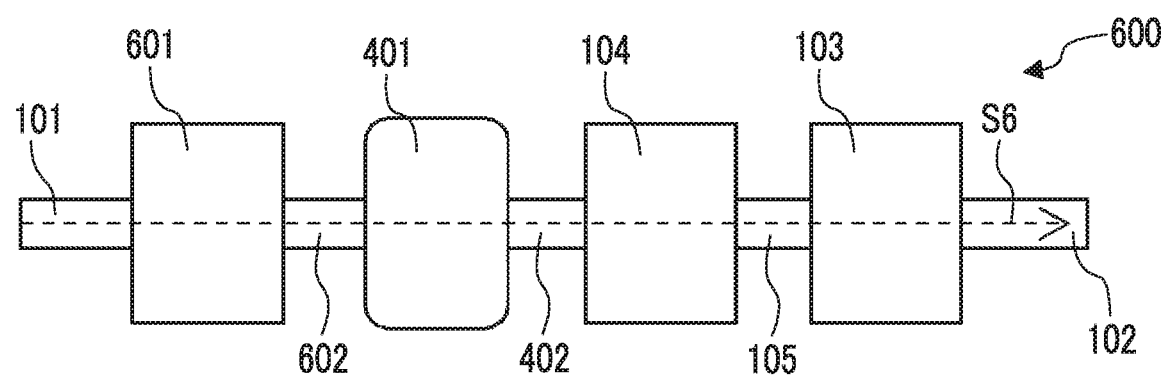
FIG. 6 is a schematic view illustrating a filtering device according to a fourth embodiment of the present invention.

FIG. 6 is a schematic view illustrating a filtering device according to a fourth embodiment of the present invention.

A filtering device 600 includes a filter 601 as a filter C, a tank 401, a filter 104 as a filter BU, and a filter 103 as a filter A that are arranged in series through a piping 602, a piping 402, and a piping 105 between an inlet portion 101 and an outlet portion 102.

In the filtering device 600, the inlet portion 101, the filter 601, the piping 602, the tank 401, the piping 402, the filter 104, the piping 105, the filter 103, and the outlet portion 102 form a flow path S6.

In the filtering device 600, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The filter 601 (filter C) is a filter which is disposed on the upstream side of the tank 401 in the flow path S6 and has a pore size equal to or greater than 20 nm. In the filtering device according to the present embodiment, a filter having a predetermined pore size is disposed on the upstream side of the tank 401 in the flow path S6. Therefore, impurities and the like contained in the liquid to be purified flowing into the filtering device from the inlet portion 101 can be removed in advance by using the filter 601. Accordingly, it is possible to further reduce the amount of impurities mixed into the flow path after the piping 602. As a result, it is possible to further extend the pot life of the subsequent filter BU and filter A (or the filter BD in a case where the filter BD is disposed in the flow path). Consequently, with the filtering device described above, it is possible to stably manufacture a chemical liquid having further improved defect inhibition performance.

The form of the filter C is not particularly limited, and the filter C may be the same filter as the filter A described above or a different filter (filter B). Particularly, in view of easily obtaining a chemical liquid having further improved defect inhibition performance, the filter C is preferably the filter B. Especially, as the material and pore structure of the filter C, those described as the material and pore structure of the filter BD are preferable. The pore size of the filter C may be equal to or greater than 20 nm, and is preferably equal to or greater than 50 nm. The upper limit thereof is not particularly limited, but is preferably equal to or smaller than 250 nm in general.

The filtering device according to the present embodiment may be in the form of a filtering device in which the filter A and the filter BD are arranged in series in this order on the flow path (for example, the second embodiment), and in the form of a filtering device in which the filter BU, the filter A, and the filter BD are arranged in series in this order on the flow path (for example, a modification example of the second embodiment), a tank is further provided on the downstream side of the filter A, and the filter C is provided on the upstream side of the tank.

Fifth Embodiment

Figure 7:
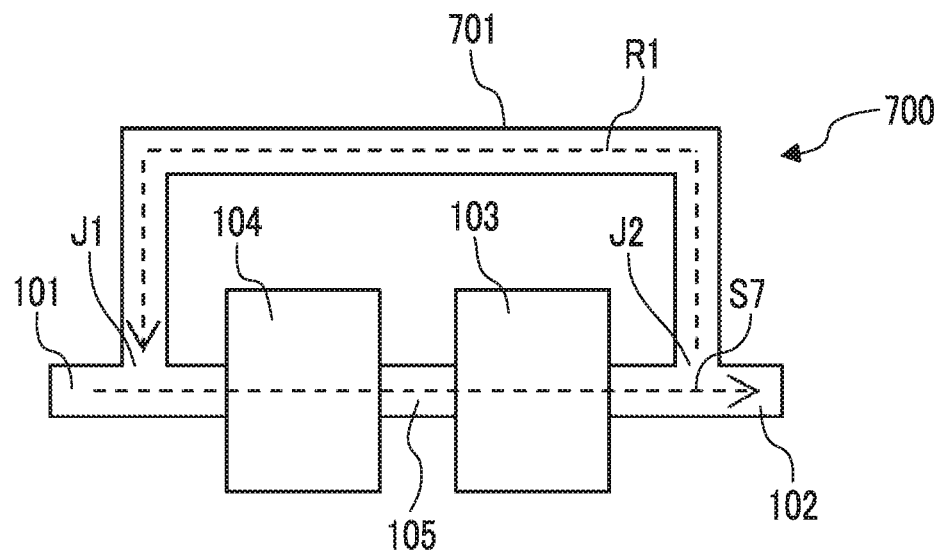
FIG. 7 is a schematic view illustrating a filtering device according to a fifth embodiment of the present invention.

FIG. 7 is a schematic view of a filtering device according to a fifth embodiment of the present invention. A filtering device 700 includes an inlet portion 101, an outlet portion 102, a filter 104 as a filter BU, and a filter 103 as a filter A, in which the filter 104 and the filter 103 are arranged in series between the inlet portion 101 and the outlet portion 102, and a flow path S7 extending from the inlet portion 101 to the outlet portion 102 is formed.

In the filtering device 700, the inlet portion 101, the filter 104, a piping 105, the filter 103, and the outlet portion 102 form the flow path S7.

In the filtering device 700, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 700, a return flow path R1 is formed which is capable of returning the liquid to be purified can be to the upstream side of the filter 104 in the flow path S7 from the downstream side of the filter 104 (and the filter 103) in the flow path S7. Specifically, the filtering device 700 has a piping 701 for return, and the piping 701 forms the return flow path R1. One end of the piping 701 is connected to the flow path S7 on the downstream side of the filter 103 (and the filter 104) and the other end thereof is connected to the flow path S7 on the upstream side of the filter 104. On the return flow path R1, a pump, a damper, a valve, and the like not shown in the drawing may be arranged. Particularly, it is preferable to dispose a valve in connection portions J1 and J2 shown in FIG. 7 so as to control the liquid to be purified such that the liquid does not unintentionally flow through the return flow path.

The liquid to be purified that has flowed through the return flow path R1 and has been returned to the upstream side of the filter 104 (in the flow path S7) is filtered through the filter 104 and the filter 103 in the process of flowing again through the flow path S7. This process is called circulation filtration. The filtering device 700 can perform the circulation filtration, and as a result, a chemical liquid having further improved defect inhibition performance is easily obtained.

In FIG. 7, the piping 701 is disposed on the flow path S7 such that the liquid to be purified can be returned to the upstream side of the filter 104 (filter BU) from the downstream side of the filter 103 (filter A). That is, the filtering device has a return flow path in which the filter 104 is adopted as a first reference filter and through which the liquid to be purified can be returned to the upstream side of the first reference filter from the downstream side of the first reference filter. The filtering device according to the present embodiment is not limited to the above, and may have a return flow path in which the filter 103 (filter A) is adopted as a first reference filter and through which the liquid to be purified can be returned to a position that is on the downstream side of the filter 104 and on the upstream side of the filter 103 from the downstream side of the filter 103.

In FIG. 7, the return flow path R1 is formed only of piping. However, the return flow path R1 may be formed of one or plural tanks and pipings described above.

Figure 8:
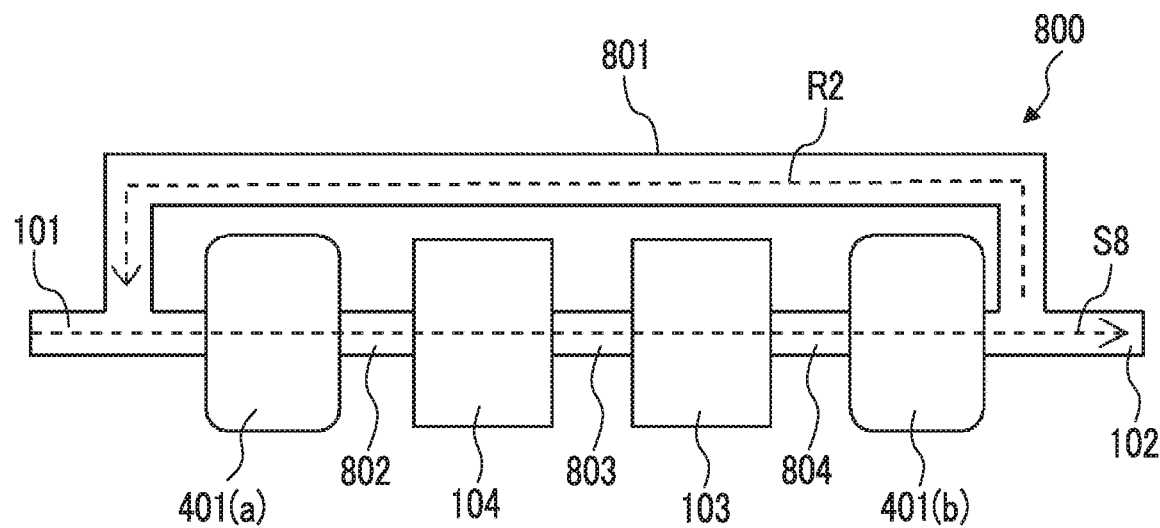
FIG. 8 is a schematic view illustrating a modification example of the filtering device according to the fifth embodiment of the present invention.

FIG. 8 is a schematic view illustrating a modification example of the filtering device according to the fifth embodiment of the present invention.

The filtering device 800 has an inlet portion 101, tanks 401(a) and 401 (b), an outlet portion 102, a filter 103 as a filter A, and a filter 104 as a filter BD. The tank 401(a), filter 104, the filter 103, and the tank 401(b) are arranged in series between the inlet portion 101 and the outlet portion 102, and the inlet portion 101, the tank 401(a), a piping 802, the filter 104, a piping 803, the filter 103, a piping 804, the tank 401(b), and the outlet portion 102 form a flow path S8.

In the filtering device 800, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 800, a return flow path R2 is formed which is capable of returning the liquid to be purified to the upstream side of the tank 401(a) disposed on the upstream side of the filter 103 on the flow path S8 from the downstream side of the tank 401(b) disposed on the downstream side of the filter 103 on the flow path S8. One end of a piping 801 is connected to the flow path S8 on the downstream side of the tank 401(b), and the other end thereof is connected to the flow path S8 on the upstream side of the tank 401(a). On the return flow path R2, a pump, a damper, a valve, and the like not shown in the drawing may be arranged.

In the filtering device according to the present embodiment, the starting point of the return flow path R2 is disposed on the downstream side of the tank 401(b) on the flow path, and the end point of the return flow path R2 is disposed on the upstream side of the tank 401(a) on the flow path. In a case where the return flow path is constituted as described above, during circulation filtration, the liquid to be purified can be returned after being retained or can flow again after being retained. As a result, a chemical liquid having further improved defect inhibition performance can be obtained. The filtering device according to the present embodiment may be in the form of a filtering device in which the tank 401(b) and the piping 801 are directly connected to each other, in the form of a filtering device in which the tank 401(a) and the piping 801 are directly connected to each other, or in the form of a filtering device as a combination of these.

Sixth Embodiment

Figure 9:
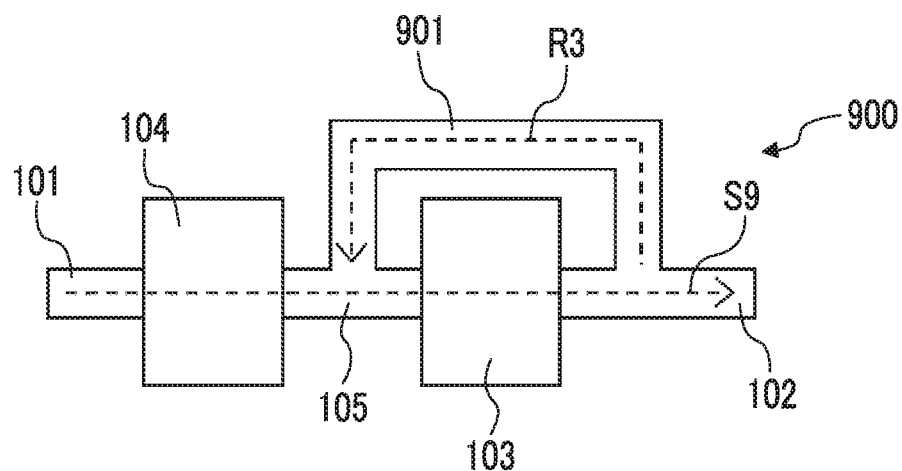
FIG. 9 is a schematic view illustrating a filtering device according to a sixth embodiment of the present invention.

FIG. 9 is a schematic view of a filtering device according to a sixth embodiment of the present invention. A filtering device 900 includes an inlet portion 101, an outlet portion 102, a filter 104 as a filter BU, and a filter 103 as a filter A, in which the filter 104 and the filter 103 are arranged in series between the inlet portion 101 and the outlet portion 102, and a flow path S9 extending from the inlet portion 101 to the outlet portion 102 is formed.

In the filtering device 900, the inlet portion 101, the filter 103, a piping 105, the filter 104, and the outlet portion 102 form the flow path S9.

In the filtering device 900, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 900, a return flow path R3 is formed which is capable of returning the liquid to be purified to a position that is on the downstream side of the filter 104 and on the upstream side of the filter 103 on the flow path S9 from the downstream side of the filter 103 on the flow path S9. Specifically, the filtering device 900 has a piping 901 for return, and the piping 901 forms the return flow path R3. One end of the piping 901 is connected to the flow path S9 on the downstream side of the filter 103, and the other end thereof is connected to the flow path S9 at a position which is on the upstream side of the filter 103 and on the downstream side of the filter 104. On the return flow path R3, a pump, a damper, a valve, and the like not shown in the drawing may be arranged.

The liquid to be purified that has flowed through the return flow path R3 and has been returned to a position, which is on the downstream side of the filter 104 and on the upstream side of the filter 103, is filtered through the filter 103 in the process of flowing again through the flow path S9. Particularly, in a case where the filter 104 is a filter containing a resin having ion exchange groups as a material component, it is possible to remove particle-like impurities from the liquid to be purified filtered through the filter 104 by using the filter 103 by means of circulation filtration. As a result, a chemical liquid having further improved defect inhibition performance can be easily obtained.

In FIG. 9, the piping 901 is disposed such that the liquid to be purified can be returned to a position, which is on the downstream side of the filter BU and on the upstream side of the filter A on the flow path S9, from the downstream side of the filter 103 (filter A: first reference filter) on the flow path S9. However, in the filtering device according to the present embodiment, in a case where the filter A and the filter BD are arranged in series in this order on the flow path, the flow path may be formed such that the liquid to be purified can be returned to a position, which is on the upstream side of the filter BD or on the upstream side of the filter A on the flow path, from the downstream side of the filter BD (second reference filter).

Figure 10:
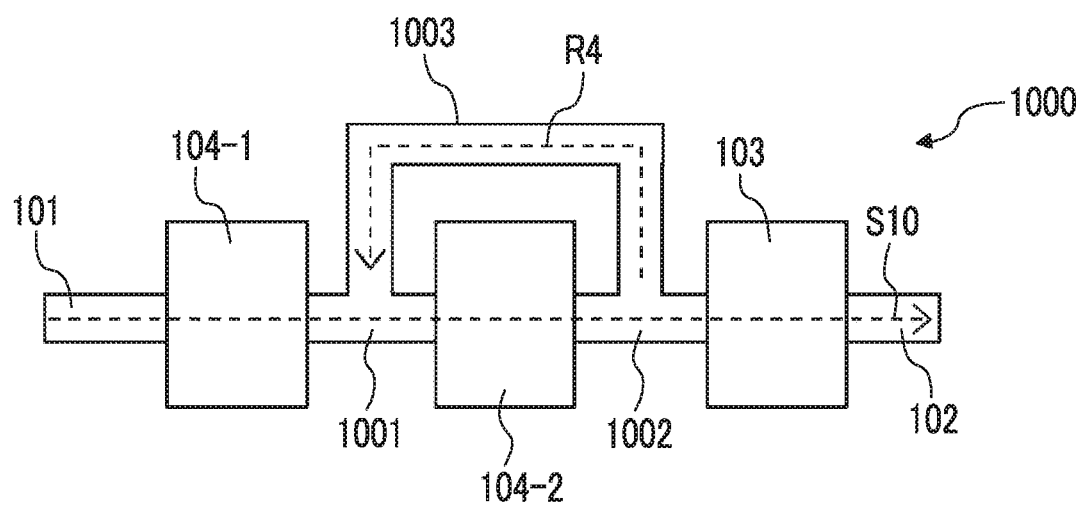
FIG. 10 is a schematic view illustrating a modification example of the filtering device according to the sixth embodiment of the present invention.

FIG. 10 is a schematic view illustrating a modification example of the filtering device according to the present embodiment. A filtering device 1000 includes an inlet portion 101, an outlet portion 102, a filter 104-1 as a filter BU, a filter 104-2 (first reference filter) as a filter BD, and a filter 103, in which the filter 104-1, the filter 104-2, and the filter 103 are arranged in series between the inlet portion 101 and the outlet portion 102, and a flow path S10 extending from the inlet portion 101 to the outlet portion 102 is formed.

In the filtering device 1000, the inlet portion 101, the filter 104-1, a piping 1001, the filter 104-2, a piping 1002, the filter 103, and the outlet portion 102 form the flow path S10.

In the filtering device 1000, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 1000, a return flow path R4 is formed which is capable of returning the liquid to be purified to a position, which is the downstream of the filter 104-1 and the upstream of the filter 104-2 (first reference filter), from the downstream of the filter 104-2 (first reference filter) on the flow path S10. Specifically, the filtering device 1000 has a piping 1003 for return, and the piping 1003 forms a return flow path R4. One end of the piping 1003 is connected to the flow path S10 at a position which is on the downstream side of the filter 104-2 and on the upstream side of the filter 103, and the other end thereof is connected to the flow path S10 at a position which is on the downstream side of the filter 104-1 and on the upstream side of the filter 104-2. On the return flow path R4, a pump, a damper, a valve, and the like not shown in the drawing may be arranged.

The liquid to be purified that has been returned to a position, which is on the downstream side of the filter 104-1 and on the upstream side of the filter 104-2 on the flow path S10, through the return flow path R4 is filtered through the filter 104-2 in the process of flowing again through the flow path S10. The filtering device 1000 can perform circulation filtration. As a result, a chemical liquid having further improved defect inhibition performance can be easily obtained.

In the filtering device shown in FIG. 10, the return flow path R4 is formed which is capable of returning the liquid to be purified to the upstream side of the filter 104-2 from the downstream side of the filter 104-2 on the flow path S10, that is, from the upstream side of the filter 103. However, the filtering device according to the present embodiment is not limited thereto, and may be a filtering device in which a return flow path capable of returning the liquid to be purified to the upstream side of the filter 104-1 from the downstream side of the filter 104-2 is formed, or the like.

Furthermore, a filtering device, in which the filter A, the filter BD (referred to as filter BD-1), and the filter BD (referred to as filter BD-2) are arranged in series in this order, may have a return flow path capable of returning the liquid to be purified to the upstream side of the filter BD-1 (the upstream side may be a position which is on the upstream side of the filter BD-2 and on either the downstream side or the upstream side of the filter A) from the downstream side of the filter BD-1 (second reference filter) (the downstream side may be a position which is on the upstream side of the filter BD-2 and on either the downstream side or the upstream side of the filter BD-2).

Method for Manufacturing Chemical Liquid (First Embodiment)

The method for manufacturing a chemical liquid according to an embodiment of the present invention is a chemical liquid manufacturing method for obtaining a chemical liquid by purifying a liquid to be purified. The method has a filtration step of filtering a liquid to be purified by using the filtering device described above so as to obtain a chemical liquid.

[Liquid to be Purified]

The liquid to be purified to which the method for manufacturing a chemical liquid according to the embodiment of the present invention can be applied is not particularly limited. However, it is preferable that the liquid to be purified contains a solvent. Examples of the solvent include an organic solvent, and water, and the like. It is preferable that the liquid to be purified contains an organic solvent. In the following description, the liquid to be purified will be divided into an organic solvent-based liquid to be purified in which the content of an organic solvent (total content in a case where the liquid to be purified contains a plurality of organic solvents) with respect to the total mass of solvents contained in the liquid to be purified is greater than 50% by mass, and an aqueous liquid to be purified in which the content of water with respect to the total mass of solvents contained in the liquid to be purified is greater than 50% by mass.

<Organic Solvent-Based Liquid to be Purified>

(Organic Solvent)

The organic solvent-based liquid to be purified contains a solvent, in which the content of the organic solvent is greater than 50% by mass with respect to the total mass of solvents contained in the liquid to be purified.

The organic solvent-based liquid to be purified contains an organic solvent. The content of the organic solvent in the organic solvent-based liquid to be purified is not particularly limited, but is preferably equal to or greater than 99.0% by mass with respect to the total mass of the organic solvent-based liquid to be purified in general. The upper limit thereof is not particularly limited, but is preferably equal to or smaller than 99.99999% by mass in general.

One kind of organic solvent may be used singly, or two or more kinds of organic solvents may be used in combination. In a case where two or more kinds of organic solvents are used in combination, the total content thereof is preferably within the above range.

In the present specification, an organic solvent means one liquid organic compound which is contained in the liquid to be purified in an amount greater than 10,000 ppm by mass with respect to the total mass of the liquid to be purified. That is, in the present specification, a liquid organic compound contained in the liquid to be purified in an amount greater than 10,000 ppm by mass with respect to the total mass of the liquid to be purified corresponds to an organic solvent.

In the present specification, "liquid" means that the compound stays in liquid form at 25° C. under atmospheric pressure.

The type of the organic solvent is not particularly limited, and known organic solvents can be used. Examples of the organic solvent include alkylene glycol monoalkyl ether carboxylate, alkylene glycol monoalkyl ether, a lactic acid alkyl ester, alkyl alkoxypropionate, cyclic lactone (preferably having 4 to 10 carbon atoms), a monoketone compound which may have a ring (preferably having 4 to 10 carbon atoms), alkylene carbonate, alkoxyalkyl acetate, alkyl pyruvate, and the like.

Furthermore, as the organic solvent, for example, those described in JP2016-057614A, JP2014-219664A, JP2016-138219A, and JP2015-135379A may also be used.

As the organic solvent, at least one kind of compound is preferable which is selected from the group consisting of propylene glycol monomethyl ether (PGMM), propylene glycol monoethyl ether (PGME), propylene glycol monopropyl ether (PGMP), propylene glycol monomethyl ether acetate (PGMEA), ethyl lactate (EL), methyl methoxypropionate (MPM), cyclopentanone (CyPn), cyclohexanone (CyHe), γ-butyrolactone (γBL), diisoamyl ether (DIAE), butyl acetate (nBA), isoamyl acetate (iAA), isopropanol (IPA), 4-methyl-2-pentanol (MIBC), dimethylsulfoxide (DMSO), n-methyl-2-pyrrolidone (NMP), diethylene glycol (DEG), ethylene glycol (EG), dipropylene glycol (DPG), propylene glycol (PG), ethylene carbonate (EC), propylene carbonate (PC), sulfolane, cycloheptanone, and 2-heptanone (MAK).

The type and content of the organic solvent in the liquid to be purified can be measured using a gas chromatography mass spectrometer.

(Other Components)

The liquid to be purified may contain other components in addition to the above components. Examples of those other components include an inorganic substance (such as metal ions, metal particles, and metal oxide particles), a resin, an organic substance other than a resin, water, and the like.

Inorganic Substance

The liquid to be purified may contain an inorganic substance. The inorganic substance is not particularly limited, and examples thereof include metal ions, metal-containing particles, and the like.

The form of the metal-containing particles is not particularly limited as long as the particles contain metal atoms. For example, the metal-containing particles are in the form of simple metal atoms, compounds containing metal atoms (hereinafter, also referred to as "metal compound"), a complex of these, and the like. Furthermore, the metal-containing particles may contain a plurality of metal atoms.

The complex is not particularly limited, and examples thereof include a so-called core-shell type particle having a simple metal atom and a metal compound covering at least a portion of the simple metal atom, a solid solution particle including a metal atom and another atom, a eutectic particle including a metal atom and another atom, an aggregate particle of a simple metal atom and a metal compound, an aggregate particle of different kinds of metal compounds, a metal compound in which the composition thereof continuously or intermittently changes toward the center of the particle from the surface of the particle, and the like.

The atom other than the metal atom contained in the metal compound is not particularly limited, and examples thereof include a carbon atom, an oxygen atom, a nitrogen atom, a hydrogen atom, a sulfur atom, a phosphorus atom, and the like.

The metal atom is not particularly limited, and examples thereof include a Fe atom, an Al atom, a Cr atom, a Ni atom, a Pb atom, a Zn atom, a Ti atom, and the like. The metal-containing particles may contain one kind of each of the aforementioned metal atoms singly or may contain two or more kinds of the aforementioned metal atoms in combination.

The particle size of the metal-containing particles is not particularly limited, but is generally 1 to 100 nm in many cases.

The inorganic substance may be added to the liquid to be purified, or may be unintentionally mixed into the liquid to be purified in the manufacturing process. Examples of the case where the inorganic substance is unintentionally mixed into the liquid to be purified in the manufacturing process of the chemical liquid include, but are not limited to, a case where the inorganic substance is contained in a raw material (for example, an organic solvent) used for manufacturing the chemical liquid, a case where the inorganic substance is mixed into the liquid to be purified in the manufacturing process of the chemical liquid (for example, contamination), and the like.

(Resin)

The liquid to be purified may contain a resin.

The chemical liquid may further contain a resin. As the resin, a resin P having a group which is decomposed by the action of an acid and generates a polar group is more preferable. As such a resin, a resin having a repeating unit represented by Formula (AI) that will be described later is more preferable, which is a resin whose solubility in a developer containing an organic solvent as a main component is reduced by the action of an acid. The resin having a repeating unit represented by Formula (AI), which will be described later, has a group that is decomposed by the action of an acid and generates an alkali-soluble group (hereinafter, also referred to as an "acid-decomposable group").

Examples of the polar group include an alkali-soluble group. Examples of the alkali-soluble group include a carboxy group, a fluorinated alcohol group (preferably a hexafluoroisopropanol group), a phenolic hydroxyl group, and a sulfo group.

In the acid-decomposable group, the polar group is protected by a group leaving by an acid (acid leaving group). Examples of the acid leaving group include —C($R_{36}$)($R_{37}$) ($R_{38}$), —C($R_{36}$)($R_{37}$)(O$R_{39}$), —C($R_{01}$)($R_{02}$)(O$R_{39}$), and the like.

In the formulas, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

Hereinafter, the resin P whose solubility in a developer containing an organic solvent as a main component is reduced by the action of an acid will be specifically described.

(Formula (AI): Repeating Unit Having Acid-Decomposable Group)

It is preferable that the resin P has a repeating unit represented by Formula (AI).

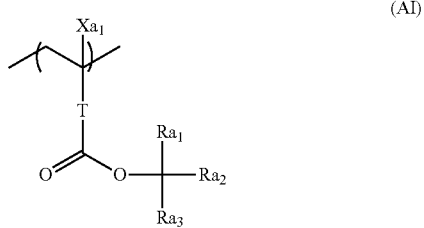

(AI)

In Formula (AI), $Xa_1$ represents a hydrogen atom or an alkyl group which may have a substituent.

represents a single bond or a divalent linking group.

$Ra_1$ to $Ra_3$ each independently represent an alkyl group (linear or branched) or a cycloalkyl group (monocyclic or polycyclic).

Two out of $Ra_1$ to $Ra_3$ may be bonded to each other to form a cycloalkyl group (monocyclic or polycyclic).

Examples of the alkyl group which is represented by $Xa_1$ and may have a substituent include a methyl group and a group represented by —$CH_2$—$R_{11}$. $R_{11}$ represents a halogen atom (such as a fluorine atom), a hydroxyl group, or a monovalent organic group.

$Xa_1$ is preferably a hydrogen atom, a methyl group, a trifluoromethyl group, or a hydroxymethyl group.

Examples of the divalent linking group represented by T include an alkylene group, a —COO-Rt- group, a —O-Rt- group, and the like. In the formulas, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

The alkyl group represented by $Ra_1$ to $Ra_3$ preferably has 1 to 4 carbon atoms.

The cycloalkyl group represented by $Ra_1$ to $Ra_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group.

The cycloalkyl group formed by the bonding of two out of $Ra_1$ to $Ra_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group. Among these, a monocyclic cycloalkyl group having 5 or 6 carbon atoms is more preferable.

In the cycloalkyl group formed by the bonding of two out of $Ra_1$ to $Ra_3$, for example, one of the methylene groups constituting a ring may be substituted with a hetero atom such as an oxygen atom or with a group having a hetero atom such as a carbonyl group.

As the repeating unit represented by Formula (AI), for example, an embodiment is preferable in which $Ra_1$ is a methyl group or an ethyl group, and $Ra_2$ and $Ra_3$ are bonded to each other to form the cycloalkyl group described above.

Each of the above groups may have a substituent. Examples of the substituent include an alkyl group (having 1 to 4 carbon atoms), a halogen atom, a hydroxyl group, an alkoxy group (having 1 to 4 carbon atoms), a carboxy group, an alkoxycarbonyl group (having 2 to 6 carbon atoms), and the like. The number of carbon atoms in the substituent is preferably equal to or smaller than 8.

The content of the repeating unit represented by Formula (AI) with respect to all the repeating units in the resin P is preferably from 20 to 90 mol %, more preferably from 25 to 85 mol %, and even more preferably from 30 to 80 mol %.

(Repeating Unit Having Lactone Structure)

Furthermore, it is preferable that the resin P contains a repeating unit Q having a lactone structure.

The repeating unit Q having a lactone structure preferably has a lactone structure on a side chain. The repeating unit Q is more preferably a repeating unit derived from a (meth) acrylic acid derivative monomer.

One kind of repeating unit Q having a lactone structure may be used singly, or two or more kinds of repeating units Q may be used in combination. However, it is preferable to use one kind of repeating unit Q singly.

The content of the repeating unit Q having a lactone structure with respect to all the repeating units in the resin P is preferably 3 to 80 mol %, and more preferably 3 to 60 mol %.

The lactone structure is preferably a 5- to 7-membered lactone structure, and more preferably a structure in which another ring structure is fused with a 5- to 7-membered lactone structure by forming a bicyclo structure or a spiro structure.

It is preferable that the lactone structure has a repeating unit having a lactone structure represented by any of Formulas (LC1-1) to (LC1-17). The lactone structure is preferably a lactone structure represented by Formula (LC1-1), Formula (LC1-4), Formula (LC1-5), or Formula (LC1-8), and is more preferably a lactone structure represented by Formula (LC1-4).

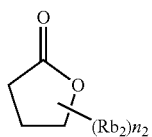 LC1-1
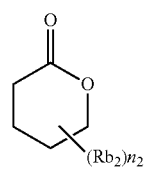 LC1-2
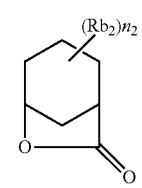 LC1-3
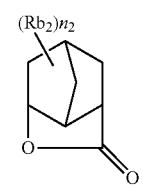 LC1-4
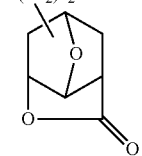 LC1-5
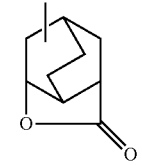 LC1-6
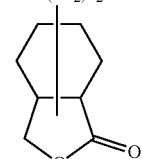 LC1-7
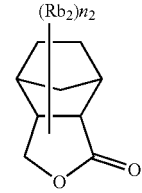 LC1-8
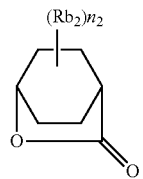 LC1-9
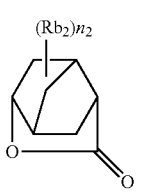 LC1-10
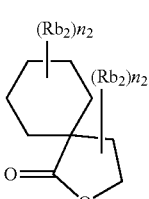 LC1-11
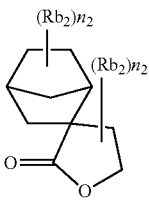 LC1-12
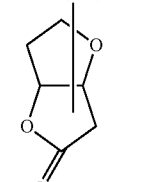 LC1-13
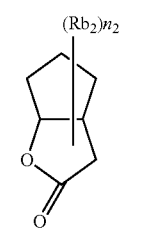 LC1-14
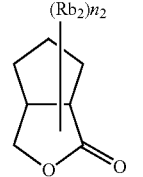 LC1-15
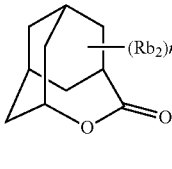 LC1-16

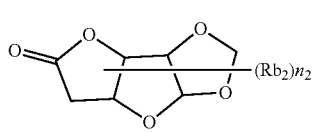

LC1-17

The lactone structure portion may have a substituent ($Rb_2$). As the substituent ($Rb_2$), for example, an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, an acid-decomposable group, and the like are preferable. $n_2$ represents an integer of 0 to 4. In a case where $n_2$ is equal to or greater than 2, a plurality of substituents ($Rb_2$) may be the same as or different from each other, and the plurality of substituents ($Rb_2$) may be bonded to each other to form a ring.

(Repeating Unit Having Phenolic Hydroxyl Group)

The resin P may also contain a repeating unit having a phenolic hydroxyl group.

Examples of the repeating unit having a phenolic hydroxyl group include a repeating unit represented by General Formula (I).

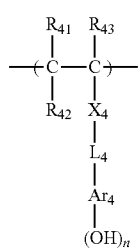

(I)

In the formula, $R_{41}$, $R_{42}$ and $R_{43}$ each independently represent a hydrogen atom, an alkyl group, a halogen atom, a cyano group, or an alkoxycarbonyl group. Here, $R_{42}$ may be bonded to $Ar_4$ to form a ring, and in this case, $R_{42}$ represents a single bond or an alkylene group.

$X_4$ represents a single bond, —COO—, or —$CONR_{64}$—, and $R_{64}$ represents a hydrogen atom or an alkyl group.

$L_4$ represents a single bond or an alkylene group.

$Ar_4$ represents an (n+1)-valent aromatic ring group. In a case where $Ar_4$ is bonded to $R_{42}$ to form a ring, $Ar_4$ represents an (n+2)-valent aromatic ring group.

n represents an integer of 1 to 5.

As the alkyl group represented by $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, or a dodecyl group which may have a substituent, is preferable, an alkyl group having 8 or less carbon atoms is more preferable, and an alkyl group having 3 or less carbon atoms is even more preferable.

The cycloalkyl group represented by $R_{41}$, $R_{42}$, and $R_{43}$ in General Formula (I) may be monocyclic or polycyclic. The cycloalkyl group is preferably a monocyclic cycloalkyl group having 3 to 8 carbon atoms such as a cyclopropyl group, a cyclopentyl group, or a cyclohexyl group which may have a substituent.

Examples of the halogen atom represented by $R_{41}$, $R_{42}$, and $R_{43}$ in General Formula (I) include a fluorine atom, a chlorine atom, a bromine atom, and an iodine atom. Among these, a fluorine atom is preferable.

As the alkyl group included in the alkoxycarbonyl group represented by $R_{41}$, $R_{42}$, and $R_{43}$ in General Formula (I), the same alkyl group as the alkyl group represented by $R_{41}$, $R_{42}$, and $R_{43}$ described above is preferable.

Examples of the substituent in each of the above groups include an alkyl group, a cycloalkyl group, an aryl group, an amino group, an amide group, a ureido group, a urethane group, a hydroxy group, a carboxy group, a halogen atom, an alkoxy group, a thioether group, an acyl group, an acyloxy group, an alkoxycarbonyl group, a cyano group, a nitro group, and the like. The number of carbon atoms in the substituent is preferably equal to or smaller than 8.

$Ar_4$ represents an (n+1)-valent aromatic ring group. In a case where n is 1, the divalent aromatic ring group may have a substituent, and examples thereof include arylene groups having 6 to 18 carbon atoms, such as a phenylene group, a tolylene group, a naphthylene group, and an anthracenylene group, and aromatic ring groups having a hetero ring such as thiophene, furan, pyrrole, benzothiophene, benzofuran, benzopyrrole, triazine, imidazole, benzimidazole, triazole, thiadiazole, and thiazole.

In a case where n is an integer equal to or greater than 2, specific examples of the (n+1)-valent aromatic ring group include groups obtained by removing (n−1) pieces of any hydrogen atom from the aforementioned specific examples of the divalent aromatic ring group.

The (n+1)-valent aromatic ring group may further have a substituent.

Examples of the substituent that the aforementioned alkyl group, cycloalkyl group, alkoxycarbonyl group, alkylene group, and (n+1)-valent aromatic ring group can have include the alkyl group exemplified above as $R_{41}$, $R_{42}$, and $R_{43}$ in General Formula (I); an alkoxy group such as a methoxy group, an ethoxy group, a hydroxyethoxy group, a propoxy group, a hydroxypropoxy group, and a butoxy group; and an aryl group such as a phenyl group.

Examples of the alkyl group represented by $R_{64}$ in —$CONR_{64}$— ($R_{64}$ represents a hydrogen atom or an alkyl group) represented by $X_4$ include an alkyl group having 20 to or less carbon atoms, such as a methyl group, an ethyl group, a propyl group, an isopropyl group, a n-butyl group, a sec-butyl group, a hexyl group, a 2-ethylhexyl group, an octyl group, and a dodecyl group which may have a substituent. Among these, an alkyl group having 8 or less carbon atoms is more preferable.

$X_4$ is preferably a single bond, —COO— or —CONH—, and more preferably a single bond or —COO—.

The alkylene group represented by $L_4$ is preferably an alkylene group having 1 to 8 carbon atoms such as a methylene group, an ethylene group, a propylene group, a butylene group, a hexylene group, and an octylene group which may have a substituent.

$Ar_4$ is preferably an aromatic ring group having 6 to 18 carbon atoms that may have a substituent, and more preferably a benzene ring group, a naphthalene ring group, or a biphenylene ring group.

It is preferable that the repeating unit represented by General Formula (I) comprises a hydroxystyrene structure. That is, $Ar_4$ is preferably a benzene ring group.

The content of the repeating unit having a phenolic hydroxyl group with respect to all the repeating units in the resin P is preferably 0 to 50 mol %, more preferably 0 to 45 mol %, and even more preferably 0 to 40 mol %.

(Repeating Unit Containing Organic Group Having Polar Group)

The resin P may further contain a repeating unit containing an organic group having a polar group, particularly, a repeating unit having an alicyclic hydrocarbon structure substituted with a polar group. In a case where the resin P further contains such a repeating unit, the substrate adhesion and the affinity with a developer are improved.

The alicyclic hydrocarbon structure substituted with a polar group is preferably an adamantyl group, a diamantyl group, or a norbornane group. As the polar group, a hydroxyl group or a cyano group is preferable.

In a case where the resin P contains a repeating unit containing an organic group having a polar group, the content of such a repeating unit with respect to all the repeating units in the resin P is preferably 1 to 50 mol %, more preferably 1 to 30 mol %, even more preferably 5 to 25 mol %, and particularly preferably 5 to 20 mol %.

(Repeating Unit Represented by General Formula (VI))

The resin P may also contain a repeating unit represented by General Formula (VI).

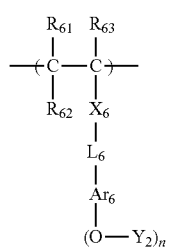

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. Here, $R_{62}$ may be bonded to $Ar_6$ to form a ring, and in this case, $R_{62}$ represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents an (n+1)-valent aromatic ring group. In a case where $Ar_6$ is bonded to $R_{62}$ to form a ring, $Ar_6$ represents an (n+2)-valent aromatic ring group.

In a case where n≥2, $Y_2$ each independently represents a hydrogen atom or a group which leaves by the action of an acid. Here, at least one of $Y_2$'s represents a group which leaves by the action of an acid.

n represents an integer of 1 to 4.

As the group $Y_2$ which leaves by the action of an acid, a structure represented by General Formula (VI-A) is preferable.

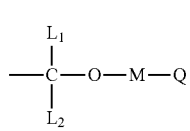

$L_1$ and $L_2$ each independently represent a hydrogen atom, an alkyl group, a cycloalkyl group, an aryl group, or a group obtained by combining an alkylene group with an aryl group.

M represents a single bond or a divalent linking group.

Q represents an alkyl group, a cycloalkyl group which may have a hetero atom, an aryl group which may have a hetero atom, an amino group, an ammonium group, a mercapto group, a cyano group, or an aldehyde group.

At least two out of Q, M and $L_1$ may be bonded to each other to form a ring (preferably a 5- or 6-membered ring).

The repeating unit represented by General Formula (VI) is preferably a repeating unit represented by General Formula (3).

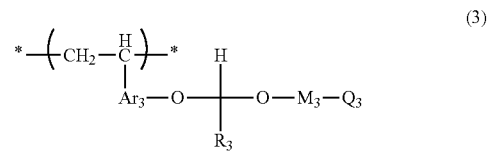

In General Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two out of $Q_3$, $M_3$, and $R_3$ may be bonded to each other to form a ring.

The aromatic ring group represented by $Ar_3$ is the same as $Ar_6$ in General Formula (VI) in which n is 1. The aromatic ring group is preferably a phenylene group or a naphthylene group, and more preferably a phenylene group.

(Repeating Unit Having Silicon Atom on Side Chain)

The resin P may further contain a repeating unit having a silicon atom on a side chain. Examples of the repeating unit having a silicon atom on a side chain include a (meth)acrylate-based repeating unit having a silicon atom, a vinyl-based repeating unit having a silicon atom, and the like. The repeating unit having a silicon atom on a side chain is typically a repeating unit having a group, which has a silicon atom, on a side chain. Examples of the group having a silicon atom include a trimethylsilyl group, a triethylsilyl group, a triphenylsilyl group, a tricyclohexylsilyl group, a tristrimethylsiloxysilyl group, a tristrimethylsilyl silyl group, a methyl bistrimethylsilyl silyl group, a methyl bistrimethylsiloxysilyl group, a dimethyltrimethylsilyl silyl group, a dimethyl trimethylsiloxysilyl group, cyclic or linear polysiloxane shown below, a cage-like, ladder-like, or random silsesquioxane structure, and the like. In the formula, R and $R^1$ each independently represent a monovalent substituent. * represents a bond.

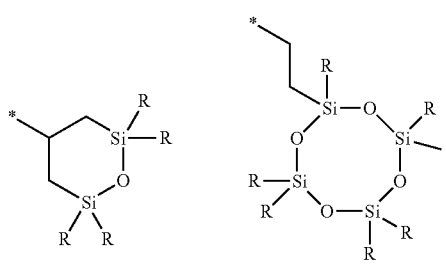

-continued

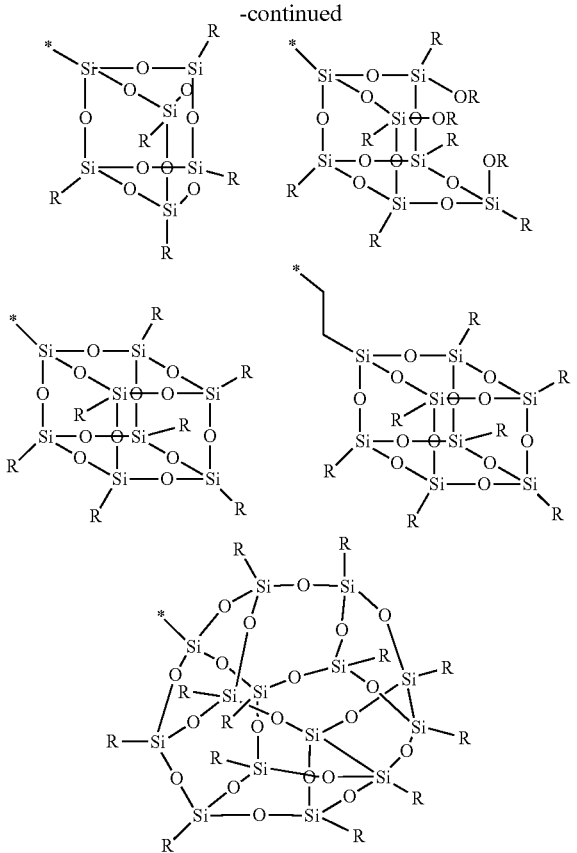

As the repeating unit having the aforementioned group, for example, a repeating unit derived from an acrylate or methacrylate compound having the aforementioned group or a repeating unit derived from a compound having the aforementioned group and a vinyl group is preferable.

In a case where the resin P has the repeating unit having a silicon atom on a side chain, the content of such a repeating unit with respect to all the repeating units in the resin P is preferably 1 to 30 mol %, more preferably 5 to 25 mol %, and even more preferably 5 to 20 mol %.

The weight-average molecular weight of the resin P that is measured by a gel permeation chromatography (GPC) method and expressed in terms of polystyrene is preferably 1,000 to 200,000, more preferably 3,000 to 20,000, and even more preferably 5,000 to 15,000. In a case where the weight-average molecular weight is 1,000 to 200,000, it is possible to prevent the deterioration of heat resistance and dry etching resistance, to prevent the deterioration of developability, and to prevent film forming properties from deteriorating due to the increase in viscosity.

The dispersity (molecular weight distribution) is generally 1 to 5, preferably 1 to 3, more preferably 1.2 to 3.0, and even more preferably 1.2 to 2.0.

As other components (for example, an acid generator, a basic compound, a quencher, a hydrophobic resin, a surfactant, a solvent, and the like) to be contained in the chemical liquid, any known components can be used.

<Aqueous Liquid to be Purified>

The aqueous liquid to be purified contains water in an amount greater than 50% by mass with respect to the total mass of solvents contained in the aqueous liquid to be purified. The content of water is preferably 51% to 95% by mass.

The water is not particularly limited, but it is preferable to use ultrapure water used for manufacturing semiconductors. The ultrapure water is more preferably used after being further purified such that the inorganic anions, metal ions, and the like are reduced. The purification method is not particularly limited, but is preferably purification using a filtration membrane or an ion-exchange membrane and purification by distillation. Furthermore, for example, it is preferable to perform purification by the method described in JP2007-254168A.

(Oxidant)

The aqueous liquid to be purified may contain an oxidant. As the oxidant, known oxidants can be used without particular limitation. Examples of the oxidant include hydrogen peroxide, a peroxide, nitric acid, nitrate, iodate, periodate, hypochlorite, chlorite, chlorate, perchlorate, persulfate, dichromate, permanganate, aqueous ozone, a silver (II) salt, an iron (III) salt, and the like.

The content of the oxidant is not particularly limited, but is preferably equal to or greater than 0.1% by mass and equal to or smaller than 99.0% by mass with respect to the total mass of the aqueous liquid to be purified. One kind of oxidant may be used singly, or two or more kinds of oxidants may be used in combination. In a case where two or more kinds of oxidants are used in combination, the total content thereof is preferably within the above range.

(Inorganic Acid)

The aqueous liquid to be purified may contain an inorganic acid. As the inorganic acid, known inorganic acids can be used without particular limitation. Examples of the inorganic acid include sulfuric acid, phosphoric acid, hydrochloric acid, and the like. The inorganic acid is not included in the oxidant described above.

The content of the inorganic acid in the aqueous liquid to be purified is not particularly limited, but is preferably equal to or greater than 0.01% by mass and equal to or smaller than 99.0% by mass with respect to the total mass of the aqueous liquid to be purified.

One kind of inorganic acid may be used singly, or two or more kinds of inorganic acids may be used in combination. In a case where two or more kinds of inorganic acids are used in combination, the total content thereof is preferably within the above range.

(Anticorrosive)

The aqueous liquid to be purified may contain an anticorrosive. As the anticorrosive, known anticorrosives can be used without particular limitation. Examples of the anticorrosive include 1,2,4-triazole (TAZ), 5-aminotetrazole (ATA), 5-amino-1,3,4-thiadiazole-2-thiol, 3-amino-1H-1,2,4-triazole, 3,5-diamino-1,2,4-triazole, tolyl triazole, 3-amino-5-mercapto-1,2,4-triazole, 1-amino-1,2,4-triazole, 1-amino-1,2,3-triazole, 1-amino-5-methyl-1,2,3-triazole, 3-mercapto-1,2,4-triazole, 3-isopropyl-1,2,4-triazole, naphthotriazole, 1H-tetrazole-5-acetic acid, 2-mercaptobenzothiazole (2-MBT), 1-phenyl-2-tetrazoline-5-thione, 2-mercaptobenzimidazole (2-MBI), 4-methyl-2-phenylimidazole, 2-mercaptothiazoline, 2,4-diamino-6-methyl-1,3,5-triazine, thiazole, imidazole, benzimidazole, triazine, methyl tetrazole, bismuthiol I, 1,3-dimethyl-2-imidazolidinone, 1,5-pentamethylene tetrazole, 1-phenyl-5-mercaptotetrazole, diaminomethyltriazine, imidazolinethion, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, a phosphate inhibitor, amines, pyrazoles, propanethiol, silanes, secondary amines, benzohydroxamic acids, a heterocyclic nitrogen inhibitor, thiourea, 1,1,3,3-tetramethylurea, urea, urea derivatives, uric acid, potassium ethylxanthate, glycine, dodecyl phosphate, iminodiacetic acid, boric acid, malonic acid, succinic acid, nitrilotriacetic acid, sulfolane, 2,3,5-trimethylpyrazine, 2-ethyl-3,5-dimethylpyrazine, quinoxaline, acetylpyrrole, pyridazine, histadine, pyrazine, glutathione (reduced), cysteine, cystine, thiophene, mercaptopyridine N-oxide, thiamine HCl, tetraethylthiuram disulfide, 2,5-dimercapto-1,3-thiadiazole ascorbic acid, catechol, t-butyl catechol, phenol, and pyrogallol.

As the anticorrosive, it is also possible to use aliphatic carboxylic acids such as dodecanoic acid, palmitic acid, 2-ethylhexanoic acid, and cyclohexanoic acid; carboxylic acids having a chelating ability such as citric acid, malic acid, oxalic acid, malonic acid, succinic acid, itaconic acid, maleic acid, glycolic acid, mercaptoacetic acid, thioglycolic acid, salicylic acid, sulfosalicylic acid, anthranilic acid, N-methylanthranilic acid, 3-amino-2-naphthoic acid, 1-amino-2-naphthoic acid, 2-amino-1-naphthoic acid, 1-aminoanthraquinone-2-carboxylic acid, tannic acid, and gallic acid; and the like.

Examples of the anticorrosive also include anionic surfactants such as a palm fatty acid salt, a sulfonated castor oil salt, a lauryl sulfate salt, a polyoxyalkylene allyl phenyl ether sulfate salt, alkylbenzene sulfonic acid, alkylbenzene sulfonate, alkyl diphenyl ether disulfonate, alkyl naphthalene sulfonate, a dialkylsulfosuccinate salt, isopropyl phosphate salt, a polyoxyethylene alkyl ether phosphate salt, and a polyoxyethylene allyl phenyl ether phosphate salt; cationic surfactants such as oleylamine cetate, laurylpyridinium chloride, cetylpyridinium chloride, lauryltrimethylammonium chloride, stearyltrimethylammonium chloride, behenyltrimethylammonium chloride, and didecyldimethylammonium chloride; amphoteric surfactants such as palm alkyldimethylamine oxide, fatty acid amidopropyldimethylamine oxide, alkylpolyaminoethyl glycine hydrochloride, an amidobetaine-type activator, an alanine-type activator, and lauryl iminodipropionic acid; nonionic surfactants of a polyoxyalkylene primary alkyl ether or a polyoxyalkylene secondary alkyl ether, such as polyoxyethylene octyl ether, polyoxyethylene decyl ether, polyoxyethylene lauryl ether, polyoxyethylene lauryl amine, polyoxyethylene oleyl amine, polyoxyethylene polystyryl phenyl ether, and polyoxyalkylene polystyryl phenyl ether and other polyoxyalkylene-based nonionic surfactants such as polyoxyethylene dilaurate, polyoxyethylene laurate, polyoxyethylated castor oil, polyoxyethylated hydrogenated castor oil, a sorbitan lauric acid ester, a polyoxyethylene sorbitan lauric acid ester, and fatty acid diethanolamide; fatty acid alkyl esters such as octyl stearate and trimethylolpropane tridecanoate; and polyether polyols such as polyoxyalkylene butyl ether, polyoxyalkylene oleyl ether, and trimethylolpropane tris (polyoxyalkylene) ether.

Examples of commercial products of the above anticorrosives include NEWCALGEN FS-3PG (manufactured by TAKEMOTO OIL & FAT Co., Ltd.), PHOSTEN HLP-1 (manufactured by Nikko Chemicals Co., Ltd.), and the like.

As the anticorrosive, a hydrophilic polymer can also be used.

Examples of the hydrophilic polymer include polyglycols such as polyethylene glycol, an alkyl ether of polyglycols, polyvinyl alcohol, polyvinyl pyrrolidone, polysaccharides such as alginic acid, carboxylic acid-containing polymers such as polymethacrylic acid and polyacrylic acid, polyacrylamide, polymethacrylamide, polyethyleneimine, and the like. Specific examples of these hydrophilic polymers include the water-soluble polymers described in paragraphs "0042" to "0044" in JP2009-088243A and paragraph "0026" in JP2007-194261A.

As the anticorrosive, a cerium salt can also be used.

As the cerium salt, known cerium salts can be used without particular limitation.

Examples of the cerium salt include trivalent cerium salts such as cerium acetate, cerium nitrate, cerium chloride, cerium carbonate, cerium oxalate, and cerium sulfate and tetravalent cerium salts such as cerium sulfate, cerium ammonium sulfate, cerium ammonium nitrate, diammonium cerium nitrate, cerium hydroxide, and the like.

The anticorrosive may include substituted or unsubstituted benzotriazole. Suitable substituted benzotriazole includes, but is not limited to, benzotriazole substituted with an alkyl group, an aryl group, a halogen group, an amino group, a nitro group, an alkoxy group, or a hydroxyl group. The substituted benzotriazole also includes compounds fused by one or more aryl (for example, phenyl) or heteroaryl groups.

It is preferable that the content of the anticorrosive in the aqueous liquid to be purified is adjusted such that the content of the anticorrosive is 0.01% to 5% by mass with respect to the total mass of the chemical liquid. One kind of anticorrosive may be used singly, or two or more kinds of anticorrosives may be used in combination. In a case where two or more kinds of anticorrosives are used in combination, the total content thereof is preferably within the above range.

(Organic Solvent)

The aqueous liquid to be purified may contain an organic solvent. The organic solvent is not particularly limited, and is the same as the aforementioned organic solvent contained in the organic solvent-based liquid to be purified. In a case where the aqueous liquid to be purified contains an organic solvent, the content of the organic solvent is preferably 5% to 35% by mass with respect to the total mass of solvents contained in the aqueous liquid to be purified.

<Relationship Between Liquid to be Purified and Filtering Device>

The relationship between the liquid to be purified and the filtering device (arrangement of filters) is not particularly limited. Regarding the relationship with the solubility parameter (SP value) of the liquid to be purified, in a case where the SP value is equal to or lower than 20 $(MPa)^{1/2}$, the filtering device preferably has the filter BU and the filter A described above, and the filter BU more preferably contains a resin having an ion exchange group as a material component. The lower limit of the SP value is not particularly limited, but is preferably equal to or higher than 14 $(MPa)^{1/2}$.

In other words, the filtering device according to an embodiment of the present invention is more preferably used for purifying a liquid to be purified having an SP value equal to or lower than 20 $(MPa)^{1/2}$. That is, the filtering device according to the embodiment of the present invention can be preferably used for purifying a liquid to be purified having an SP value of 14 to 20 $(MPa)^{1/2}$.

According to the examination of the inventors of the present invention, it has been found that in a case where the SP value of the liquid to be purified is equal to or lower than 20 $(MPa)^{1/2}$, and the liquid to be purified is passed through the filter BU containing a resin having an ion exchange group as a material component, although the detailed mechanism is unclear, due to the swelling of the filter BU or the like, sometimes particle-like impurities in the form of microgel migrate to the liquid to be purified from the filter BU.

In this case, the filter BU has a strong interaction with ionic components (typically, impurities such as metal ions) in the liquid to be purified, and thus can remove the impurities from the liquid to be purified. On the other hand, as described above, in a case where the SP value of the liquid to be purified is equal to or lower than a predetermined range, sometimes a trace of impurities (including a gel-like substance) are mixed into the liquid to be purified.

Conventionally, in order to remove such a gel-like substance from the liquid to be purified, adsorption by a nylon filter has been exploited. However, in a case where the SP value of the liquid to be purified is 20 $(MPa)^{1/2}$, the durability of the nylon filter is insufficient, and sometimes the nylon filter becomes a new source of defects.

In the filtering device according to the embodiment described above, the filter A is disposed after the filter BU. Accordingly, the filtering device is preferable because the aforementioned particle-like impurities including the gel-like substance can be removed.

The filter A exhibits sufficient durability even for a liquid to be purified having an SP value equal to or lower than 20 $(MPa)^{1/2}$, and has a hydrophilic surface. Presumably, for this reason, in a case where the liquid to be purified is passed through the filter A, a coat may be formed on the surface of the membrane by a hydrophilic liquid, and the gel-like impurities in the liquid to be purified could be efficiently removed by the coat.

In the present specification, the SP value means "value of the solubility parameter". The SP value mentioned in the present invention is a Hansen solubility parameter determined by the equation explained in "Hansen Solubility Parameters: A User's Handbook, Second Edition, C. M. Hansen (2007), Taylor and Francis Group, LLC (HSPiP manual). As the SP value, a value calculated by the following equation by using "Hansen Solubility Parameters in Practice HSPiP, 3rd Edition" (software version 4.0.05) is used.

$$(SP\ value) = (\delta Hd)^2 + (\delta Hp)^2 + (\delta Hh)^2$$

Hd: dispersion element
Hp: polarization element (polarity element)
Hh: hydrogen bond element In the case where the liquid to be purified is a mixture of two or more kinds of solvents, the SP value of the liquid to be purified is determined by the sum of the products of the SP value of each of the solvents and the volume fraction of each of the solvents. That is, the SP value of the liquid to be purified it is represented by the following equation.

$$(SP\ value\ of\ liquid\ to\ be\ purified) = \Sigma\{(SP\ value\ of\ each\ solvent) \times (volume\ fraction\ of\ each\ solvent)\}$$

For example, in a case where the solvent contained in the liquid to be purified is a 7:3 (based on volume) mixture of PGMEA and PGME, the SP value thereof is calculated by $17.8 \times 0.7 + 23.05 \times 0.3$, which equals 19.375 $(MPa)^{1/2}$. In the present specification, in a case where the SP value is expressed by the unit of $(MPa)^{1/2}$, the SP value is determined by rounding off the numbers to two decimal points. In the case described above, the SP value of the liquid to be purified is 19.4 $(MPa)^{1/2}$ as described in Table 1.

[Filtration Step]

The method for manufacturing a chemical liquid according to the present embodiment includes a filtration step of filtering the liquid to be purified by using the filtering device described above so as to obtain a chemical liquid.

The filtering device has a flow path formed by arranging the filter A and the filter B in series. The feed pressure of the liquid to be purified supplied to each filter is not particularly limited, but is preferably 0.00010 to 1.0 MPa in general.

Particularly, in view of obtaining a chemical liquid having further improved defect inhibition performance, a feed pressure $P_2$ is preferably 0.00050 to 0.090 MPa, more preferably 0.0010 to 0.050 MPa, and even more preferably 0.0050 to 0.040 MPa.

The filtration pressure affects the filtration accuracy. Therefore, it is preferable that the pulsation of pressure during filtration is as low as possible.

The filtration speed is not particularly limited. However, in view of easily obtaining a chemical liquid having further improved defect inhibition performance, the filtration speed is preferably equal to or higher than 1.0 $L/min/m^2$, more preferably equal to or higher than 0.75 $L/min/m^2$, and even more preferably equal to or higher than 0.6 $L/min/m^2$.

For the filter, an endurable differential pressure for assuring the filter performance (assuring that the filter will not be broken) is set. In a case where the endurable differential pressure is high, by increasing the filtration pressure, the filtration speed can be increased. That is, it is preferable that the upper limit of the filtration speed is generally equal to or lower than 10.0 $L/min/m^2$ although the upper limit usually depends on the endurable differential pressure of the filter.

The temperature at which the liquid to be purified passes through the filter is not particularly limited, but is preferably less than room temperature in general.

The filtration step is preferably performed in a clean environment. Specifically, the filtration step is preferably performed in a clean room that satisfies Class 1000 (Class 6 in ISO14644-1:2015) of Federal Standard (Fed. Std. 209E), more preferably performed in a clean room that satisfies Class 100 (Class 5 in ISO14644-1:2015), even more preferably performed in a clean room that satisfies Class 10 (Class 4 in ISO14644-1: 2015), and particularly preferably performed in a clean room that has a cleanliness (Class 2 or Class 1) equal to or higher than Class 1 (Class 3 in ISO14644-1: 2015).

It is preferable that each step which will be described later is also performed in the clean environment described above.

In a case where the filtering device has a return flow path, the filtration step may be a circulation filtration step. The circulation filtration step is a step of filtering the liquid to be purified by at least the filter A, returning the liquid to be purified having been filtered through the filter A to the upstream of the filter A in the flow path, and filtering again the liquid to be purified through the filter A.

The number of times of the circulation filtration is not particularly limited, but is preferably 2 to 10 in general. During the circulation filtration, the liquid to be purified may be returned to the upstream of the filter A such that the filtration by the filter A is repeated. At this time, the return flow path may be adjusted such that the filtration by at least one filter B is also repeated in addition to the filtration by the filter A.

[Other Steps]

The method for manufacturing a chemical liquid according to the present embodiment may include steps other than the above step. Examples of the steps other than the above step include a filter washing step, a device washing step, an electricity removing step, a step of preparing a liquid to be purified, and the like. Hereinafter, each of the steps will be specifically described.

<Filter Washing Step>

The filter washing step is a step of washing the filter A and the filter B before the filtration step. The method of washing the filter is not particularly limited, and examples thereof include a method of immersing the filter in an immersion solution, a method of washing the filter by passing a washing solution through the filter, a combination of these, and the like.

(Method of Immersing Filter in Immersion Solution)

Examples of the method of immersing the filter in the immersion solution include a method of filling a container for immersion with the immersion solution and immersing the filter in the immersion solution.

Immersion Solution

As the immersion solution, known immersion solutions can be used without particular limitation. Particularly, in view of obtaining further improved effects of the present invention, the immersion solution preferably contains water or an organic solvent as a main component, and more preferably contains an organic solvent as a main component. In the present specification, the main component means a component of which the content is equal to or greater than 99.9% by mass with respect to the total mass of the immersion solution. The content of the main component is more preferably equal to or greater than 99.99% by mass.

The organic solvent is not particularly limited, and it is possible to use the organic solvent described above as the organic solvent contained in the liquid to be purified. Particularly, in view of obtaining further improved effects of the present invention, it is preferable that the immersion solution contains at least one kind of organic solvent selected from the group consisting of an ester-based solvent and a ketone-based solvent. Furthermore, these may be used in combination.

Examples of the ester-based solvent include, but are not limited to, ethyl acetate, methyl acetate, butyl acetate, sec-butyl acetate, methoxybutyl acetate, amyl acetate, normal propyl acetate, isopropyl acetate, ethyl lactate, methyl lactate, butyl lactate, and the like.

Examples of the ketone-based solvent include, but are not limited to, acetone, 2-heptanone (MAK), methyl ethyl ketone (MEK), methyl isobutyl ketone, diisobutyl ketone, cyclohexanone, diacetone alcohol, and the like.

The time for which the filter is immersed in the immersion solution is not particularly limited. However, in view of obtaining further improved effects of the present invention, it is preferable that the filter is immersed in the immersion solution for 7 days to 1 year.

The temperature of the immersion solution is not particularly limited. However, in view of obtaining further improved effects of the present invention, the temperature of the immersion solution is preferably equal to or higher than 20° C.

Examples of the method of immersing the filter in the immersion solution include a method of filling a container for immersion with the immersion solution and immersing the filter in the immersion solution.

As the container for immersion, it is possible to use the housing that the filter unit in the aforementioned filtering device has. That is, for example, it is possible to use a method of filling the housing with the immersion solution in a state where the filter (typically, a filter cartridge) is stored in the housing that the filtering device has and leaving the filter to stand still as it is.

In addition to the above method, for example, it is possible to use a method of preparing a container for immersion in addition to the housing that the filtering device has (that is, preparing a container for immersion on the outside of the filtering device), filling the additionally prepared container for immersion with the immersion solution, and immersing the filter in the immersion solution.

Particularly, it is preferable to use a method of filling the container for immersion prepared on the outside of the filtering device with the immersion solution and immersing the filter in the immersion solution, because then the impurities eluted from the filter are not mixed into the filtering device.

The shape and size of the container for immersion are not particularly limited and can be appropriately selected according to the number and size of the filters to be immersed, and the like.

The material of the container for immersion is not particularly limited, and it is preferable that at least a liquid contact portion of the container is formed of the anticorrosive material described above.

The material of the container for immersion preferably contains at least one kind of material selected from the group consisting of polyfluorocarbon (such as PTFE, PFA: perfluoroalkoxyalkane and PCTFE: polychlorotrifluoroethylene), PPS (polyphenylene sulfide), POM (polyoxymethylene), and polyolefin (PP and PE, etc.), more preferably contains at least one kind of material selected from the group consisting of polyfluorocarbon, PPS, and POM, even more preferably contains polyfluorocarbon, particularly preferably contains at least one kind of material selected from the group consisting of PTFE, PFA, and PCTFE, and most preferably contains PTFE.

Furthermore, it is preferable that the container for immersion is washed before use. During washing, it is preferable to perform washing (so-called pre-washing) by using the immersion solution.

(Method of Washing by Passing Washing Solution Through Filter)

The method of washing the filter by passing the washing solution through the filter is not particularly limited. For example, by storing the filter (typically, a filter cartridge) in the filter housing of the filter unit of the filtering device described above and introducing the washing solution into the filter housing, the washing solution is passed through the filter.

During washing, the impurities having adhered to the filter migrate to (typically, dissolve in) the washing solution, and thus the content of impurities in the washing solution increases. Therefore, it is preferable that the washing solution once passed through the filter is discharged out of the filtering device without being reused for washing. In other words, it is preferable not to perform circulation washing.

As another form of the method of washing the filter by passing the washing solution through the filter, for example, there is a method of washing the filter by using a washing device. In the present specification, the washing device means a device different from the filtering device that is provided on the outside of the filtering device. Although the form of the washing device is not particularly limited, it is possible to use a device having the same constitution as that of the filtering device.

Washing Solution

As the washing solution which is used in a case where the filter is washed by passing the washing solution through the filter, known washing solutions can be used without particular limitation. Particularly, in view of obtaining further improved effects of the present invention, the form of the washing solution is preferably the same as that of the immersion solution described above.

<Device Washing Step>

The device washing step is a step of washing the liquid contact portion of the filtering device before the filtration step. The method of washing the liquid contact portion of the filtering device before the filtration step is not particularly limited. Hereinafter, the method will be described by taking a filtering device, in which the filter is a cartridge filter that is stored in a housing disposed on a flow path, as an example.

It is preferable that the device washing step includes a step A of washing the liquid contact portion of the filtering device by using a washing solution in a state where the cartridge filter is detached from the housing, and a step B of storing the cartridge filter in the housing after the step A and washing the liquid contact portion of the filtering device by using a washing solution.

Step A

The step A is a step of washing the liquid contact portion of the filtering device by using a washing solution in a state where the cartridge filter is detached from the housing. "In a state where the filter is detached from the housing" means that the liquid contact portion of the filtering device is washed using a washing solution after the filter cartridge is detached from the housing or before the filter cartridge is stored in the housing.

There is no particular limitation on the method of washing the liquid contact portion of the filtering device by using a washing solution in a state where the filter is detached from the housing (hereinafter, also described as "filtering device not storing the filter"). Examples thereof include a method of introducing the washing solution from the inlet portion and collecting the washing solution from the outlet portion.

Particularly, in view of obtaining further improved effects of the present invention, examples of the method of washing the liquid contact portion of the filtering device not storing the filter by using a washing solution include a method of filling the filtering device not storing the filter with a washing solution. In a case where the filtering device not storing the filter is filled with a washing solution, the liquid contact portion of the filtering device not storing a filter contacts the washing solution. As a result, impurities having adhered to the liquid contact portion of the filtering device migrate to (typically, eluted in) the washing solution. After washing, the washing solution may be discharged out of the filtering device (typically, the washing solution may be discharged from the outlet portion).

Washing Solution

As the washing solution, known washing solutions can be used without particular limitation. Particularly, in view of obtaining further improved effects of the present invention, the washing solution preferably contains water or an organic solvent as a main component, and more preferably contains an organic solvent as a main component. In the present specification, the main component means a component of which the content is equal to or greater than 99.9% by mass with respect to the total mass of the washing solution. The content of the main component is more preferably equal to or greater than 99.99% by mass.

The organic solvent is not particularly limited, and it is possible to use water and the organic solvent described above as the organic solvent that the chemical liquid contains. As the organic solvent, in view of obtaining further improved effects of the present invention, at least one kind of compound is preferable which is selected from the group consisting of PGMEA, cyclohexanone, ethyl lactate, butyl acetate, MIBC, MMP (3-methylmethoxypropionate), MAK, n-pentyl acetate, ethylene glycol, isopentyl acetate, PGME, methyl ethyl ketone (MEK), 1-hexanol, and decane.

Step B

The step B is a method of washing the filtering device by using a washing solution in a state where a filter is stored in the housing.

As the method of washing the filtering device by using a washing solution, in addition to the washing method in the step A described above, a method of passing a washing solution through the filtering device can also be used. The method of passing the washing solution through the filtering device is not particularly limited. The washing solution may be introduced from the inlet portion and discharged from the outlet portion. As the washing solution usable in this step, the washing solution used in the step A can be used without particular limitation.

<Electricity Removing Step>

The electricity removing step is a step of removing electricity from the liquid to be purified such that the charge potential of the liquid to be purified is reduced. As the electricity removing method, known electricity removing methods can be used without particular limitation. Examples of the electricity removing method include a method of bringing the liquid to be purified into contact with a conductive material.

The contact time for which the liquid to be purified is brought into contact with a conductive material is preferably 0.001 to 60 seconds, more preferably 0.001 to 1 second, and even more preferably 0.01 to 0.1 seconds. Examples of the conductive material include stainless steel, gold, platinum, diamond, glassy carbon, and the like.

Examples of the method of bringing the liquid to be purified into contact with a conductive material include a method of disposing a grounded mesh consisting of a conductive material such that the mesh crosses the flow path and passing the liquid to be purified through the mesh.

<Step of Preparing Liquid to be Purified>

The step of preparing a liquid to be purified is a step of preparing a liquid to be purified that will be caused to flow into the filtering device from the inlet portion of the filtering device. The method of preparing the liquid to be purified is not particularly limited. Typically, examples thereof include a method of purchasing commercial products (for example, those called "high-purity grade products"), a method of reacting one kind or two or more kinds of raw materials so as to obtain a liquid to be purified, a method of dissolving components in a solvent, and the like.

As the method of obtaining a liquid to be purified (typically, a liquid to be purified containing an organic solvent) by reacting the raw materials, known methods can be used without particular limitation. For example, it is possible to use a method of reacting one or two or more raw materials in the presence of a catalyst so as to obtain a liquid to be purified containing an organic solvent.

More specifically, examples thereof include a method of obtaining butyl acetate by reacting acetic acid and n-butanol in the presence of sulfuric acid; a method of obtaining 1-hexanol by reacting ethylene, oxygen, and water in the presence of $Al(C_2H_5)_3$; a method of obtaining 4-methyl-2-pentanol by reacting cis-4-methyl-2-pentene in the presence of Diisopinocamphenyl borane ($Ipc_2BH$); a method for obtaining propylene glycol 1-monomethyl ether 2-acetate (PGMEA) by reacting propylene oxide, methanol and acetic acid in the presence of sulfuric acid; a method of obtaining isopropyl alcohol (IPA) by reacting acetone and hydrogen in the presence of copper oxide-zinc oxide-aluminum oxide; a method of obtaining ethyl lactate by reacting lactic acid and ethanol; and the like.

In addition, this step may have a pre-purification step of purifying the liquid to be purified in advance before the liquid is caused to flow into the filtering device. The pre-purification step is not particularly limited, and examples thereof include a method of purifying the liquid to be purified by using a distillation device.

In the pre-purification step, the method of purifying the liquid to be purified by using a distillation device is not particularly limited. Examples thereof include a method of purifying the liquid to be purified in advance by using a distillation device prepared separately from the filtering device so as to obtain a distilled liquid to be purified, storing the liquid in a portable tank, and transporting the tank to the filtering device so as to introduce the liquid into the filtering device, and a method of using a purification device which will be described later.

First, by using FIG. 11, a method (pre-purification step) of purifying the liquid to be purified in advance by using a distillation device prepared separately from the filtering device will be described.

Figure 11:
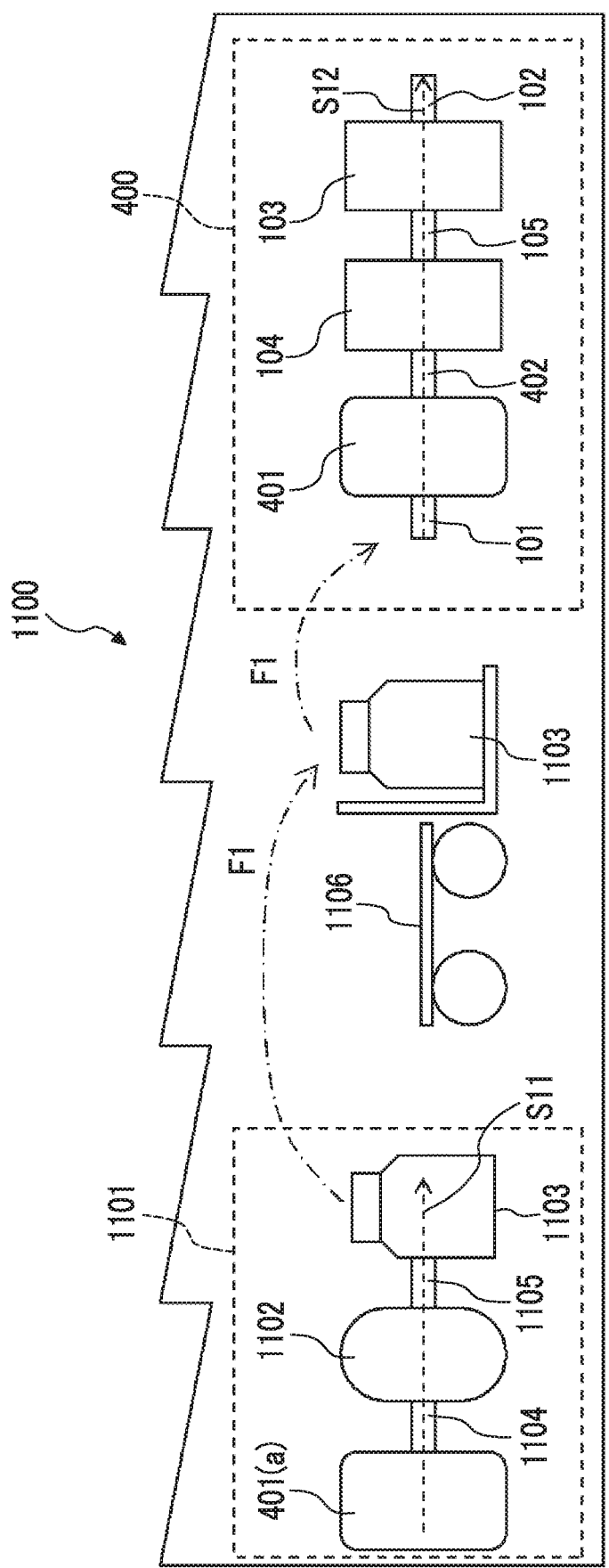
FIG. 11 is a schematic view showing a procedure of a pre-purification step performed in a case where a distillation device and a filtering device are arranged in the same manufacturing plant.

FIG. 11 is a schematic view showing the relationship between the devices in a case where a chemical liquid is manufactured using a distilled liquid to be purified that is purified in advance by a distiller.

In FIG. 11, the form of a filtering device 400 is the same as that of the filtering device according to the third embodiment of the present invention described above. Therefore, the filtering device 400 will not be described.

In a chemical liquid manufacturing plant 1100, a filtering device 400 and a distillation device 1101 are arranged. The distillation device 1101 has a tank 401($a$), a distiller 1102, and a portable tank 1103, which are connected to one another through a piping 1104 and a piping 1105. The tank 401($a$), the piping 1104, the distiller 1102, the piping 1105, and the portable tank 1103 forma flow path S11.

The form of the tank 401($a$) and each piping is not particularly limited, and it is possible to use the tank and piping of the same form as described above as the tank and the piping included in the filtering device according to an embodiment of the present invention. As the distiller 1102, it is possible to use the same distiller as the distiller included in the purification device according to an embodiment of the present invention. The form of the distiller 1102 will be described later.

In the distillation device 1101, a liquid to be purified introduced into the tank 401($a$) is distilled by the distiller 1102, and the obtained distilled liquid to be purified is stored in the portable tank 1103. Although the form of the portable tank is not particularly limited, it is preferable that at least a portion of the liquid contact portion of the tank (preferably 90% or more of the surface area of the liquid contact portion and more preferably 99% or more of the surface area of the liquid contact portion) consists of the anticorrosive material which will be described later.

The distilled liquid to be purified stored in the portable tank 1103 is transported by a transporting unit 1106 (the flow of F1 in FIG. 9). Then, the distilled liquid to be purified is introduced into the filtering device 400 from the inlet portion 101 of the filtering device.

In FIG. 11, an embodiment is described in which a distillation device and a filtering device are arranged in the same manufacturing plant. However, the distillation device and the filtering device may be arranged in different manufacturing plants.

Next, a pre-purification step using a purification device having a distiller and a filtering device will be described. First, the purification device used in this step will be described.

(Purification Device)

The purification device used in this step has the filtering device described above. The purification device according to an embodiment of the present invention has the filtering device described above, a second inlet portion, a second outlet portion, and at least one distiller disposed between the second inlet portion and the second outlet portion, in which the second outlet portion is connected to an inlet portion of the filtering device described above, and a flow path extending from the second inlet portion to the outlet portion of the filtering device is formed. Hereinafter, the purification device will be described with reference to drawings.

In the following section, the details relating to the constitution of the filtering device will not be described because they are the same as those described above.

First Embodiment of Purification Device

Figure 12:
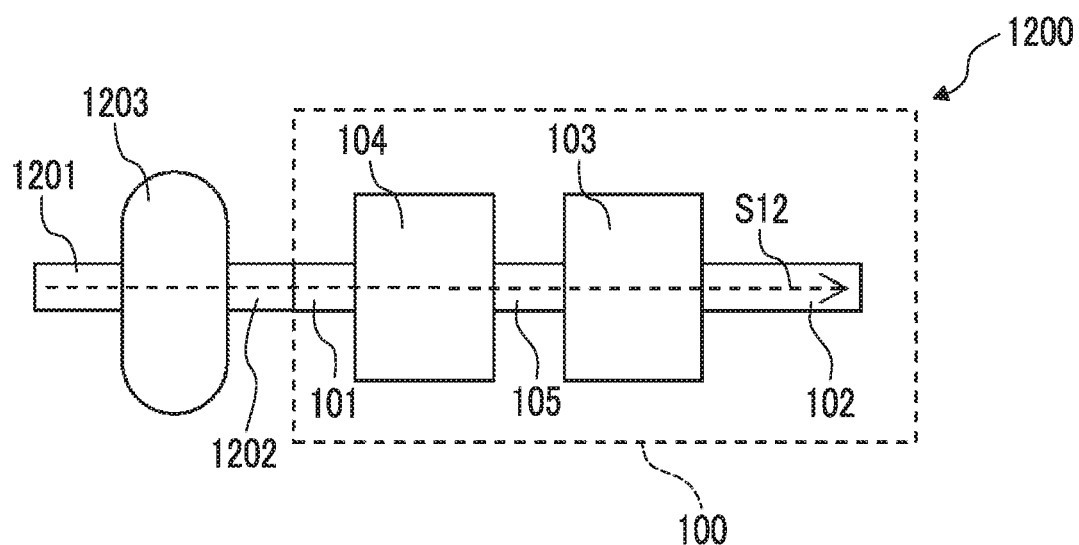
FIG. 12 is a schematic view illustrating a purification device according to the first embodiment of the present invention.

FIG. 12 is a schematic view illustrating a first embodiment of the purification device of the present invention. A purification device 1200 has a second inlet portion 1201, a second outlet portion 1202, and a distiller 1203 disposed between the second inlet portion 1201 and the second outlet portion 1202, in which the second outlet portion 1202 is connected to an inlet portion 101 of the filtering device. Therefore, in the purification device 1200, by the second inlet portion 1201, the distiller 1203, the second outlet portion 1202, the inlet portion 101, the filter 104 (filter BU), a piping 105, the filter 103 (filter A), and the outlet portion 102, a flow path S12 is formed.

That is, the distiller 1203 is connected to the inlet portion 101 of the filtering device 100.

The liquid to be purified having flowed into the purification device 1200 from the second inlet portion 1201 is distilled in the distiller 1203, and then is introduced into the filtering device 100 from the inlet portion 101 through the second outlet portion 1202. In a case where the pre-purification step is performed using the present purification device, the next step (filtration step) can be performed without discharging the distilled liquid to be purified outside the device. Therefore, a chemical liquid having further improved defect inhibition performance can be obtained.

The form of the distiller 1203 is not particularly limited, and known distillers (for example, a distillation column) can be used. As the material of the distiller 1203, it is possible to use the same material as that of the housing described above. Particularly, it is preferable that at least a portion of the liquid contact portion of the distiller 1203 consists of the anticorrosive material which will be described later. It is preferable that 90% or more of the area of the liquid contact portion consists of the anticorrosive material. It is more preferable that 99% of the area of the liquid contact portion consists of the anticorrosive material.

As the distiller, known distillers can be used without particular limitation. The distiller may be a batch type or a continuous type, but is preferably a continuous type. Furthermore, the distiller may be filled with a filler. Although the form of the filler is not particularly limited, it is preferable that at least a part of the liquid contact portion of the distiller consists of the anticorrosive material which will be described later. It is preferable that 90% or more of the area of the liquid contact portion consists of the anticorrosive material. It is more preferable that 99% of the area of the liquid contact portion consists of the anticorrosive material.

In FIG. 12, the purification device 1200 has a filtering device of an embodiment (for example, the first embodiment of the filtering device) in which the filter BU and the filter A are arranged in series in this order between the inlet portion and the outlet portion. However, instead of this, the purification device may have a filtering device of an embodiment (for example, the second embodiment) in which the filter A and the filter BD are arranged in series in this order between the inlet portion and the outlet portion, and a filtering device of an embodiment (for example, a modification example of the second embodiment) in which the filter BU, the filter A, and the filter BD are arranged in series in this order between the inlet portion and the outlet portion.

Furthermore, in the purification device, on the flow path S12 formed of the second inlet portion 1201, the distiller 1203, the second outlet portion 1202, the inlet portion 101, the filter 104, the piping 105, the filter 103, and the outlet portion 102, a return flow path may be formed which is capable of returning the liquid to be purified to the upstream of the filter 103 (filter A) on the flow path S12 from the downstream side of the filter 103 (filter A). The form of the return flow path is not particularly limited, but is the same as that described in the fifth embodiment of the filtering device. In addition, the form of the return flow path may be the same as that described in the sixth embodiment of the filtering device.

Furthermore, the purification device according to the present embodiment may have a tank on the upstream side and/or the downstream side of the filter 103 on the flow path S12. The form of the tank is not particularly limited, and the same tank as that described above can be used.

Second Embodiment of Purification Device

Figure 13:
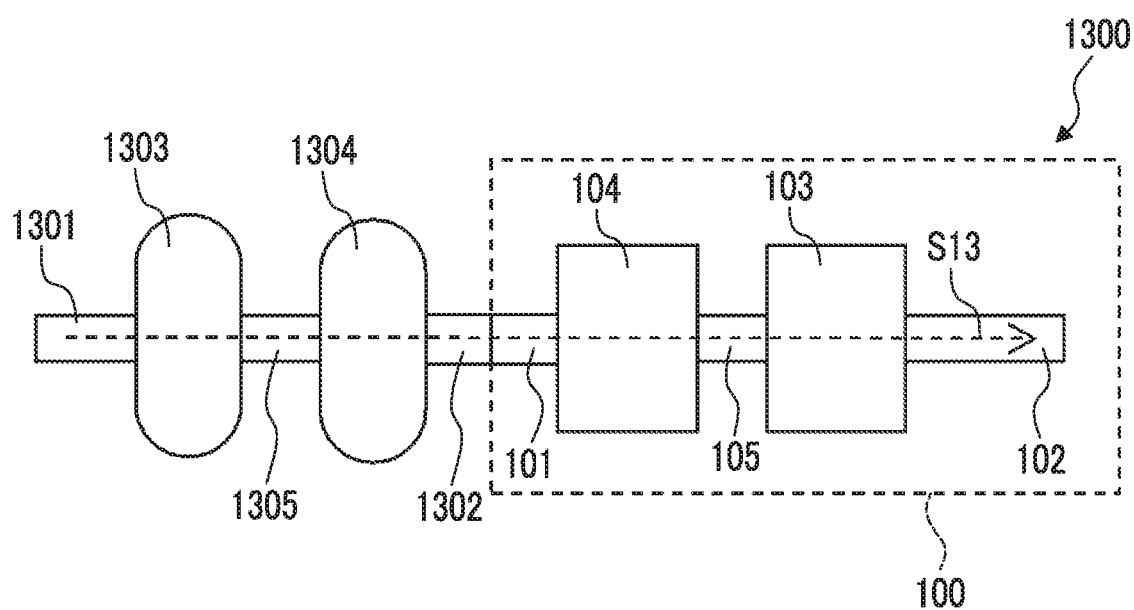
FIG. 13 is a schematic view illustrating a purification device according to the second embodiment of the present invention.

FIG. 13 is a schematic view illustrating a second embodiment of the purification device. A purification device 1300 has a second inlet portion 1301, a second outlet portion 1302, and a distiller 1303 and a distiller 1304 arranged in series between the second inlet portion 1301 and the second outlet portion 1302, in which the second outlet portion 1302 is connected to an inlet portion 101 of the filtering device. Therefore, in the purification device 1300, by the second inlet portion 1301, the distiller 1303, a piping 1305, the distiller 1304, the second outlet portion 1302, the inlet portion 101, the filter 104 (filter BU), the piping 105, the filter 103 (filter A), and the outlet portion 102, a flow path S13 is formed.

That is, the purification device according to the present embodiment includes a plurality of distillers connected in series. In a case where the purification device includes three or more distillers connected in series, the last distiller is connected to the filtering device.

In the purification device 1300, the liquid to be purified flowing from the second inlet portion 1301 is distilled by the distiller 1303, flows through the piping 1305, and is introduced into the distiller 1304. FIG. 13 shows an embodiment in which the distiller 1303 and the distiller 1304 are connected to each other through the piping 1305. However, the purification device according to the present embodiment is not limited thereto, and may additionally have a piping capable of returning the condensate of the distiller 1304 to the distiller 1303.

The purification device according to the present embodiment has two distillers. Therefore, in a case where the operating conditions of the two distillers and the like are appropriately controlled, even though the liquid to be purified contains two or more kinds of compounds having different boiling points, the target compound (chemical liquid) can be purified to higher purity.

[Anticorrosive Material]

Next, an anticorrosive material will be described. In the filtering device and the purification device according to the embodiment of the present invention described so far, it is preferable that at least a portion of the liquid contact portion of the devices is formed of an anticorrosive material. It is preferable that 90% or more of the liquid contact portion is formed of an anticorrosive material. It is more preferable that 99% or more of the liquid contact portion is formed of an anticorrosive material.

The state where the liquid contact portion is formed of an anticorrosive material is not particularly limited. Typically, for example, each member (for example, the tank described so far or the like) is formed of an anticorrosive material, or each member has a base material and a coating layer which is disposed on the base material and formed of an anticorrosive material.

The anticorrosive material is a nonmetallic material or an electropolished metallic material. Examples of the nonmetallic material include, but are not particularly limited to, a polyethylene resin, a polypropylene resin, a polyethylene-polypropylene resin, a tetrafluoroethylene resin, a tetrafluoroethylene-perfluoroalkyl vinyl ether copolymer resin, a tetrafluoroethylene-hexafluoropropylene copolymer resin, a tetrafluoroethylene-ethylene copolymer resin, a chlorotrifluoro ethylene-ethylene copolymer resin, a vinylidene fluoride resin, a chlorotrifluoroethylene copolymer resin, a vinyl fluoride resin, and the like.

The metallic material is not particularly limited, and examples thereof include a metallic material in which the total content of Cr and Ni is greater than 25% by mass with respect to the total mass of the metallic material. The total content of Cr and Ni is particularly preferably equal to or greater than 30% by mass. The upper limit of the total content of Cr and Ni in the metallic material is not particularly limited, but is preferably equal to or smaller than 90% by mass in general.

Examples of the metallic material include stainless steel, a Ni—Cr alloy, and the like.

As the stainless steel, known stainless steel can be used without particular limitation. Particularly, an alloy with a nickel content equal to or greater than 8% by mass is preferable, and austenite-based stainless steel with a nickel content equal to or greater than 8% by mass is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

As the Ni—Cr alloy, known Ni—Cr alloys can be used without particular limitation. Particularly, a Ni—Cr alloy with a Ni content of 40% to 75% by mass and a Cr content of 1% to 30% by mass is preferable.

Examples of the Ni—Cr alloy include HASTELLOY (trade name, the same will be applied hereinafter), MONEL (trade name, the same will be applied hereinafter), INCONEL (trade name, the same will be applied hereinafter), and the like. More specifically, examples thereof include HASTELLOY C-276 (Ni content: 63% by mass, Cr content: 16% by mass), HASTELLOY C (Ni content: 60% by mass, Cr content: 17% by mass), HASTELLOY C-22 (Ni content: 61% by mass, Cr content: 22% by mass), and the like.

Furthermore, optionally, the Ni—Cr alloy may further contain B, Si, W, Mo, Cu, Co, and the like in addition to the aforementioned alloy.

As the method for electropolishing the metallic material, known methods can be used without particular limitation. For example, it is possible to use the methods described in paragraphs "0011" to "0014" in JP2015-227501A, paragraphs "0036" to "0042" in JP2008-264929A, and the like.

Presumably, in a case where the metallic material is electropolished, the Cr content in a passive layer on the surface thereof may become higher than the Cr content in the parent phase. Therefore, presumably, in a case where a purification device having a liquid contact portion formed of the electropolished metallic material is used, metal impurities containing metal atoms may be hardly eluted into the liquid to be purified.

The metallic material may have undergone buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material. The buffing is preferably performed before the electropolishing.

[Method for Manufacturing Chemical Liquid (Second Embodiment)]

The method for manufacturing a chemical liquid according to a second embodiment of the present invention is a chemical liquid manufacturing method for obtaining a chemical liquid by purifying a liquid to be purified, the method having a step of filtering a liquid to be purified by using a filter A having a porous base material made of polyfluorocarbon and a coating layer which is disposed to cover the base material and contains a first resin having a hydrophilic group and a filter B different from the filter A so as to obtain a chemical liquid.

Hereinafter, the method for manufacturing a chemical liquid according to the second embodiment will be described. In the following section, the materials, methods, conditions, and the like which are not described are the same as those in the method for manufacturing a chemical liquid according to the first embodiment.

In the method for manufacturing a chemical liquid according to the present embodiment, the liquid to be purified is filtered using the filter A and the filter B different from the filter A. In a case where the liquid to be purified is filtered, the liquid may be passed through the filter A and the filter B in this order, or may be passed through the filter B and the filter A in this order.

The method for manufacturing a chemical liquid according to the present embodiment is not particularly limited as long as the filter A and the filter B are used. In this method, the liquid to be purified may be filtered by sequentially using a plurality of filters A and/or a plurality of filters B.

In a case where the filter B and the filter A are used in this order, the form of the filter B is not particularly limited, but it is preferable to use the filter described above as the filter BU. In a case where filter A and the filter B are used in this order, the form of the filter B is not particularly limited, but it is preferable to use the filter described above as the filter BD.

[Chemical Liquid]

It is preferable that the chemical liquid manufactured using the aforementioned filtering device is used for manufacturing a semiconductor substrate. Particularly, it is more preferable to use the chemical liquid for forming a fine pattern at a node equal to or smaller than 10 nm (for example, a step including pattern formation using extreme ultraviolet).

In other words, the filtering device is preferably used for manufacturing a chemical liquid for manufacturing a semiconductor substrate. Specifically, the filtering device is preferably used for manufacturing a chemical liquid used for treating an inorganic substance and/or an organic substance after each step is finished or before the next step is started in a semiconductor device manufacturing process including a lithography step, an etching step, an ion implantation step, a peeling step, and the like.

Specifically, the filtering device is preferably used for manufacturing at least one kind of chemical liquid (chemical liquid obtained by purifying an organic liquid to be purified) selected from the group consisting of a developer, a rinsing solution, a wafer washing solution, a line washing solution, a prewet solution, a wafer rinsing solution, a resist solution, a solution for forming an underlayer film, a solution for forming an overlayer film, and a solution for forming a hardcoat. In another embodiment, the filtering device is preferably used for manufacturing at least one kind of chemical liquid (chemical liquid obtained by purifying an aqueous liquid to be purified) selected from the group consisting of an aqueous developer, an aqueous rinsing solution, a peeling solution, a remover, an etching solution, an acidic washing solution, phosphoric acid, and a phosphoric acid-aqueous hydrogen peroxide mixture (Phosphoric acid-Hydrogen Peroxide Mixture (PPM)).

In addition, the aforementioned filtering device can also be used for manufacturing a chemical liquid used for rinsing the edge line of a semiconductor substrate before and after the coating with resist.

Furthermore, the aforementioned filtering device can also be used for manufacturing a diluted solution of a resin contained in a resist solution and for manufacturing a solvent contained in a resist solution.

In addition, the aforementioned filtering device can be used for manufacturing a chemical liquid used for purposes other than the manufacturing of a semiconductor substrate. The filtering device can also be used for manufacturing a developer for polyimide, a resist for sensor, and a resist for lens, a rinsing solution, and the like.

Moreover, the filtering device can be used for manufacturing a solvent for medical uses or for washing. Particularly, the filtering device can be used for manufacturing a chemical liquid used for washing containers, piping, base substrates (for example, a wafer and glass), and the like.

Especially, the filtering device is preferably used for manufacturing at least one kind of chemical liquid selected from the group consisting of a prewet solution, a developer, and a rinsing solution for forming a pattern by using extreme ultraviolet (EUV).

[Chemical Liquid Storage Body]

The chemical liquid manufactured by the filtering device may be stored in a container and preserved until the chemical liquid is used. The container and the chemical liquid stored in the container are collectively referred to as chemical liquid storage body. The preserved chemical liquid is used after being taken out of the chemical liquid storage body.

As a container for preserving the chemical liquid, it is preferable to use a container for semiconductor substrate manufacturing, which has a high internal cleanliness and hardly causes the eluate of impurities into the chemical liquid during the preservation of the chemical liquid.

Examples of usable containers include, but are not limited to, a "CLEAN BOTTLE" series manufactured by AICELLO CORPORATION, "PURE BOTTLE" manufactured by KODAMA PLASTICS Co., Ltd., and the like.

As the container, for the purpose of preventing mixing of impurities into the chemical liquid (contamination), it is also preferable to use a multilayer bottle in which the inner wall of the container has a 6-layer structure formed of 6 kinds of resins or a multilayer bottle having a 7-layer structure formed of 6 kinds of resins. Examples of these containers include the containers described in JP2015-123351A.

It is preferable that at least a portion of the liquid contact portion of the container consists of the anticorrosive material described above. In view of obtaining further improved effects of the present invention, it is preferable that 90% or more of the area of the liquid contact portion consists of the material described above.

EXAMPLES

Hereinafter, the present invention will be more specifically described based on examples. The materials, the amount and proportion thereof used, the details of treatments, the procedure of treatments, and the like shown in the following examples can be appropriately modified as long as the gist of the present invention is maintained. Accordingly, the scope of the present invention is not limited to the following examples.

For preparing chemical liquids of examples and comparative examples, the handling of containers, the preparation of chemical liquids, filling, preservation, and analytical measurement were all performed in a clean room of a level satisfying ISO class 2 or 1. In order to improve the measurement accuracy, in the process of measuring the content of the organic impurities and the content of metal atoms, in a case where the content of the organic impurities or metal atoms was found to be equal to or smaller than a detection limit by general measurement, the chemical liquid was concentrated by 1/100 in terms of volume for performing the measurement, and the content was calculated by converting the concentration into the concentration of the chemical liquid not yet being concentrated. The tools such as a device or a filter used for purification and a container were used after the surface contacting the chemical liquid was thoroughly washed with a chemical liquid purified in advance by the same method.

[Test Example 1: Purification of Organic Solvent-Based Liquid to be Purified and Performance Evaluation of Chemical Liquid]
[Manufacturing of Chemical Liquid 1]

Figure 14:
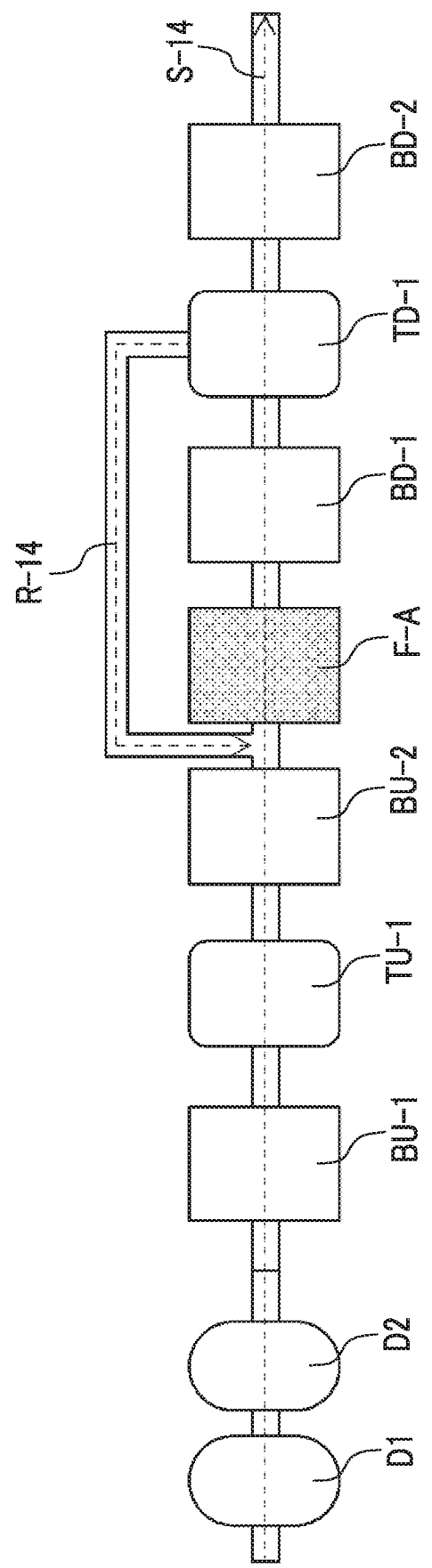
FIG. 14 is a schematic view illustrating a purification device according to an embodiment of the present invention.

A chemical liquid 1 was manufactured using the purification device shown in FIG. 14. The purification device in FIG. 14 has, between an inlet portion and an outlet portion, a filtering device including a filter BU-1, a tank TU-1, a filter BU-2, a filter F-A, a filter BD-1, a tank T-2, and a filter BD-2 that are connected in series and a distiller connected to the front portion of the filtering device (duplex distiller consisting of D1 and D2, described as "duplex" in Table 1). Each of the units forms a flow path S-14 together with the piping. In the flow path S-14, a return flow path R-14 is formed which is capable of returning the liquid to be purified to the upstream side of the filter F-A from the downstream side (tank T-2) of the filter F-A in the flow path S-14 (the filter F-A corresponds to the filter A described above).

Table 1 shows the material components contained in the filters used for manufacturing the chemical liquid 1 and the pore size of the filters. The filters were used after being immersed in PGMEA for one day.

Abbreviations for the material components of each filter in Table 1 are as follows.

PTFE-1

A coating layer of poly(M8-b-NPF6) was formed on the surface of a PTFE porous membrane having a pore size of 20 nm, with reference to the description in paragraphs "0124" and "0125" of JP2016-194038A. The pore size was adjusted by the amount of the poly(M8-b-NPF6) used for coating. The pore size was measured by the method described above.

The resin forming the coating layer of PTFE-1 has a polyoxyalkylene group as a hydrophilic group.

PTFE-2

Poly(M8-b-NPF6)-S(CH$_2$)SO$_3$Na described in paragraph "0023" of JP2016-194038A was synthesized. Specifically, the above copolymer was synthesized with reference to the description in paragraphs "0103" to "0109" of JP2016-194038A. By using the synthesized copolymer, a porous PTFE membrane having a coating layer was manufactured by the same method as that used for PTFE-1.

The resin forming the coating layer of PTFE-2 has a polyoxyalkylene group and a sulfonic acid (salt) group as hydrophilic groups.

PTFE-3

Poly(M8-b-NPF6)-S—CH$_2$COOH described in paragraph "0023" of JP2016-194038A was synthesized. Specifically, the above copolymer was synthesized with reference to the description in paragraphs "0103" to "0109" of JP2016-194038A. By using the synthesized copolymer, a porous PTFE membrane having a coating layer was manufactured by the same method as that used for PTFE-1.

The resin forming the coating layer of PTFE-3 has a polyoxyalkylene group and a carboxylic acid (salt) group as hydrophilic groups.

PTFE-4

Poly(NTEG-b-NPF6)/thioglycerol described in paragraph "0014" of JP2016-199733A was synthesized. Specifically, the above copolymer was synthesized with reference to the description in paragraphs "0106" to "0108" of JP2016-199733A. By using the synthesized copolymer, a porous PTFE membrane having a coating layer was manufactured by the same method as that used for PTFE-1.

The resin forming the coating layer of PTFE-4 has a polyoxyalkylene group and a group having a thioether group and a hydroxyl group as hydrophilic groups.

PP: polypropylene

IEX: a filter obtained by introducing an ion exchange group consisting of a sulfonic acid group into a base material made of polyethylene.

Nylon: nylon

UPE: ultra-high-molecular-weight polyethylene

PTFE: polytetrafluoroethylene

Abbreviations relating to the liquid to be purified in Table 1 are as follows.

CHN: cyclohexanone

PGMEA/PGME (7:3): a mixture of PGMEA and PGME at a ratio of 7:3 (based on volume)

butyl acetate

PC/PGMEA (1:9): a mixture of PC and PGMEA at a ratio of 1:9 (based on volume)

EL: ethyl lactate

MIBC: 4-methyl-2-pentanol

PGME: propylene glycol monoethyl ether

PGMEA: propylene glycol monomethyl ether acetate

PC: propylene carbonate iAA: isoamyl acetate

IPA: isopropanol

A commercial high-purity grade "cyclohexanone" was purchased as the liquid to be purified, and purified using the purification device described above. During the purification, by using the return flow path R-14, circulation filtration was performed three times through each return flow path, thereby obtaining the chemical liquid 1.

[Manufacturing of Chemical Liquids 2 to 64]

Each of the liquids to be purified described in Table 1 was purified using a purification device (or a filtering device) described in Table 1, thereby obtaining chemical liquids. The purification devices (or filtering devices) are shown in FIGS. 14 to 30. The material components contained in the filter F-A, the filters BU-1 to BU-4, and the filters BD-1 and BD-2, and the pore sizes of the filters are as shown in Table 1. During the purification of the liquid to be purified, a liquid that was filtered using a filtering device, in which a return flow path represented by R-(number) was formed, and described as "performed" in the column of "Circulation" in Table 1 was subjected to circulation filtration three times through each return flow path.

In addition, the SP value of each of the liquids to be purified is also described in Table 1. In the table, "-" means that the filter was not used. The same is true of other tables in the present specification.

In the column of "Pre-washing of filter" in Table 1, the conditions of pre-washing for each filter are described. "PGMEA 1 day immersion" means that the filter was used after being immersed for 1 day in high-purity grade PGMEA. In addition, "-" in the same column shows that the filter was not pre-washed.

[Evaluation 1: Evaluation of Residue Defect Inhibition Performance and Stain-Like Defect Inhibition Performance of Chemical Liquid]

A silicon wafer (Bare-Si) having a diameter of about 300 mm was coated with the chemical liquid 1, thereby obtaining a wafer coated with a chemical liquid. The used device was Lithius ProZ, and the coating conditions were as follows.

Amount of chemical liquid used for coating: 2 ml

Rotation speed of silicon wafer during coating: 2,200 rpm, 60 sec

Then, by using a wafer inspection device "SP-5" manufactured by KLA-Tencor Corporation. and a fully automatic defect review/classification device "SEMVision G6" manufactured by Applied Materials, Inc, the number of defects having a size equal to or greater than 19 nm existing on the entire surface of the wafer and the composition of the defects were investigated.

The total number of defects measured using SP-5 was counted as the number of residue defects, and the shape of the defects was observed using G6. The (stain-like) defects that were not in the form of particles were counted as stain-like defects. The results were evaluated based on the following standard. The evaluation results are shown in Table 1.

The smaller the number of defects present on the wafer, the better the defect inhibition performance of the chemical liquid. In the following evaluation, "number of defects" means the total number of residue defects and stain-like defects. The chemical liquids 2 to 64 were evaluated by the same method as the above method. The results are shown in Table 1.

AA The number of defects was equal to or smaller than 30/wafer.

A The number of defects was greater than 30/wafer and equal to or smaller than 50/wafer.

B The number of defects was greater than 50/wafer and equal to or smaller than 100/wafer.

C The number of defects was greater than 100/wafer and equal to or smaller than 200/wafer.

D The number of defects was greater than 200/wafer and equal to or smaller than 500/wafer.

E The number of defects was greater than 500/wafer.

[Evaluation 2: Bridge Defect Inhibition Performance]

By using the chemical liquid 1 as a prewet solution, the bridge defect inhibition performance of the chemical liquid was evaluated. First, a resist resin composition 1 used will be described.

Resist Resin Composition 1

The resist resin composition 1 was obtained by mixing together the following components.

Acid-decomposable resin (resin represented by the following formula (weight-average molecular weight (Mw) 7500): the numerical value described in each repeating unit means mol %): 100 parts by mass

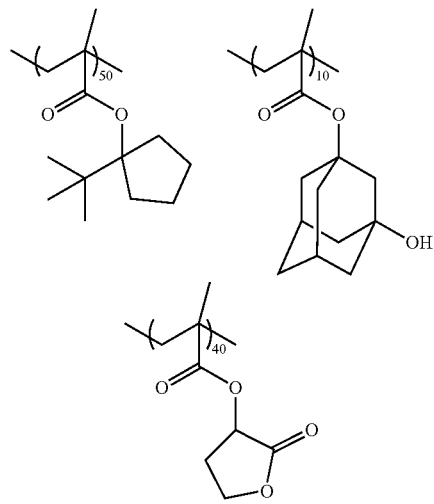

The following photoacid generator: 8 parts by mass

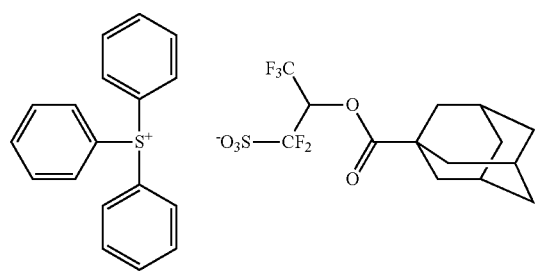

The following quencher: 5 parts by mass (the mass ratio was 0.1:0.3:0.3:0.2 in this order from the left). Among the following quenchers, a polymer-type quencher has a weight-average molecular weight (Mw) of 5,000. The numerical value described in each repeating unit means molar ratio.

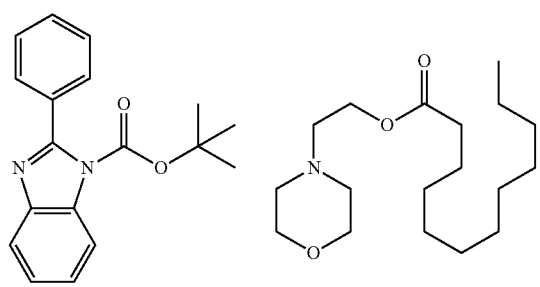

-continued

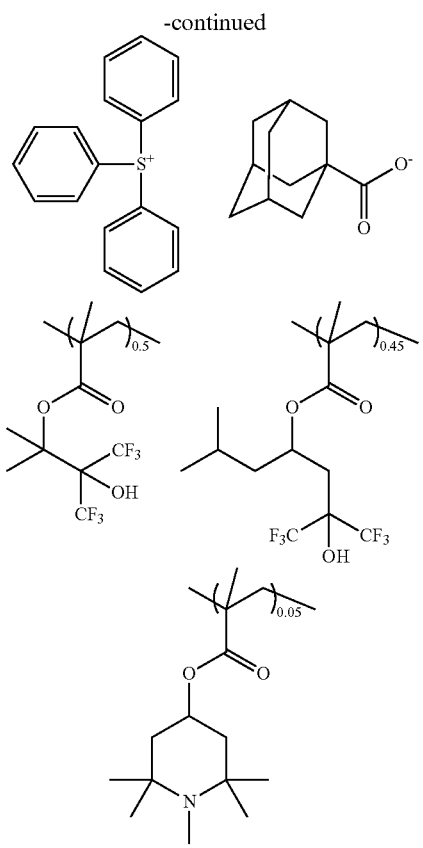

Hydrophobic resins shown below: 4 parts by mass (mass ratio: (1):(2)=0.5:0.5) Among the following hydrophobic resins, the hydrophobic resin represented by Formula (1) has a weight-average molecular weight (Mw) of 7,000, and the hydrophobic resin represented by Formula (2) has a weight-average molecular weight (Mw) of 8,000. In each of the hydrophobic resins, the numerical value described in each repeating unit means molar ratio.

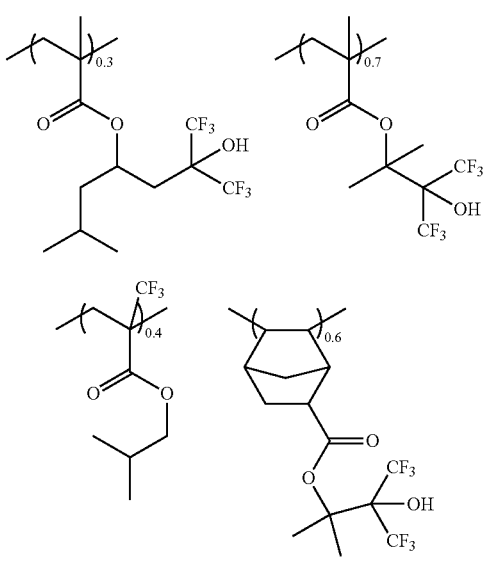

Solvent:
PGMEA (propylene glycol monomethyl ether acetate): 3 parts by mass
Cyclohexanone: 600 parts by mass
γ-BL (γ-butyrolactone): 100 parts by mass
Test Method Next, the test method will be described. First, a silicon wafer having a diameter of about 300 mm was pre-wet with the chemical liquid 1, and then the pre-wet silicon wafer was spin-coated with the resist resin composition described above. Thereafter, the wafer was heated and dried at 150° C. for 90 seconds on a hot plate, thereby forming a resist film having a thickness of 9 μm.

For the resist film, in order that a pattern having a line width of 30 nm and a space width of 30 nm was formed after reduction projection exposure and development, by using an ArF excimer laser scanner (manufactured by ASML, PAS5500/850C, wavelength: 248 nm), pattern exposure was performed under the exposure conditions of NA=0.60 and σ=0.75 through a mask having a line-and-space pattern. After being irradiated, the resist film was baked for 60 seconds at 120° C. Subsequently, the resist film was developed, rinsed, and then baked for 60 seconds at 110° C., thereby forming a resist pattern having a line width of 30 nm and a space width of 30 nm.

By using a critical dimension SEM (CG4600, manufactured by Hitachi High-Technologies Corporation), 100 shots of the resist pattern were captured. The number of defects in the form of a crosslink between patterns (bridge defects) was counted, and the number of defects per unit area was determined. The results were evaluated based on the following standard. The evaluation results are shown in Table 1. Note that the smaller the number of defects in the form of a crosslink between patterns, the better the bridge defect inhibition performance of the chemical liquid.

For the chemical liquids 2 to 64, those described as "Pre-wetting" in the column of "Evaluation method" in Table 1 were evaluated in terms of the bridge defect inhibition performance by the same method as that used for the chemical liquid 1. The chemical liquids described as "Developer" in the column of "Evaluation method" in Table 1 were evaluated in terms of the bridge defect inhibition performance according to the same procedure as that used for evaluating the chemical liquid 1, except that the chemical liquids were not subjected to pre-wetting described in the procedure for evaluating the chemical liquid 1, and the chemical liquids described in Table 1 were used as a developer. The chemical liquids described as "Rinsing" in the column of "Evaluation method" in Table 1 were evaluated in terms of the bridge defect inhibition performance according to the same procedure as that used for evaluating the chemical liquid 1, except that the chemical liquids were not subjected to pre-wetting described in the procedure for evaluating the chemical liquid 1, and the chemical liquids described in Table 1 were used as a rinsing solution. The results are shown in Table 1.

AA The number of bridge defects was less than $1/cm^2$.
A The number of bridge defects was equal to or greater than $1/cm^2$ and less than $2/cm^2$.
B The number of bridge defects was equal to or greater than $2/cm^2$ and less than $5/cm^2$.
C The number of bridge defects was equal to or greater than $5/cm^2$ and less than $10/cm^2$.
D The number of bridge defects was equal to or greater than $10/cm^2$ and less than $15/cm^2$.
E The number of bridge defects was equal to or greater than $15/cm^2$.

[Evaluation 3: Uniformity of Pattern Width]

By using a critical dimension SEM (CG4600, manufactured by Hitachi High-Technologies Corporation), 100 shots of the resist pattern were captured, and a difference between an average Line Width Roughness (LWR) and a maximum (or minimum) line width was determined. The results were evaluated based on the following standard. The evaluation results are shown in Table 1. Note that the smaller the difference, the better the uniformity of the pattern width formed using the chemical liquid. "Difference between the average LWR and the maximum (or minimum) line width" means that between the difference between the average LWR and the maximum line width and the difference between the average LWR and the minimum line width, the larger one in terms of absolute value was adopted.

AA The difference between the average line width and the maximum (minimum) line width was less than ±2% with respect to the average.

A The difference between the average line width and the maximum (minimum) line width was less than ±5% with respect to the average.

B The difference between the average line width and the maximum (minimum) line width was less than ±10% with respect to the average.

C The difference between the average line width and the maximum (minimum) line width was less than ±20% with respect to the average.

D The difference between the average line width and the maximum (minimum) line width was equal to or greater than ±20% with respect to the average.

E The line width could not be measured in some of the shots.

[Evaluation 4: Evaluation of Pot Life of Filter]

Figure 24:
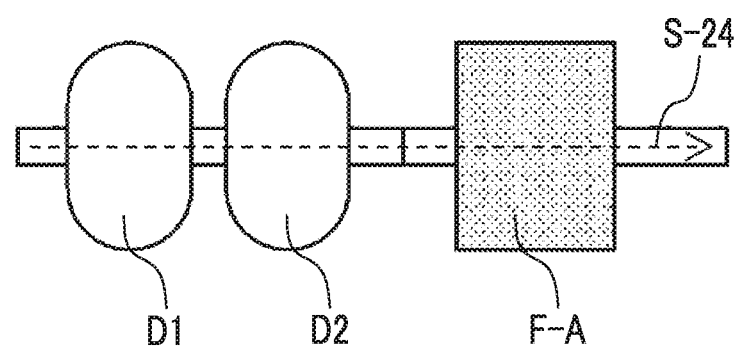
FIG. 24 is a schematic view illustrating a purification device according to a conventional technique.

The liquid to be purified was continuously purified using each of the purification devices (or filtering devices) described in Table 1. After the liquid to be purified was passed and the purification device (or filtering device) was stabilized, the obtained chemical liquid was immediately collected for test (initial sample). Then, whenever the amount of the liquid passing through the device became 10,000 kg, a chemical liquid obtained after purification was collected for test (temporal sample). The chemical liquid collected for test was evaluated by the method for evaluating the residue defect inhibition performance of a chemical liquid described in "Evaluation 1", and the number of defects per unit area was compared with that of the initial sample. The amount of the chemical liquid passing the device that was determined at a point in time when the number of defects in the temporal sample doubled was adopted as "pot life" of the filter. The pot life determined in a case where the filtering device described in FIG. 24 was used was regarded as 1, and the pot life of the filter of each device was evaluated based on a ratio to 1. The results were evaluated based on the following standard. The evaluation results are shown in Table 1. The evaluation result obtained using the device in FIG. 24 is described as "Standard".

AA The pot life was equal to or longer than 10.

A The pot life was equal to or longer than 5 and less than 10.

B The pot life was equal to or longer than 2 and less than 5.

C The pot life was longer than 1 and less than 2.

D The pot life was equal to or shorter than 1.

Test Example 2: Purification of Aqueous Liquid to be Purified and Evaluation of Performance of Chemical Liquid

[Manufacturing of Chemical Liquid 101 and Chemical Liquid 102]

Sulfuric acid-Hydrogen Peroxide Mixture (SPM) and an aqueous phosphoric acid solution (phosphoric acid content: 85% by mass) were purchased and prepared as a liquid to be purified.

Figure 20:
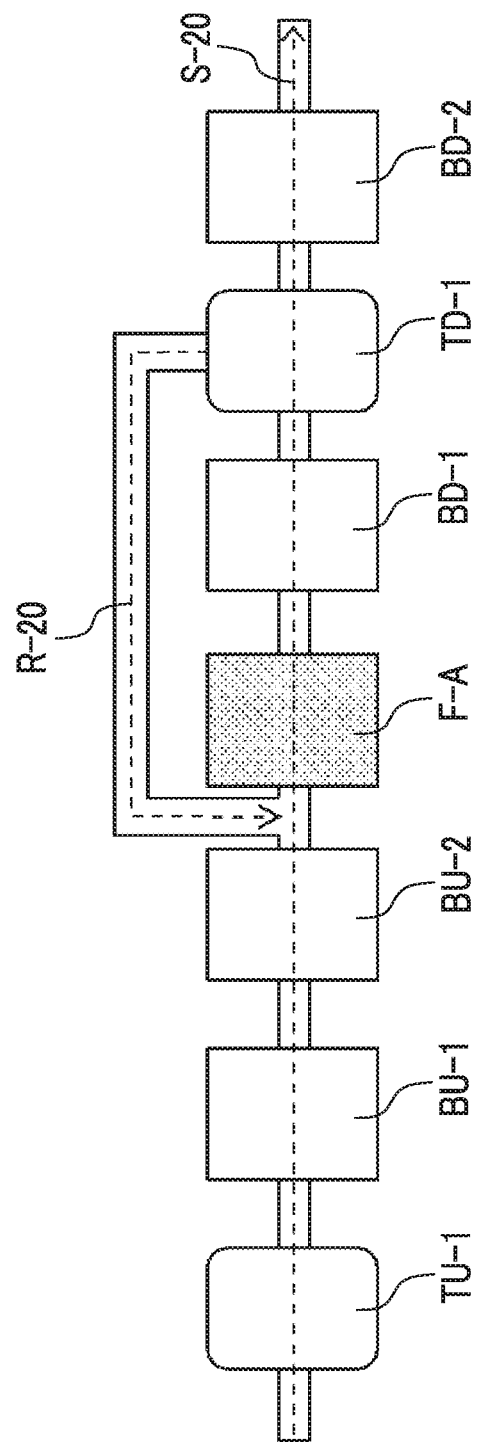
FIG. 20 is a schematic view illustrating a filtering device according to an embodiment of the present invention.

Then, a chemical liquid 101 and a chemical liquid 102 were manufactured using the filtering device shown in FIG. 20. In the filtering device shown In FIG. 20, a filter BU-1, a filter BU-2, a tank TU-1, a filter F-A, a filter BD-1, a tank TD-1, and a filter BD-2 are connected in series between an inlet portion and an outlet portion so as to form a flow path S-20. Furthermore, in the filtering device shown in FIG. 20, a return flow path R-20 was formed which is capable of returning a liquid to be purified to the upstream side of the filter F-A from the downstream side of the filter BD-1, and circulation filtration of the liquid to be purified was performed three times. Table 2 shows the material components contained in each of the filters in the filtering device shown in FIG. 20 and the pore size of the filters.

The abbreviations relating to the material components of the filters in Table 2 will not be described because they are the same as those in Table 1.

[Manufacturing of Chemical Liquid 103 and Chemical Liquid 104]

Figure 25:
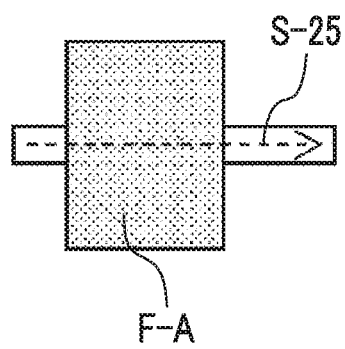
FIG. 25 is a schematic view illustrating a filtering device according to a conventional technique.

A chemical liquid 103 and a chemical liquid 104 were manufactured by the same method as that used for manufacturing the chemical liquid 101 and the chemical liquid 102, except that a filtering device (with a filter F-A and a flow path S-20) illustrated in FIG. 25 was used instead of the filtering device illustrated in FIG. 20. Table 2 shows the material components of the filter F-A and the like. During the manufacturing of the chemical liquids, circulation filtration was not performed.

[Evaluation 1: Evaluation of Defect Inhibition Performance of Chemical Liquid (Particle Defects and Stain-Like Defects)]

A bare silicon wafer having a diameter of about 300 mm was prepared, and 100 ml of each chemical liquid was jetted at a jetting frequency of 5 ml/s for 20 seconds to the wafer that was rotating under the condition of 500 rpm. Thereafter, the wafer was rotated at 2,000 rpm for 30 seconds to perform a spin dry treatment. The resulting wafer was used as a wafer for evaluation. Then, by using a wafer inspection device "SP-5" manufactured by KLA-Tencor Corporation. and a fully automatic defect review/classification device "SEMVision G6" manufactured by Applied Materials, Inc, the number of defects having a size equal to or greater than 26 nm existing on the entire surface of the wafer and the composition of the defects were investigated.

Among the measured defects, particle-like foreign substances were counted as particle defects, and others are counted as stain-like defects. The defect inhibition performance was evaluated based on the following standard. The results are shown in the columns of "particle defect inhibition performance" and "Stain-like defect inhibition performance" in Table 2. "Number of defects" means the total number of particle defects and stain-like defects.

A The number of defects was equal to or smaller than 50/wafer.

B The number of defects was greater than 50/wafer and equal to or smaller than 300/wafer.

C The number of defects was greater than 300/wafer.

[Evaluation 2: Evaluation of Pot Life of Filter]

The liquid to be purified was continuously purified using each of the filtering devices described in Table 2. After the liquid to be purified was passed and the filtering device was stabilized, the obtained chemical liquid was immediately collected for test (initial sample). Then, whenever the amount of the liquid passing through the device became 10,000 kg, a chemical liquid obtained after purification was collected for test (temporal sample). The chemical liquid collected for test was evaluated by the method for evaluating the particle defect inhibition performance of a chemical liquid described in "Evaluation 1", and the number of defects per unit area was compared with that of the initial sample. The amount of the chemical liquid passing the device that was determined at a point in time when the number of defects in the temporal sample doubled was adopted as "pot life" of the filter. The pot life obtained in a case where the filtering device (chemical liquid 103) described in FIG. 25 was used was regarded as 1, and the pot life of the filter of each device was evaluated based on a ratio to 1. The results were evaluated based on the following standard. The evaluation results are shown in Table 2. The evaluation result obtained using the device (chemical liquid 103) in FIG. 25 is described as "Standard".

A The pot life was equal to or longer than 10.

B The pot life was equal to or longer than 5 and less than 10.

C The pot life was longer than 1 and less than 5.

D The pot life was equal to or shorter than 1.

Test Example 3: Manufacturing of Chemical Liquid as Resist Resin Composition and Evaluation of Performance of Chemical Liquid

[Manufacturing of Chemical Liquid 201]

A resist resin composition 2 containing the following components was prepared as a liquid to be purified.

Resin A-2 synthesized by the following method: 0.79 g

<Resin (A-2)>

Synthesis of Resin (A-2)

A 2 L flask was filled with 600 g of cyclohexanone and then subjected to nitrogen purging for 1 hour at a flow rate of 100 mL/min. Thereafter, 0.02 mol of a polymerization initiator V-601 (manufactured by Wako Pure Chemical Industries, Ltd.) was added thereto, and the flask was heated until the internal temperature became 80° C. Subsequently, the following monomers 1 to 3 and 0.02 mol of a polymerization initiator V-601 (manufactured by Wako Pure Chemical Industries, Ltd.) were dissolved in 200 g of cyclohexanone, thereby preparing a monomer solution. The monomer solution was added dropwise for 6 hours to the flask heated to 80° C. After the dropwise addition ended, the reaction was further performed at 80° C. for 2 hours.

Monomer 1: 0.3 mol

Monomer 2: 0.6 mol

Monomer 3: 0.1 mol

Monomer 1

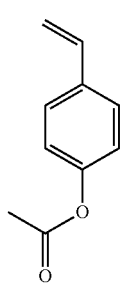

Monomer 2

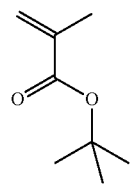

Monomer 3

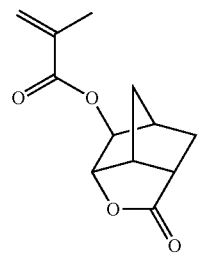

The reaction solution was cooled to room temperature and added dropwise to 3 L of hexane so as to precipitate a polymer. The filtered solids were dissolved in 500 mL of acetone, added dropwise again to 3 L of hexane, and the filtered solids were dried under reduced pressure, thereby obtaining a copolymer (A-2) of the monomers 1 to 3.

A reaction container was filled with 10 g of the polymer obtained as above, 40 mL of methanol, 200 mL of 1-methoxy-2-propanol, and 1.5 mL of concentrated hydrochloric acid, and the mixture was heated to 80° C. and stirred for 5 hours. The reaction solution was left to cool to room temperature and added dropwise to 3 L of distilled water. The filtered solids were dissolved in 200 mL of acetone, added dropwise again to 3 L of distilled water, and the filtered solids were dried under reduced pressure, thereby obtaining a resin (A-2) (8.5 g). The weight-average molecular weight (Mw) of the resin measured by gel permeation chromatography (GPC) (solvent: THF (tetrahydrofuran)) and expressed in terms of standard polystyrene was 12,300, and the molecular weight dispersity (Mw/Mn) of the resin was 1.51.

The composition (molar ratio) of the resin was calculated by $^1$H-NMR (nuclear magnetic resonance) measurement. The weight-average molecular weight (Mw: in terms of polystyrene) and the dispersity (Mw/Mn) of the resin were calculated by GPC (solvent: THF) spectroscopy.

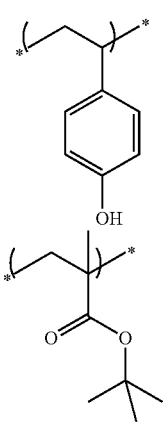

-continued

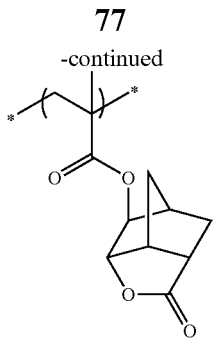

The composition of the resin A-2 was 30/60/10 (molar ratio) in this order from the constitutional unit at the very left. The resin A-2 had a weight-average molecular weight (Mw) of 12,300 and Mw/Mn of 1.51.

The following aid generator (B-2): 0.18 g

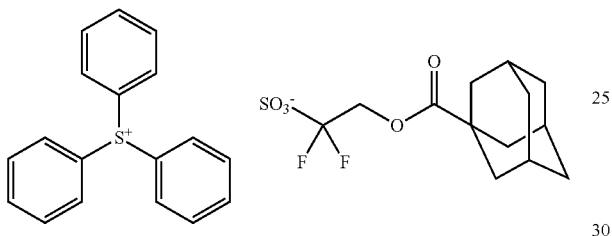

(B-2)

The following basic compound (E-1): 0.03 g

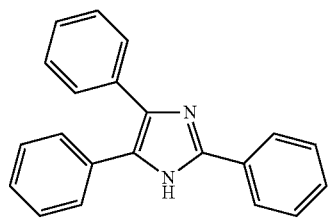

(E-1)

Figure 26:
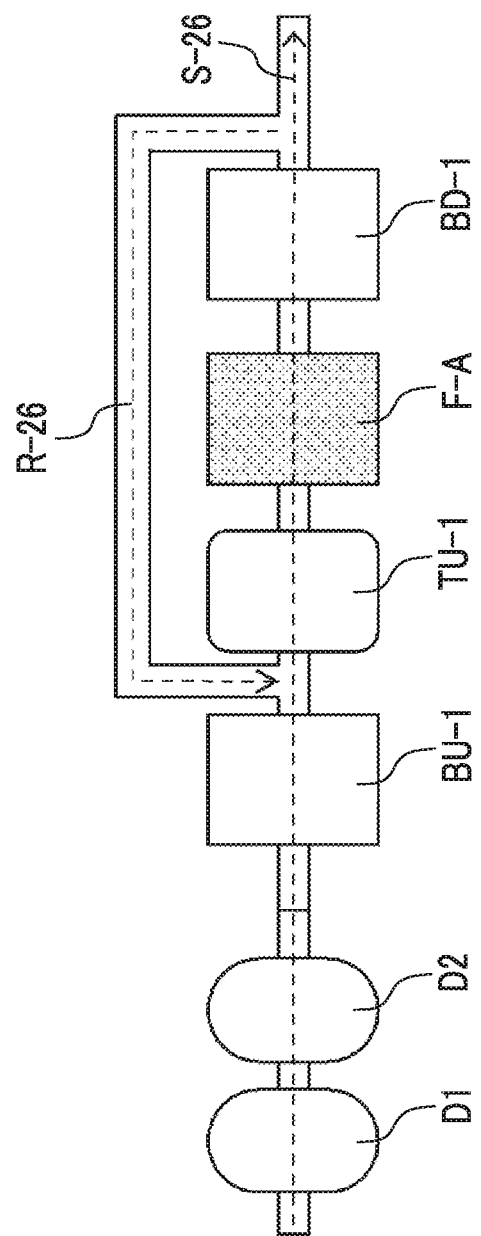
FIG. 26 is a schematic view illustrating a purification device according to an embodiment of the present invention.

Propylene glycol monomethyl ether acetate: 45 g
Propylene glycol monomethyl ether: 30 g A chemical liquid 201 was manufactured using the filtering device illustrated in FIG. 26. In the filtering device in FIG. 26, a filter BU-1, a tank TU-1, a filter F-A, and a filter BD-1 are connected in series between an inlet portion and an outlet portion. The units form a flow path S-26 together with piping. Furthermore, a return flow path R-26 is formed which is capable of returning a liquid to be purified to a position, which is on the downstream side of the filter BU-1 and on the upstream side of the tank TA-1, from the downstream side of the filter BD-1. The liquid to be purified was returned by the return flow path R-26 and then subjected to circulation filtration three times.

Table 3 shows the material components contained in the filters used for purification and the pore sizes of the filters.

[Manufacturing of Chemical Liquid 202 and Chemical Liquid 203]

A chemical liquid 202 and a chemical liquid 203 were manufactured by the same method as that used for manufacturing the chemical liquid 201, except that the filtering device described in Table 3 was used. During the manufacturing of the chemical liquid 203, circulation filtration was not performed.

[Manufacturing of Chemical Liquid 204]

A resist resin composition 3 containing the following components was prepared as a liquid to be purified.

Resin A-14 synthesized by the following method: 0.785 g

<Resin (A-14)>

Synthesis of Resin (A-14)

A resin (A-14) having the following structure was obtained by the same method as that used for synthesizing the resin (A-2), except that the used monomer was changed.

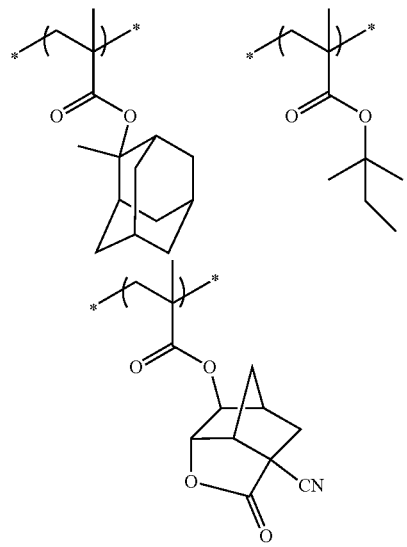

The composition of the resin A-14 was 20/40/40 (molar ratio) in this order from the constitutional unit at the very left. The resin A-14 had a weight-average molecular weight (Mw) of 11,000 and Mw/Mn of 1.45.

The following acid generator (B-9): 0.18 g

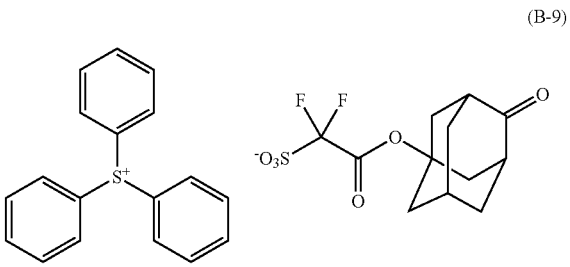

(B-9)

The following basic compound (E-2): 0.03 g

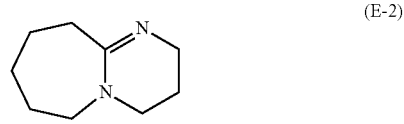 [SMILES: C1CCC2=NCCCN2CC1]

(E-2)

Propylene glycol monomethyl ether acetate: 45 g
Cyclohexanone: 30 g

The following hydrophobic resin (3b) shown below: 0.005 g (3b)

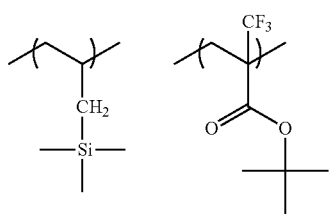

A chemical liquid 204 was manufactured using the filtering device illustrated in FIG. 26. In the filtering device in FIG. 26, a filter BU-1, a tank TU-1, a filter F-A, and a filter BD-1 are connected in series between an inlet portion and an outlet portion. The units form a flow path S-26 together with piping. Furthermore, a return flow path R-26 is formed which is capable of returning a liquid to be purified to a position, which is on the downstream side of the filter BU-1 and on the upstream side of the tank TU-1, from the downstream side of the filter BD-1. The liquid to be purified was returned by the return flow path R-26 and then subjected to circulation filtration three times.

Table 3 shows the material components contained in the filters used for purification and the pore sizes of the filters.

[Manufacturing of Chemical Liquid 205 and Chemical Liquid 206]

A chemical liquid 205 and a chemical liquid 206 were manufactured by the same method as that used for manufacturing the chemical liquid 204, except that the filtering device described in Table 3 was used. During the manufacturing of the chemical liquid 206, circulation filtration was not performed.

[Manufacturing of Chemical Liquid 207]

A resist resin composition 4 containing the following components was prepared as a liquid to be purified.

Resin (A-1)-3 Synthesized by the Following Method: 97% by Mass

<Resin (A-1)-3>

The resin (A-1)-3 was synthesized with reference to the description in paragraphs "0131" to "0134" of JP2009-265609A. The repeating units of the resin (A-1)-3 are represented by the following formulas, and the composition (molar ratio) thereof is 50/40/10 from the left. The resin (A-1)-3 had a weight-average molecular weight of 20,000 and a dispersity represented by Mw/Mn of 1.57.

(A-1)

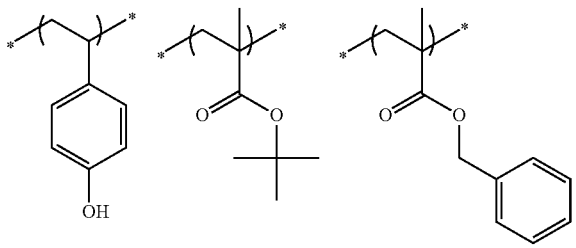

The following acid generator (B-35): 2.5% by mass (B35)

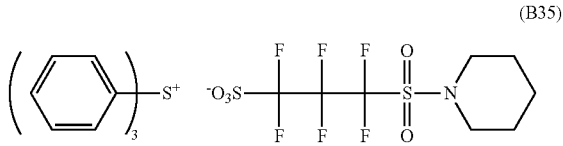

C-1 dicyclohexylmethylamine: 0.4% by mass

D-1 fluorine-based surfactant, MEGAFACE F-176 (manufactured by DIC Corporation): 0.1% by mass Here, the content of (A-1)-3 to D-1 means the content in the solid contents of the resist resin composition 4 based on mass.

Solvent

Propylene glycol monomethyl ether acetate: 80% by mass
Propylene glycol monomethyl ether: 20% by mass Here, the content of the solvent means the content of each solvent in the solvents contained in the resist resin composition 4 (content determined by regarding the total mass of the solvents as 100% by mass). The solid contents of the resist resin composition 4 were adjusted to 10% by mass.

A chemical liquid 207 was manufactured using the filtering device illustrated in FIG. 26. In the filtering device in FIG. 26, a filter BU-1, a tank TU-1, a filter F-A, and a filter BD-1 are connected in series between an inlet portion and an outlet portion. The units form a flow path S-26 together with piping. Furthermore, a return flow path R-26 is formed which is capable of returning a liquid to be purified to a position, which is on the downstream side of the filter BU-1 and on the upstream side of the tank TU-1, from the downstream side of the filter BD-1. The liquid to be purified was returned by the return flow path R-26 and then subjected to circulation filtration three times.

Table 3 shows the material components contained in the filters used for purification and the pore sizes of the filters.

[Manufacturing of Chemical Liquid 208 and Chemical Liquid 209]

A chemical liquid 208 and a chemical liquid 209 were manufactured by the same method as that used for manufacturing the chemical liquid 207, except that the filtering device described in Table 3 was used. During the manufacturing of the chemical liquid 209, circulation filtration was not performed.

[Evaluation of Defect Inhibition Performance of Chemical Liquid: Defect Inhibition Performance During EUV Exposure]

By using the chemical liquids 201 to 203, the defect inhibition performance (post-development defect inhibition performance and bridge defect inhibition performance) of the chemical liquids was evaluated by the following operation. EUV exposure refers to a pattern forming method by exposure using EUV.

A 12-inch silicon wafer was coated with each of the chemical liquids 201 to 203 and baked for 60 seconds under the condition of 120° C., thereby forming a resist film thickness of 40 nm.

(Exposure Conditions for Evaluating Post-Development Defect Inhibition Performance)

The wafer prepared as above was subjected to EUV exposure using a dipole lighting (Dipole 60×, outer sigma 0.81, inner sigma 0.43) at a lens numerical aperture (NA) of 0.25. Specifically, the entire surface of the negative resist was exposed at an exposure amount of 1 mJ/cm² without using a mask.

(Exposure Conditions for Evaluating Bridge Defect Inhibition Performance)

The wafer prepared as above was subjected to EUV exposure using Quasar lighting (Quasar 45, outer sigma 0.81, inner sigma 0.51) at a lens numerical aperture (NA) of 0.25. Specifically, through a mask including a pattern (for evaluating C/H removability) for forming a contact hole pattern with dimensions of a pitch of 60 nm and a hole size of 30 nm on a wafer and a line-and-space (LS) pattern with a line width of 22 nm and a pitch of 50 nm, the exposure amount was adjusted, and then the entire surface of the wafer was subjected to EUV expose at an exposure amount yielding a line width of 22 nm.

(Common Development Conditions)

Immediately after the exposure was performed under the above conditions, the wafer was baked for 60 seconds under the condition of 100° C.

Thereafter, by using a shower-type developing machine (ADE3000S manufactured by ActesKyosan inc.), the developer (23° C.) was sprayed and jetted to the wafer, which was rotating at 50 rpm, for 30 seconds at a flow rate of 200 mL/min so as to perform development, thereby obtaining a sample for evaluation.

(Evaluation 1: Evaluation of Bridge Defect Inhibition Performance)

The resolution of the exposed LS pattern was observed using a scanning electron microscope (CG4600, manufactured by Hitachi, Ltd.) at 200 k magnification in visual fields (n=300). The number of bridges occurring in the LS pattern in one visual field observed was evaluated and adopted as the number of bridge defects in the LS pattern. The smaller the number of bridge defects, the better the bridge defect inhibition performance of the chemical liquid. The results were evaluated according to the following standard. The evaluation results are shown in Table 3.

A: The number of defects was equal to or smaller than 10 (number/visual field).

B: The number of defects was greater than 10 (number/visual field) and equal to or smaller than 30 (number/visual field).

C: The number of defects was greater than 30 (number/visual field) and equal to or smaller than 100 (number/visual field).

D: The number of defects was greater than 100 (number/visual field) and equal to or smaller than 300 (number/visual field).

E: The number of defects was greater than 300 (number/visual field).

(Evaluation 2: Evaluation of Post-Development Defect Inhibition Performance)

For the obtained sample, by using a wafer inspection device "SP-5" manufactured by KLA-Tencor Corporation, the total number of defects having a size equal to or greater than 19 nm existing on the entire surface of the wafer was measured. The results were evaluated according to the following standard. The evaluation results are shown in Table 3.

A: The number of defects was equal to or smaller than 200/wafer.

B: The number of defects was greater than 200/wafer and equal to or smaller than 500/wafer.

C: The number of defects was greater than 500/wafer and equal to or smaller than 1,000/wafer.

D: The number of defects was greater than 1,000/wafer and equal to or smaller than 1,500/wafer.

E: The number of defects was greater than 1,500/wafer.

[Evaluation of Defect Inhibition Performance of Chemical Liquid: Defect Inhibition Performance During ArF Expose]

By using the chemical liquids 204 to 206, the defect inhibition performance (post-development defect inhibition performance and bridge defect inhibition performance) of the chemical liquids was evaluated by the following operation. The ArF exposure means a pattern forming method by exposure using an ArF excimer laser.

A 12-inch silicon wafer was coated with each of the chemical liquids 204 to 206 and baked for 60 seconds under the condition of 90° C. to 120° C., thereby forming a resist film thickness of 40 nm.

Before being coated with the resist film, the silicon wafer was coated with ARC29SR as a composition for forming an organic antireflection film (manufactured by Brewer Science Inc.) and baked for 60 seconds at 205° C. so as to form an antireflection film having a film thickness of 86 nm.

(Exposure conditions for evaluating post-development defect inhibition performance)

The wafer prepared as above was subjected to ArF exposure using an ArF excimer laser immersion scanner (XT1700i manufactured by ASML, NA1.20, Dipole, outer sigma 0.900, inner sigma 0.700, Y polarization). Specifically, the entire surface of the negative resist was exposed at an exposure amount of 1 $mJ/cm^2$ without using a mask.

(Exposure conditions for evaluating bridge defect inhibition performance)

The obtained wafer was subjected to pattern exposure using an ArF excimer laser immersion scanner (XT1700i manufactured by ASML, NA1.20, Dipole, outer sigma 0.900, inner sigma 0.700, Y polarization). As a reticle, a 6% halftone mask having a line size=50 nm and a line:space=1:1 was used. Ultrapure water was used as an immersion solution.

The conditions were adjusted so as to obtain a line-and-space pattern having a pitch of 100 nm, a space width of 35 nm, and a line width of 65 nm.

(Common Development Conditions)

Thereafter, the wafer was baked (Post Exposure Bake; PEB) at 100° C. and then subjected to puddle development in a developer for 30 seconds, thereby creating a wafer in which a pattern was formed. In a case where a rinsing treatment was performed, the wafer was developed by puddling for 30 seconds in a developer, then rinsed by puddling in a rinsing solution before being dried, and then rotated for 30 seconds at a rotation speed of 4,000 rpm. In this way, a sample for evaluation was obtained.

(Evaluation 1: Evaluation of Bridge Defect Inhibition Performance)

The resolution of the exposed LS pattern was observed using a scanning electron microscope (CG4600, manufactured by Hitachi, Ltd.) at 200 k magnification in visual fields (n=300). The number of bridges occurring in the LS pattern in one visual field observed was evaluated and adopted as the number of bridge defects in the LS pattern. The smaller the number of bridge defects, the better the bridge defect inhibition performance of the chemical liquid. The results were evaluated according to the following standard. The evaluation results are shown in Table 3.

A: The number of defects was equal to or smaller than 10 (number/visual field).

B: The number of defects was greater than 10 (number/visual field) and equal to or smaller than 30 (number/visual field).

C: The number of defects was greater than 30 (number/visual field) and equal to or smaller than 100 (number/visual field).

D: The number of defects was greater than 100 (number/visual field) and equal to or smaller than 300 (number/visual field).

E: The number of defects was greater than 300 (number/visual field).

(Evaluation 2: Evaluation of Post-Development Defect Inhibition Performance)

For the obtained sample, by using a wafer inspection device "SP-5" manufactured by KLA-Tencor Corporation, the total number of defects having a size equal to or greater than 19 nm existing on the entire surface of the wafer was measured. The results were evaluated according to the following standard. The evaluation results are shown in Table 3.

A: The number of defects was equal to or smaller than 200/wafer.

B: The number of defects was greater than 200/wafer and equal to or smaller than 500/wafer.

C: The number of defects was greater than 500/wafer and equal to or smaller than 1,000/wafer.

D: The number of defects was greater than 1,000/wafer and equal to or smaller than 1,500/wafer.

E: The number of defects was greater than 1,500/wafer.

[Evaluation of Defect Inhibition Performance of Chemical Liquid: Defect Inhibition Performance During KRF Expose]

By using the chemical liquids 207 to 209, the defect inhibition performance (post-development defect inhibition performance and bridge defect inhibition performance) of the chemical liquids was evaluated by the following operation. KrF means a pattern forming method by exposure using a KrF excimer laser.

The silicon wafer was treated with hexamethyldisilazane (HMDS) (110° C. for 35 seconds), and by using the chemical liquids 207 to 209, a resist film having a thickness of 100 nm was formed on the wafer. Before the coating with the chemical liquids, an oxide film having a thickness of 100 nm was formed on the silicon wafer.

(Exposure Conditions for Evaluating Post-Development Defect Inhibition Performance)

By using a KrF excimer laser scanner (PAS5500/850 manufactured by ASML) (NA 0.80), KrF expose was performed on the wafer prepared as above. Specifically, the entire surface of the negative resist was exposed at an exposure amount of 1 mJ/cm$^2$ without using a mask.

(Exposure Conditions for Evaluating Bridge Defect Inhibition Performance)

The obtained wafer was subjected to pattern exposure using a KrF excimer laser scanner (PAS5500/850, manufactured by ASML) (NA 0.80). As a reticle, a binary mask was used which had a line-and-space pattern with a line size of 175 nm and a space size of 263 nm. The conditions were adjusted so as to obtain a line-and-space pattern having a pitch of 438 nm, a space width of 130 nm, and a line width of 308 nm.

(Common Development Conditions)

Then, after baking (Post Exposure Bake; PEB) under the condition of 100° C. for 60 seconds, puddle development with a developer was performed for 30 seconds, puddle rinsing with a rinsing solution was performed in a case where a rinsing process was carried out, and then the wafer was rotated for 30 seconds at a rotation speed of 4000 rpm, thereby obtaining a sample for evaluation.

As the developer, FHD-5 manufactured by Fuji Film Electronics Materials Co., Ltd. was used.

(Evaluation 1: Evaluation of Bridge Defect Inhibition Performance)

The resolution of the exposed LS pattern was observed using a scanning electron microscope (CG4600, manufactured by Hitachi, Ltd.) at 200 k magnification in visual fields (n=300). The number of bridges occurring in the LS pattern in one visual field observed was evaluated and adopted as the number of bridge defects in the LS pattern. The smaller the number of bridge defects, the better the bridge defect inhibition performance of the chemical liquid. The results were evaluated according to the following standard. The evaluation results are shown in Table 3.

A: The number of defects was equal to or smaller than 10 (number/visual field).

B: The number of defects was greater than 10 (number/visual field) and equal to or smaller than 30 (number/visual field).

C: The number of defects was greater than 30 (number/visual field) and equal to or smaller than 100 (number/visual field).

D: The number of defects was greater than 100 (number/visual field) and equal to or smaller than 300 (number/visual field).

E: The number of defects was greater than 300 (number/visual field).

(Evaluation 2: Evaluation of Post-Development Defect Inhibition Performance)

For the obtained sample, by using a wafer inspection device "SP-5" manufactured by KLA-Tencor Corporation, the total number of defects having a size equal to or greater than 19 nm existing on the entire surface of the wafer was measured. The results were evaluated according to the following standard. The evaluation results are shown in Table 3.

A: The number of defects was equal to or smaller than 200/wafer.

B: The number of defects was greater than 200/wafer and equal to or smaller than 500/wafer.

C: The number of defects was greater than 500/wafer and equal to or smaller than 1,000/wafer.

D: The number of defects was greater than 1,000/wafer and equal to or smaller than 1,500/wafer.

E: The number of defects was greater than 1,500/wafer.

[Evaluation 3: Evaluation of Pot Life of Filter]

The liquid to be purified was continuously purified using each of the filtering devices described in Table 3. After the liquid to be purified was passed and the filtering device was stabilized, the obtained chemical liquid was immediately collected for test (initial sample). Then, whenever the amount of the liquid passing through the device became 10,000 kg, a chemical liquid obtained after purification was collected for test (temporal sample). The chemical liquid collected for test was evaluated by the method for evaluating the bridge defect inhibition performance of a chemical liquid described in "Evaluation 1", and the number of defects per unit area was compared with that of the initial sample. The amount of the chemical liquid passing the device that was determined at a point in time when the number of defects in the temporal sample doubled was adopted as "pot life" of the filter. The pot life obtained in a case where the same type of liquid to be purified was purified by using the filtering device (chemical liquid 203) described in FIG. 25 was regarded as 1, and the pot life of the filter of each device was evaluated based on a ratio to 1. The results were evaluated based on the following standard. The evaluation results are shown in Table 3. The evaluation result obtained using the device (chemical liquid 203) in FIG. 25 is described as "Standard".

AA The pot life was equal to or longer than 10.

A The pot life was equal to or longer than 5 and less than 10.

B The pot life was equal to or longer than 2 and less than 5.

C The pot life was longer than 1 and less than 2.

D The pot life was equal to or shorter than 1.

TABLE 1

Figure 15:
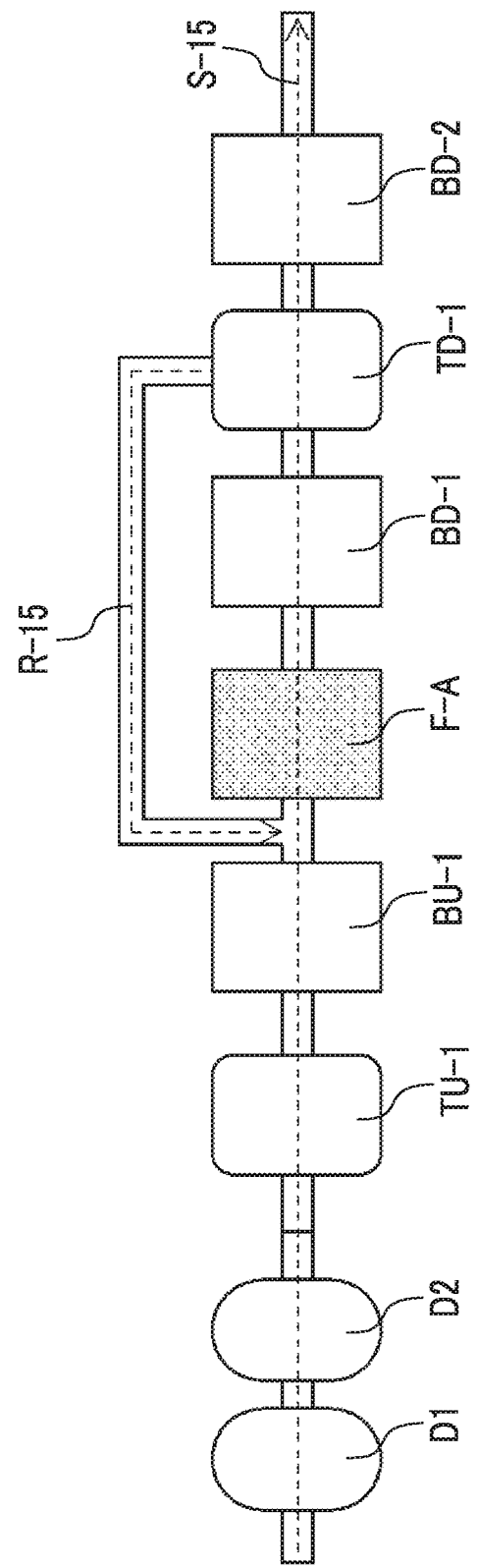
FIG. 15 is a schematic view illustrating a purification device according to an embodiment of the present invention.
Figure 16:
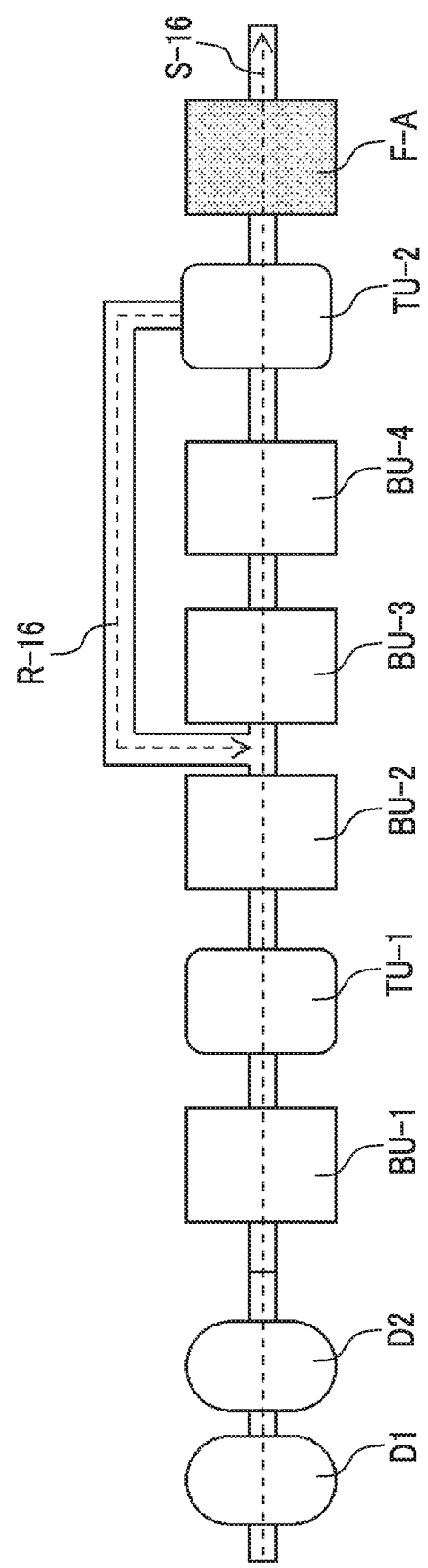
FIG. 16 is a schematic view illustrating a purification device according to an embodiment of the present invention.
Figure 17:
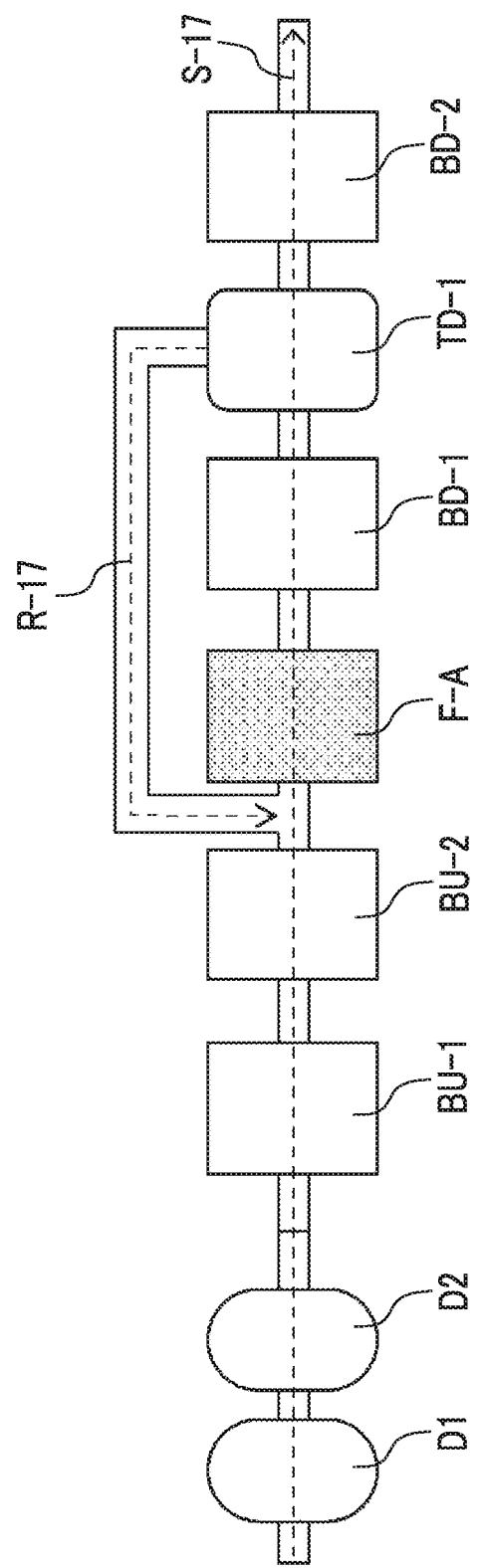
FIG. 17 is a schematic view illustrating a purification device according to an embodiment of the present invention.
Figure 18:
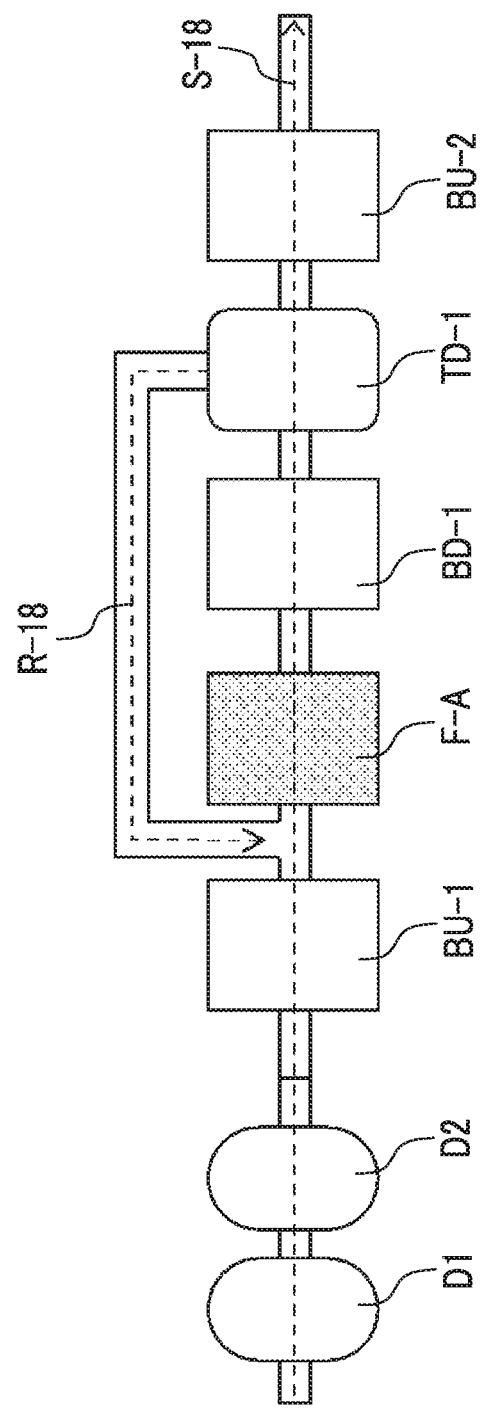
FIG. 18 is a schematic view illustrating a purification device according to an embodiment of the present invention.
Figure 19:
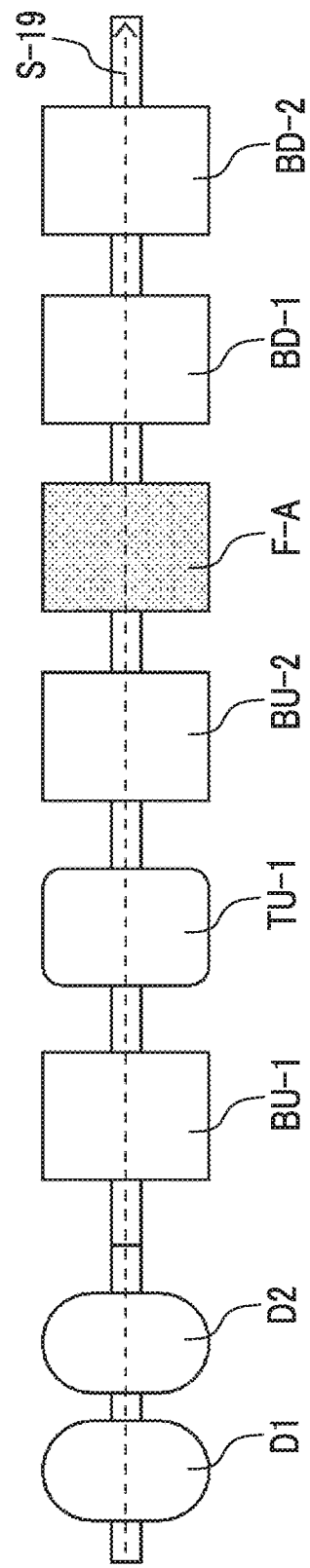
FIG. 19 is a schematic view illustrating a purification device according to an embodiment of the present invention.
Figure 21:
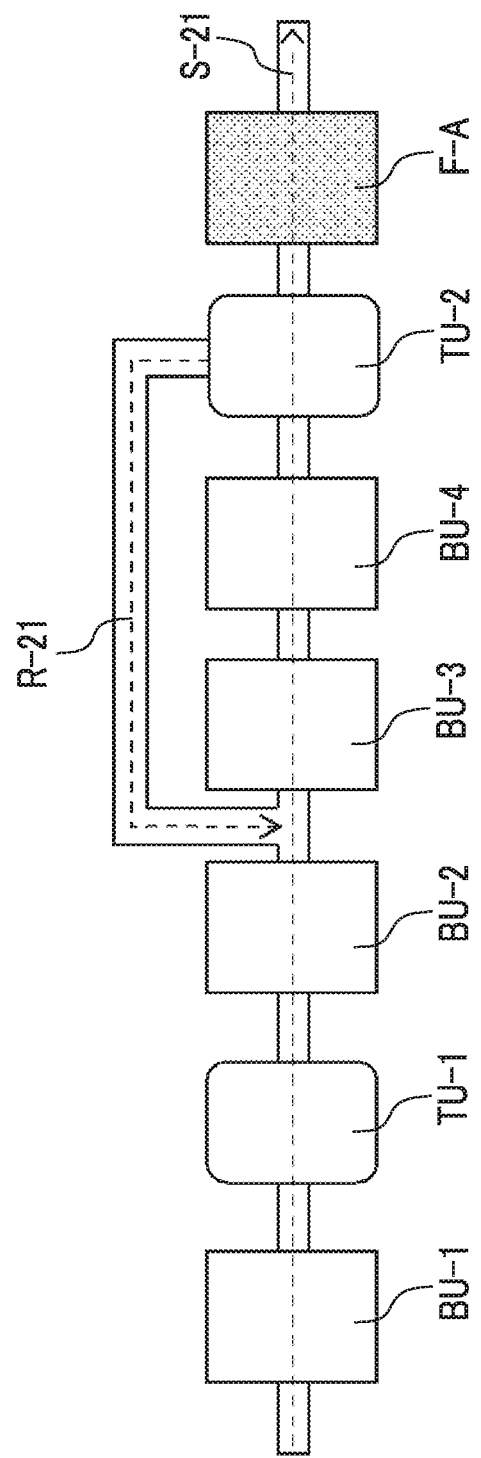
FIG. 21 is a schematic view illustrating a filtering device according to an embodiment of the present invention.
Figure 22:
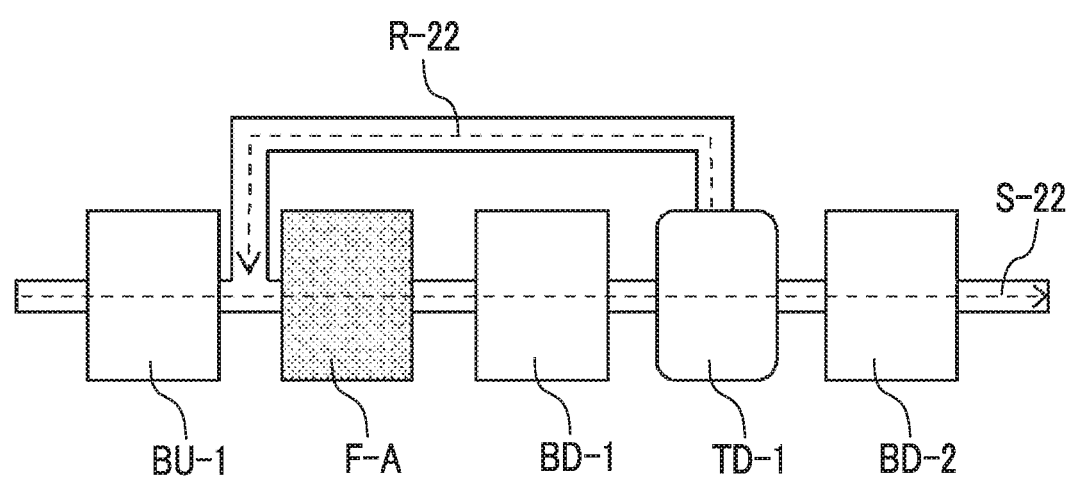
FIG. 22 is a schematic view illustrating a filtering device according to an embodiment of the present invention.
Figure 23:
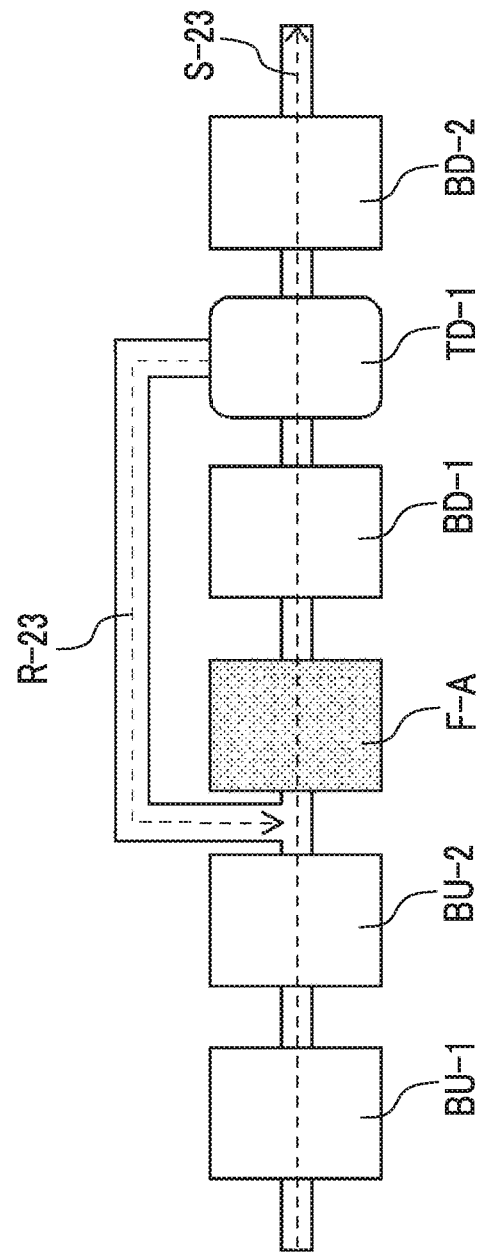
FIG. 23 is a schematic view illustrating a filtering device according to an embodiment of the present invention.
Figure 28:
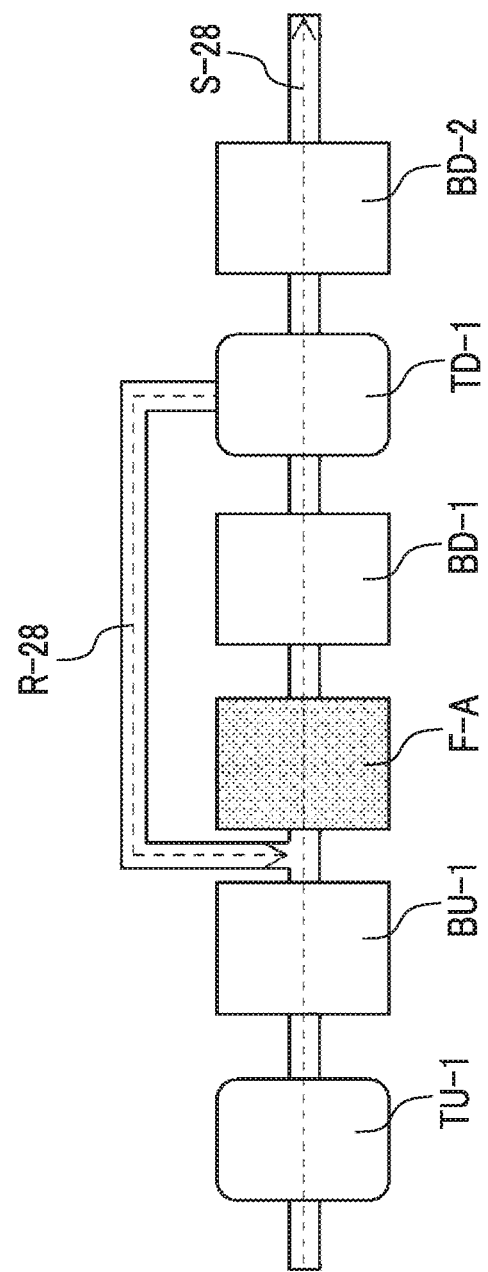
FIG. 28 is a schematic view illustrating a filtering device according to an embodiment of the present invention.

| Table 1 (1-1) | Purification device (or filtering device) | Liquid to be purified Organic solvent | SP value | Pre-washing of filter |
|---|---|---|---|---|
| Chemical liquid 1 | FIG. 14 | CHN | 20.3 | PGMEA 1 day immersion |
| Chemical liquid 2 | FIG. 15 | CHN | 20.3 | PGMEA 1 day immersion |
| Chemical liquid 3 | FIG. 16 | CHN | 20.3 | PGMEA 1 day immersion |
| Chemical liquid 4 | FIG. 14 | CHN | 20.3 | PGMEA 1 day immersion |
| Chemical liquid 5 | FIG. 17 | CHN | 20.3 | PGMEA 1 day immersion |
| Chemical liquid 6 | FIG. 14 | CHN | 20.3 | PGMEA 1 day immersion |
| Chemical liquid 7 | FIG. 14 | CHN | 20.3 | PGMEA 1 day immersion |
| Chemical liquid 8 | FIG. 14 | CHN | 20.3 | PGMEA 1 day immersion |
| Chemical liquid 9 | FIG. 14 | CHN | 20.3 | PGMEA 1 day immersion |
| Chemical liquid 10 | FIG. 14 | CHN | 20.3 | PGMEA 1 day immersion |
| Chemical liquid 11 | FIG. 14 | CHN | 20.3 | PGMEA 1 day immersion |
| Chemical liquid 12 | FIG. 18 | CHN | 20.3 | PGMEA 1 day immersion |
| Chemical liquid 13 | FIG. 14 | CHN | 20.3 | PGMEA 1 day immersion |
| Chemical liquid 14 | FIG. 19 | CHN | 20.3 | PGMEA 1 day immersion |
| Chemical liquid 15 | FIG. 14 | CHN | 20.3 | — |
| Chemical liquid 16 | FIG. 20 | CHN | 20.3 | PGMEA 1 day immersion |
| Chemical liquid 17 | FIG. 22 | CHN | 20.3 | PGMEA 1 day immersion |
| Chemical liquid 18 | FIG. 21 | CHN | 20.3 | PGMEA 1 day immersion |
| Chemical liquid 19 | FIG. 20 | CHN | 20.3 | PGMEA 1 day immersion |
| Chemical liquid 20 | FIG. 23 | CHN | 20.3 | PGMEA 1 day immersion |
| Chemical liquid 21 | FIG. 20 | CHN | 20.3 | PGMEA 1 day immersion |
| Chemical liquid 22 | FIG. 20 | CHN | 20.3 | PGMEA 1 day immersion |
| Chemical liquid 23 | FIG. 20 | CHN | 20.3 | PGMEA 1 day immersion |
| Chemical liquid 24 | FIG. 20 | CHN | 20.3 | PGMEA 1 day immersion |
| Chemical liquid 25 | FIG. 20 | CHN | 20.3 | PGMEA 1 day immersion |
| Chemical liquid 26 | FIG. 20 | CHN | 20.3 | PGMEA 1 day immersion |
| Chemical liquid 27 | FIG. 28 | CHN | 20.3 | PGMEA 1 day immersion |
| Chemical liquid 28 | FIG. 20 | CHN | 20.3 | PGMEA 1 day immersion |
| Chemical liquid 29 | FIG. 20 | CHN | 20.3 | PGMEA 1 day immersion |
| Chemical liquid 30 | FIG. 20 | CHN | 20.3 | — |
| Chemical liquid 31 | FIG. 14 | PGMEA/PGME (7:3) | 19.4 | PGMEA 1 day immersion |
| Chemical liquid 32 | FIG. 14 | nBA | 17.8 | PGMEA 1 day immersion |

TABLE 1 (1-2)

| | Distiller | BU-1 Material component | BU-1 Pore size (nm) | BU-2 Material component | BU-2 Pore size (nm) | BU-3 Material component | BU-3 Pore size (nm) |
|---|---|---|---|---|---|---|---|
| Chemical liquid 1 | Duplex | UPE | 50 | IEX | 15 | — | — |
| Chemical liquid 2 | Duplex | IEX | 15 | — | — | — | — |
| Chemical liquid 3 | Duplex | PP | 200 | IEX | 15 | Nylon | 20 |
| Chemical liquid 4 | Duplex | PP | 200 | IEX | 200 | — | — |
| Chemical liquid 5 | Duplex | PP | 200 | IEX | 15 | — | — |
| Chemical liquid 6 | Duplex | PTFE | 20 | IEX | 15 | — | — |
| Chemical liquid 7 | Duplex | PP | 200 | IEX | 15 | — | — |
| Chemical liquid 8 | Duplex | PP | 200 | IEX | 15 | — | — |
| Chemical liquid 9 | Duplex | PP | 200 | IEX | 15 | — | — |
| Chemical liquid 10 | Duplex | PP | 200 | IEX | 15 | — | — |
| Chemical liquid 11 | Duplex | PP | 200 | IEX | 15 | — | — |
| Chemical liquid 12 | Duplex | PP | 200 | — | — | — | — |
| Chemical liquid 13 | Duplex | PP | 200 | IEX | 15 | — | — |
| Chemical liquid 14 | Duplex | PP | 200 | IEX | 15 | — | — |
| Chemical liquid 15 | Duplex | PP | 200 | IEX | 15 | — | — |
| Chemical liquid 16 | — | PP | 200 | IEX | 15 | — | — |
| Chemical liquid 17 | — | IEX | 15 | — | — | — | — |
| Chemical liquid 18 | — | PP | 200 | IEX | 15 | Nylon | 20 |
| Chemical liquid 19 | — | PP | 200 | IEX | 200 | — | — |
| Chemical liquid 20 | — | PP | 200 | IEX | 15 | — | — |
| Chemical liquid 21 | — | PTFE | 20 | IEX | 15 | — | — |
| Chemical liquid 22 | — | PP | 200 | IEX | 15 | — | — |
| Chemical liquid 23 | — | PP | 200 | IEX | 15 | — | — |
| Chemical liquid 24 | — | PP | 200 | IEX | 15 | — | — |
| Chemical liquid 25 | — | PP | 200 | IEX | 15 | — | — |
| Chemical liquid 26 | — | PP | 200 | IEX | 15 | — | — |
| Chemical liquid 27 | — | PP | 200 | | | | |
| Chemical liquid 28 | — | PP | 200 | IEX | 15 | — | — |
| Chemical liquid 29 | — | PP | 200 | IEX | 15 | — | — |

TABLE 1 (1-2)-continued

|  | Distiller | BU-1 Material component | BU-1 Pore size (nm) | BU-2 Material component | BU-2 Pore size (nm) | BU-3 Material component | BU-3 Pore size (nm) |
|---|---|---|---|---|---|---|---|
| Chemical liquid 30 | — | PP | 200 | IEX | 15 | — | — |
| Chemical liquid 31 | Duplex | PP | 200 | IEX | 15 | — | — |
| Chemical liquid 32 | Duplex | PP | 200 | IEX | 15 | — | — |

TABLE 1 (1-3)

|  | BU-4 Material component | BU-4 Pore size (nm) | Tank TU-1 | Tank TU-2 | F-A Material component | F-A Pore size (nm) |
|---|---|---|---|---|---|---|
| Chemical liquid 1 | — | — | Present | — | PTFE-1 | 10 |
| Chemical liquid 2 | — | — | Present | — | PTFE-1 | 10 |
| Chemical liquid 3 | Nylon | 20 | Present | Present | PTFE-1 | 7 |
| Chemical liquid 4 | — | — | Present | — | PTFE-1 | 10 |
| Chemical liquid 5 | — | — | — | — | PTFE-1 | 10 |
| Chemical liquid 6 | — | — | Present | — | PTFE-2 | 12 |
| Chemical liquid 7 | — | — | Present | — | PTFE-3 | 15 |
| Chemical liquid 8 | — | — | Present | — | PTFE-4 | 7 |
| Chemical liquid 9 | — | — | Present | — | PTFE-1 | 7 |
| Chemical liquid 10 | — | — | Present | — | PTFE-2 | 10 |
| Chemical liquid 11 | — | — | Present | — | PTFE-3 | 10 |
| Chemical liquid 12 | — | — | — | — | PTFE-4 | 12 |
| Chemical liquid 13 | — | — | Present | — | PTFE-1 | 15 |
| Chemical liquid 14 | — | — | Present | — | PTFE-2 | 7 |
| Chemical liquid 15 | — | — | Present | — | PTFE-3 | 7 |
| Chemical liquid 16 | — | — | Present | — | PTFE-4 | 10 |
| Chemical liquid 17 | — | — | — | — | PTFE-3 | 15 |
| Chemical liquid 18 | Nylon | 20 | Present | Present | PTFE-3 | 5 |
| Chemical liquid 19 | — | — | Present | — | PTFE-1 | 10 |
| Chemical liquid 20 | — | — | — | — | PTFE-2 | 12 |
| Chemical liquid 21 | — | — | Present | — | PTFE-3 | 15 |
| Chemical liquid 22 | — | — | Present | — | PTFE-4 | 7 |
| Chemical liquid 23 | — | — | Present | — | PTFE-1 | 7 |
| Chemical liquid 24 | — | — | Present | — | PTFE-2 | 10 |
| Chemical liquid 25 | — | — | Present | — | PTFE-1 | 10 |
| Chemical liquid 26 | — | — | Present | — | PTFE-2 | 12 |
| Chemical liquid 27 | — | — | Present | — | PTFE-3 | 15 |
| Chemical liquid 28 | — | — | Present | — | PTFE-4 | 7 |
| Chemical liquid 29 | — | — | Present | — | PTFE-3 | 7 |
| Chemical liquid 30 | — | — | Present | — | PTFE-4 | 10 |
| Chemical liquid 31 | — | — | Present | — | PTFE-1 | 10 |
| Chemical liquid 32 | — | — | Present | — | PTFE-2 | 12 |

TABLE 1 (1-4)

|  | BD-1 Material component | BD-1 Pore size (nm) | BD-2 Material component | BD-2 Pore size (nm) | Tank TD-1 | Circulation |
|---|---|---|---|---|---|---|
| Chemical liquid 1 | Nylon | 10 | UPE | 3 | Present | Performed |
| Chemical liquid 2 | Nylon | 10 | UPE | 3 | Present | Performed |
| Chemical liquid 3 | — | — | — | — | — | Performed |
| Chemical liquid 4 | Nylon | 10 | UPE | 3 | Present | Performed |
| Chemical liquid 5 | Nylon | 10 | UPE | 3 | Present | Performed |
| Chemical liquid 6 | Nylon | 10 | UPE | 3 | Present | Performed |
| Chemical liquid 7 | Nylon | 10 | PTFE | 20 | Present | Performed |
| Chemical liquid 8 | Nylon | 10 | PTFE | 7 | Present | Performed |
| Chemical liquid 9 | Nylon | 10 | Nylon | 5 | Present | Performed |
| Chemical liquid 10 | Nylon | 10 | UPE | 5 | Present | Performed |
| Chemical liquid 11 | Nylon | 10 | UPE | 1 | Present | Performed |
| Chemical liquid 12 | Nylon | 10 | UPE | 3 | Present | Performed |
| Chemical liquid 13 | PTFE | 10 | UPE | 3 | Present | Performed |
| Chemical liquid 14 | Nylon | 10 | UPE | 3 | — | — |
| Chemical liquid 15 | Nylon | 10 | UPE | 3 | Present | Performed |
| Chemical liquid 16 | Nylon | 10 | UPE | 3 | Present | Performed |
| Chemical liquid 17 | Nylon | 10 | UPE | 3 | Present | Performed |
| Chemical liquid 18 | — | — | — | — | — | Performed |
| Chemical liquid 19 | Nylon | 10 | UPE | 3 | Present | Performed |
| Chemical liquid 20 | Nylon | 10 | UPE | 3 | Present | Performed |
| Chemical liquid 21 | Nylon | 10 | UPE | 3 | Present | Performed |
| Chemical liquid 22 | Nylon | 10 | PTFE | 20 | Present | Performed |
| Chemical liquid 23 | Nylon | 10 | PTFE | 7 | Present | Performed |
| Chemical liquid 24 | Nylon | 10 | Nylon | 5 | Present | Performed |
| Chemical liquid 25 | Nylon | 10 | UPE | 3 | Present | Performed |
| Chemical liquid 26 | Nylon | 10 | UPE | 1 | Present | Performed |

TABLE 1 (1-4)-continued

| | BD-1 | | BD-2 | | | |
|---|---|---|---|---|---|---|
| | Material component | Pore size (nm) | Material component | Pore size (nm) | Tank TD-1 | Circulation |
| Chemical liquid 27 | Nylon | 10 | UPE | 3 | Present | Performed |
| Chemical liquid 28 | PTFE | 10 | UPE | 3 | Present | Performed |
| Chemical liquid 29 | Nylon | 10 | UPE | 3 | Present | |
| Chemical liquid 30 | Nylon | 10 | UPE | 3 | Present | Performed |
| Chemical liquid 31 | Nylon | 10 | UPE | 3 | Present | Performed |
| Chemical liquid 32 | Nylon | 10 | UPE | 3 | Present | Performed |

TABLE 1 (1-5)

| | | Evaluation 1 | | Evaluation 2 | Evaluation 3 | Evaluation 4 |
|---|---|---|---|---|---|---|
| | Evaluation method | Residue defect inhibition performance | Stain-like defect inhibition performance | Bridge defect inhibition performance | Pattern width uniformity | Pot life |
| Chemical liquid 1 | Pre-wetting | AA | AA | AA | AA | AA |
| Chemical liquid 2 | Pre-wetting | A | AA | AA | A | B |
| Chemical liquid 3 | Pre-wetting | AA | AA | A | A | AA |
| Chemical liquid 4 | Pre-wetting | A | AA | AA | B | AA |
| Chemical liquid 5 | Pre-wetting | A | AA | A | A | AA |
| Chemical liquid 6 | Pre-wetting | A | AA | AA | AA | A |
| Chemical liquid 7 | Pre-wetting | A | AA | B | A | AA |
| Chemical liquid 8 | Pre-wetting | A | AA | A | A | AA |
| Chemical liquid 9 | Pre-wetting | A | AA | AA | A | AA |
| Chemical liquid 10 | Pre-wetting | A | AA | AA | AA | AA |
| Chemical liquid 11 | Pre-wetting | AA | AA | AA | AA | AA |
| Chemical liquid 12 | Pre-wetting | A | AA | A | C | AA |
| Chemical liquid 13 | Pre-wetting | B | AA | A | A | AA |
| Chemical liquid 14 | Pre-wetting | B | AA | B | A | AA |
| Chemical liquid 15 | Pre-wetting | A | B | AA | A | AA |
| Chemical liquid 16 | Pre-wetting | AA | B | AA | AA | AA |
| Chemical liquid 17 | Pre-wetting | A | B | AA | A | B |
| Chemical liquid 18 | Pre-wetting | AA | B | A | A | AA |
| Chemical liquid 19 | Pre-wetting | A | B | AA | B | AA |
| Chemical liquid 20 | Pre-wetting | A | B | A | A | AA |
| Chemical liquid 21 | Pre-wetting | A | B | AA | AA | A |
| Chemical liquid 22 | Pre-wetting | A | B | B | A | AA |
| Chemical liquid 23 | Pre-wetting | A | B | A | A | AA |

TABLE 1 (1-5)-continued

| | | Evaluation 1 | | Evaluation 2 | Evaluation 3 | Evaluation 4 |
|---|---|---|---|---|---|---|
| | Evaluation method | Residue defect inhibition performance | Stain-like defect inhibition performance | Bridge defect inhibition performance | Pattern width uniformity | Pot life |
| Chemical liquid 24 | Pre-wetting | A | B | AA | A | AA |
| Chemical liquid 25 | Pre-wetting | A | B | AA | AA | AA |
| Chemical liquid 26 | Pre-wetting | AA | B | AA | AA | AA |
| Chemical liquid 27 | Pre-wetting | A | B | A | C | AA |
| Chemical liquid 28 | Pre-wetting | B | B | A | A | AA |
| Chemical liquid 29 | Pre-wetting | B | B | B | A | AA |
| Chemical liquid 30 | Pre-wetting | A | D | AA | A | AA |
| Chemical liquid 31 | Pre-wetting | AA | AA | AA | AA | AA |
| Chemical liquid 32 | Developer | AA | AA | AA | AA | AA |

TABLE 6

| Table 1 (2-1) | Purification device (or filtering device) | Liquid to be purified | | |
|---|---|---|---|---|
| | | Organic solvent | SP value | Pre-washing of filter |
| Chemical liquid 33 | FIG. 14 | PC/PGMEA (1:9) | 18.2 | PGMEA 1 day immersion |
| Chemical liquid 34 | FIG. 24 | CHN | 20.3 | PGMEA 1 day immersion |
| Chemical liquid 35 | FIG. 14 | MIBC | 22.7 | PGMEA 1 day immersion |
| Chemical liquid 36 | FIG. 14 | MIBC | 22.7 | PGMEA 1 day immersion |
| Chemical liquid 37 | FIG. 14 | PGME | 23.1 | PGMEA 1 day immersion |
| Chemical liquid 38 | FIG. 14 | PGME | 23.1 | PGMEA 1 day immersion |
| Chemical liquid 39 | FIG. 14 | PGMEA | 17.8 | PGMEA 1 day immersion |
| Chemical liquid 40 | FIG. 14 | PGMEA | 17.8 | PGMEA 1 day immersion |
| Chemical liquid 41 | FIG. 14 | PC | 21.5 | PGMEA 1 day immersion |
| Chemical liquid 42 | FIG. 14 | PC | 21.5 | PGMEA 1 day immersion |
| Chemical liquid 43 | FIG. 14 | CHN | 20.3 | PGMEA 1 day immersion |
| Chemical liquid 44 | FIG. 14 | CHN | 20.3 | PGMEA 1 day immersion |
| Chemical liquid 45 | FIG. 14 | nBA | 17.8 | PGMEA 1 day immersion |
| Chemical liquid 46 | FIG. 14 | nBA | 17.8 | PGMEA 1 day immersion |
| Chemical liquid 47 | FIG. 14 | iAA | 17.4 | PGMEA 1 day immersion |
| Chemical liquid 48 | FIG. 14 | iAA | 17.4 | PGMEA 1 day immersion |
| Chemical liquid 49 | FIG. 14 | EL | 21.7 | PGMEA 1 day immersion |
| Chemical liquid 50 | FIG. 14 | EL | 21.7 | PGMEA 1 day immersion |
| Chemical liquid 51 | FIG. 14 | PGME | 23.1 | PGMEA 1 day immersion |
| Chemical liquid 52 | FIG. 16 | PGME | 23.1 | PGMEA 1 day immersion |
| Chemical liquid 53 | FIG. 14 | PGMEA | 17.8 | PGMEA 1 day immersion |

TABLE 6-continued

Figure 29:
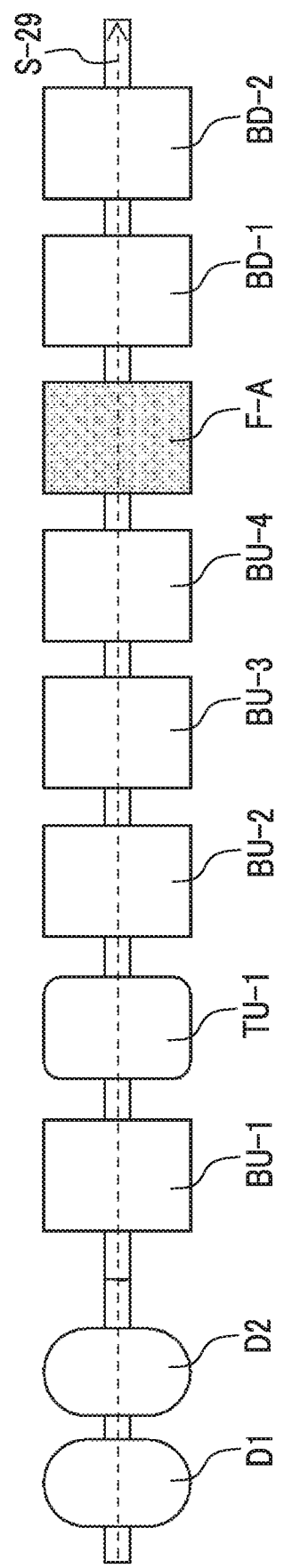
FIG. 29 is a schematic view illustrating a purification device according to an embodiment of the present invention.
Figure 30:
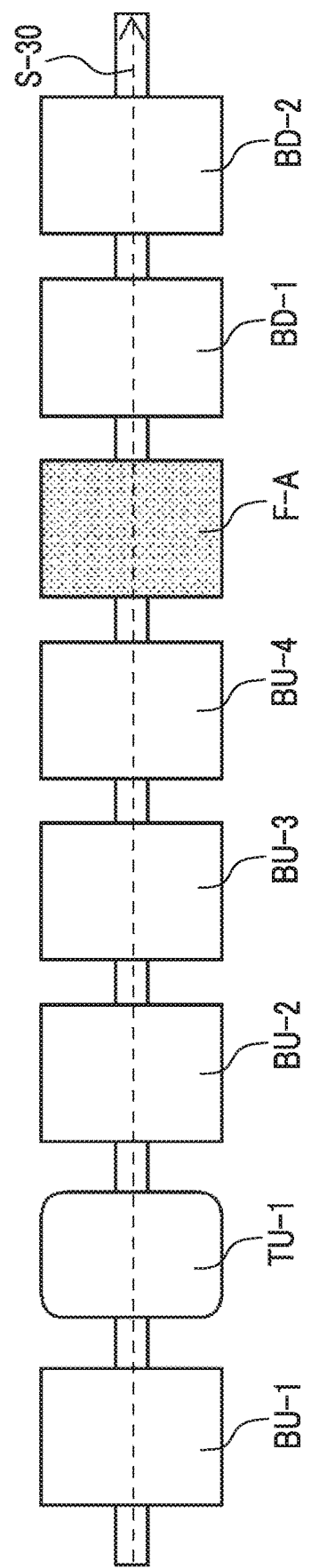
FIG. 30 is a schematic view illustrating a filtering device according to an embodiment of the present invention.

| Table 1 (2-1) | Purification device (or filtering device) | Liquid to be purified Organic solvent | SP value | Pre-washing of filter |
|---|---|---|---|---|
| Chemical liquid 54 | FIG. 16 | PGMEA | 17.8 | PGMEA 1 day immersion |
| Chemical liquid 55 | FIG. 14 | CHN | 20.3 | PGMEA 1 day immersion |
| Chemical liquid 56 | FIG. 16 | CHN | 20.3 | PGMEA 1 day immersion |
| Chemical liquid 57 | FIG. 29 | CHN | 20.3 | PGMEA 1 day immersion |
| Chemical liquid 58 | FIG. 29 | PGMEA | 17.8 | PGMEA 1 day immersion |
| Chemical liquid 59 | FIG. 29 | nBA | 17.8 | PGMEA 1 day immersion |
| Chemical liquid 60 | FIG. 29 | MIBC | 22.7 | PGMEA 1 day immersion |
| Chemical liquid 61 | FIG. 30 | CHN | 20.3 | PGMEA 1 day immersion |
| Chemical liquid 62 | FIG. 30 | PGMEA | 17.8 | PGMEA 1 day immersion |
| Chemical liquid 63 | FIG. 30 | nBA | 17.8 | PGMEA 1 day immersion |
| Chemical liquid 64 | FIG. 30 | MIBC | 22.7 | PGMEA 1 day immersion |

TABLE 1 (2-2)

|  | Distiller | BU-1 | | BU-2 | | BU-3 | |
|---|---|---|---|---|---|---|---|
|  |  | Material component | Pore size (nm) | Material component | Pore size (nm) | Material component | Pore size (nm) |
| Chemical liquid 33 | Duplex | PP | 200 | IEX | 15 | — | — |
| Chemical liquid 34 | Duplex | — | — | — | — | — | — |
| Chemical liquid 35 | Duplex | PP | 200 | IEX | 15 | — | — |
| Chemical liquid 36 | Duplex | PP | 200 | IEX | 15 | — | — |
| Chemical liquid 37 | Duplex | PP | 200 | IEX | 15 | — | — |
| Chemical liquid 38 | Duplex | PP | 200 | IEX | 15 | — | — |
| Chemical liquid 39 | Duplex | PP | 200 | IEX | 15 | — | — |
| Chemical liquid 40 | Duplex | PP | 200 | IEX | 15 | — | — |
| Chemical liquid 41 | Duplex | PP | 200 | IEX | 15 | — | — |
| Chemical liquid 42 | Duplex | PP | 200 | IEX | 15 | — | — |
| Chemical liquid 43 | Duplex | PP | 200 | IEX | 15 | — | — |
| Chemical liquid 44 | Duplex | PP | 200 | IEX | 15 | — | — |
| Chemical liquid 45 | Duplex | PP | 200 | IEX | 15 | — | — |
| Chemical liquid 46 | Duplex | PP | 200 | IEX | 15 | — | — |
| Chemical liquid 47 | Duplex | PP | 200 | IEX | 15 | — | — |
| Chemical liquid 48 | Duplex | PP | 200 | IEX | 15 | — | — |
| Chemical liquid 49 | Duplex | PP | 200 | IEX | 15 | — | — |
| Chemical liquid 50 | Duplex | PP | 200 | IEX | 15 | — | — |
| Chemical liquid 51 | Duplex | PP | 200 | IEX | 15 | — | — |
| Chemical liquid 52 | Duplex | PP | 200 | IEX | 15 | Nylon | 10 |
| Chemical liquid 53 | Duplex | PP | 200 | IEX | 15 | — | — |
| Chemical liquid 54 | Duplex | PP | 200 | IEX | 15 | Nylon | 10 |
| Chemical liquid 55 | Duplex | PP | 200 | IEX | 15 | — | — |
| Chemical liquid 56 | Duplex | PP | 200 | IEX | 15 | Nylon | 10 |
| Chemical liquid 57 | Duplex | PP | 200 | IEX | 15 | Nylon | 10 |
| Chemical liquid 58 | Duplex | PP | 200 | IEX | 15 | Nylon | 10 |
| Chemical liquid 59 | Duplex | PP | 200 | IEX | 15 | Nylon | 10 |
| Chemical liquid 60 | Duplex | PP | 200 | IEX | 15 | Nylon | 10 |
| Chemical liquid 61 | — | PP | 200 | IEX | 15 | Nylon | 10 |
| Chemical liquid 62 | — | PP | 200 | IEX | 15 | Nylon | 10 |
| Chemical liquid 63 | — | PP | 200 | IEX | 15 | Nylon | 10 |
| Chemical liquid 64 | — | PP | 200 | IEX | 15 | Nylon | 10 |

TABLE 1 (2-3)

|  | BU-4 | | Tank | | F-A | |
|---|---|---|---|---|---|---|
|  | Material component | Pore size (nm) | TU-1 | TU-2 | Material component | Pore size (nm) |
| Chemical liquid 33 | — | — | Present | — | PTFE-3 | 15 |
| Chemical liquid 34 | — | — | — | — | PTFE-4 | 7 |
| Chemical liquid 35 | — | — | Present | — | PTFE-1 | 12 |
| Chemical liquid 36 | — | — | Present | — | PTFE-1 | 15 |
| Chemical liquid 37 | — | — | Present | — | PTFE-2 | 12 |
| Chemical liquid 38 | — | — | Present | — | PTFE-2 | 15 |
| Chemical liquid 39 | — | — | Present | — | PTFE-4 | 12 |
| Chemical liquid 40 | — | — | Present | — | PTFE-4 | 15 |
| Chemical liquid 41 | — | — | Present | — | PTFE-1 | 12 |
| Chemical liquid 42 | — | — | Present | — | PTFE-1 | 15 |
| Chemical liquid 43 | — | — | Present | — | PTFE-3 | 12 |
| Chemical liquid 44 | — | — | Present | — | PTFE-3 | 15 |
| Chemical liquid 45 | — | — | Present | — | PTFE-2 | 12 |
| Chemical liquid 46 | — | — | Present | — | PTFE-2 | 15 |
| Chemical liquid 47 | — | — | Present | — | PTFE-3 | 12 |
| Chemical liquid 48 | — | — | Present | — | PTFE-3 | 15 |
| Chemical liquid 49 | — | — | Present | — | PTFE-3 | 12 |
| Chemical liquid 50 | — | — | Present | — | PTFE-3 | 15 |

TABLE 1 (2-3)-continued

| | BU-4 | | | | F-A | |
|---|---|---|---|---|---|---|
| | Material component | Pore size (nm) | Tank TU-1 | Tank TU-2 | Material component | Pore size (nm) |
| Chemical liquid 51 | — | — | Present | — | PTFE-4 | 10 |
| Chemical liquid 52 | UPE | 10 | Present | Present | PTFE-4 | 10 |
| Chemical liquid 53 | — | — | Present | — | PTFE-4 | 10 |
| Chemical liquid 54 | UPE | 10 | Present | Present | PTFE-4 | 10 |
| Chemical liquid 55 | — | — | Present | — | PTFE-4 | 10 |
| Chemical liquid 56 | UPE | 10 | Present | Present | PTFE-4 | 10 |
| Chemical liquid 57 | UPE | 10 | Present | — | PTFE-3 | 7 |
| Chemical liquid 58 | UPE | 10 | Present | — | PTFE-4 | 7 |
| Chemical liquid 59 | UPE | 10 | Present | — | PTFE-2 | 7 |
| Chemical liquid 60 | UPE | 10 | Present | — | PTFE-1 | 7 |
| Chemical liquid 61 | UPE | 10 | Present | — | PTFE-3 | 7 |
| Chemical liquid 62 | UPE | 10 | Present | — | PTFE-4 | 7 |
| Chemical liquid 63 | UPE | 10 | Present | — | PTFE-2 | 7 |
| Chemical liquid 64 | UPE | 10 | Present | — | PTFE-1 | 7 |

TABLE 1 (2-4)

| | BD-1 | | BD-2 | | | |
|---|---|---|---|---|---|---|
| | Material component | Pore size (nm) | Material component | Pore size (nm) | Tank TD-1 | Circulation |
| Chemical liquid 33 | Nylon | 10 | UPE | 3 | Present | Performed |
| Chemical liquid 34 | — | — | — | — | — | — |
| Chemical liquid 35 | Nylon | 10 | UPE | 7 | Present | Performed |
| Chemical liquid 36 | Nylon | 10 | PTFE-2 | 10 | Present | Performed |
| Chemical liquid 37 | Nylon | 10 | UPE | 7 | Present | Performed |
| Chemical liquid 38 | Nylon | 10 | PTFE-4 | 10 | Present | Performed |
| Chemical liquid 39 | Nylon | 10 | UPE | 7 | Present | Performed |
| Chemical liquid 40 | Nylon | 10 | PTFE-2 | 10 | Present | Performed |
| Chemical liquid 41 | Nylon | 10 | UPE | 7 | Present | Performed |
| Chemical liquid 42 | Nylon | 10 | PTFE-4 | 12 | Present | Performed |
| Chemical liquid 43 | Nylon | 10 | UPE | 7 | Present | Performed |
| Chemical liquid 44 | Nylon | 10 | PTFE-4 | 12 | Present | Performed |
| Chemical liquid 45 | Nylon | 10 | UPE | 7 | Present | Performed |
| Chemical liquid 46 | Nylon | 10 | PTFE-1 | 7 | Present | Performed |
| Chemical liquid 47 | Nylon | 10 | UPE | 7 | Present | Performed |
| Chemical liquid 48 | Nylon | 10 | PTFE-2 | 7 | Present | Performed |

TABLE 1 (2-4)-continued

| | BD-1 | | BD-2 | | | |
|---|---|---|---|---|---|---|
| | Material component | Pore size (nm) | Material component | Pore size (nm) | Tank TD-1 | Circulation |
| Chemical liquid 49 | Nylon | 10 | UPE | 7 | Present | Performed |
| Chemical liquid 50 | Nylon | 10 | PTFE-4 | 12 | Present | Performed |
| Chemical liquid 51 | UPE | 10 | Nylon | 10 | Present | Performed |
| Chemical liquid 52 | — | — | — | — | — | Performed |
| Chemical liquid 53 | UPE | 10 | Nylon | 10 | Present | Performed |
| Chemical liquid 54 | — | — | — | — | — | Performed |
| Chemical liquid 55 | UPE | 10 | Nylon | 10 | Present | Performed |
| Chemical liquid 56 | — | — | — | — | — | Performed |
| Chemical liquid 57 | Nylon | 5 | UPE | 3 | — | — |
| Chemical liquid 58 | Nylon | 5 | UPE | 3 | — | — |
| Chemical liquid 59 | Nylon | 5 | UPE | 3 | — | — |
| Chemical liquid 60 | Nylon | 5 | UPE | 3 | — | — |
| Chemical liquid 61 | Nylon | 5 | UPE | 3 | — | — |
| Chemical liquid 62 | Nyton | 5 | UPE | 3 | — | — |
| Chemical liquid 63 | Nylon | 5 | UPE | 3 | — | — |
| Chemical liquid 64 | Nylon | 5 | UPE | 3 | — | — |

TABLE 1 (2-5)

| | | Evaluation 1 | | | Evaluation 2 | Evaluation 3 | Evaluation 4 |
|---|---|---|---|---|---|---|---|
| | Evaluation method | Residue defect inhibition performance | Stain-like defect inhibition performance | Bridge defect inhibition performance | | Pattern width uniformity | Pot life |
| Chemical liquid 33 | Pre-wetting | AA | AA | AA | | AA | AA |
| Chemical liquid 34 | Pre-wetting | E | E | E | | E | Standard |
| Chemical liquid 35 | Rinsing | A | AA | AA | | A | AA |
| Chemical liquid 36 | Rinsing | A | AA | AA | | A | AA |
| Chemical liquid 37 | Pre-wetting | A | AA | AA | | A | AA |
| Chemical liquid 38 | Pre-wetting | A | AA | AA | | A | AA |
| Chemical liquid 39 | Pre-wetting | A | A | AA | | A | AA |
| Chemical liquid 40 | Pre-wetting | AA | AA | AA | | AA | AA |
| Chemical liquid 41 | Pre-wetting | A | AA | AA | | A | AA |
| Chemical liquid 42 | Pre-wetting | A | AA | AA | | A | AA |
| Chemical liquid 43 | Pre-wetting | A | AA | AA | | A | AA |
| Chemical liquid 44 | Pre-wetting | A | AA | AA | | A | AA |
| Chemical liquid 45 | Developer | A | A | AA | | A | AA |
| Chemical liquid 46 | Developer | AA | AA | AA | | AA | AA |

TABLE 1 (2-5)-continued

| | Evaluation method | Evaluation 1 Residue defect inhibition performance | Evaluation 1 Stain-like defect inhibition performance | Evaluation 2 Bridge defect inhibition performance | Evaluation 3 Pattern width uniformity | Evaluation 4 Pot life |
|---|---|---|---|---|---|---|
| Chemical liquid 47 | Developer | A | A | AA | A | AA |
| Chemical liquid 48 | Pre-wetting | AA | AA | AA | AA | AA |
| Chemical liquid 49 | Pre-wetting | A | AA | AA | A | AA |
| Chemical liquid 50 | Pre-wetting | A | AA | AA | A | AA |
| Chemical liquid 51 | Pre-wetting | A | AA | AA | A | AA |
| Chemical liquid 52 | Pre-wetting | A | AA | AA | A | AA |
| Chemical liquid 53 | Pre-wetting | A | A | AA | A | AA |
| Chemical liquid 54 | Pre-wetting | AA | AA | AA | AA | AA |
| Chemical liquid 55 | Pre-wetting | A | AA | AA | A | AA |
| Chemical liquid 56 | Pre-wetting | A | AA | AA | A | AA |
| Chemical liquid 57 | Pre-wetting | AA | AA | AA | AA | AA |
| Chemical liquid 58 | Pre-wetting | AA | AA | AA | AA | AA |
| Chemical liquid 59 | Pre-wetting | AA | AA | AA | AA | AA |
| Chemical liquid 60 | Pre-wetting | AA | AA | AA | AA | AA |
| Chemical liquid 61 | Pre-wetting | AA | B | AA | AA | AA |
| Chemical liquid 62 | Pre-wetting | AA | B | AA | AA | AA |
| Chemical liquid 63 | Pre-wetting | AA | B | AA | AA | AA |
| Chemical liquid 64 | Pre-wetting | AA | B | AA | AA | AA |

Table 1 is divided into a first group: Table 1 (1-1) to Table 1 (1-5) and a second group: Table 1 (2-1) to Table 1 (2-5).

In the corresponding lines of five tables of each group subdivided from Table 1, the filters included in the filtering device (or the purification device) used for the purifying each chemical liquid and the evaluation results of the obtained chemical liquid are described.

For example, in the first line in Table 1 (1-1) to Table 1 (1-5) as a first group of Table 1, the chemical liquid 1 is described.

The first line shows that the chemical liquid 1 was manufactured by the purification device described in FIG. 14, the liquid to be purified used for manufacturing the chemical liquid 1 contained CHN (cyclohexanone), and the SP value thereof was 20.3. In addition, the first line shows that the filter of the purification device used for manufacturing the chemical liquid 1 was washed in advance under the condition of "PGMEA 1 day immersion". Furthermore, the first line shows that the purification device has a duplex distiller, BU-1 (UPE-containing filter having a pore size of 50 nm disposed on the uppermost stream side of the flow path), BU-2 (IEX filter having a pore size of 15 nm disposed on the downstream side of BU-1), a tank TU-1 disposed on the upstream side of the filter A (F-A), a PTFE-1 filter having a pore size of 10 nm as F-A (filter A), BD-1 (nylon-containing filter having a pore size of 10 nm) and BD-2 (UPE-containing filter having a pore size of 3 nm) arranged on the downstream side of the filter F-A, and a tank TD-1 disposed on the downstream side of the filter F-A. The first line also shows that the circulation filtration was "performed".

The first line also shows that the chemical liquid 1 was evaluated by the "Pre-wetting" method, the residue defect inhibition performance was AA, the stain-like defect inhibition performance was AA, the bridge defect inhibition performance was AA, the pattern width uniformity was AA, and the pot life of the filter of the purification device was AA.

Likewise, for the chemical liquids 2 to 32, the results are described in the tables of the first group, and for the chemical liquids 33 to 64, the results are described in the tables of the second group.

TABLE 2 (1-1)

| | Liquid | | | | BU-1 | |
|---|---|---|---|---|---|---|
| | Filtering device | Liquid to be purified Solvent | Pre-washing of filter | Distiller | Material component | Pore size (nm) |
| Chemical liquid 101 | FIG. 20 | SPM (4:1) | PCMEA 1 day immersion | — | PTFE | 200 |
| Chemical liquid 102 | FIG. 20 | 85% phosphoric acid | PGMEA 1 day immersion | — | PTFE | 200 |
| Chemical liquid 103 | FIG. 25 | SPM(4:1) | PCMEA 1 day immersion | — | — | — |
| Chemical liquid 104 | FIG. 25 | 85% phosphoric acid | PGMEA 1 day immersion | — | — | — |

TABLE 2 (1-2)

| | BU-2 | | | F-A | | BD-1 | |
|---|---|---|---|---|---|---|---|
| | Material component | Pore size (nm) | Tank TU-1 | Material component | Pore size (nm) | Material component | Pore size (nm) |
| Chemical liquid 101 | PTFE | 20 | Present | PTFE-3 | 15 | PTFE | 10 |
| Chemical liquid 102 | PTFE | 20 | Present | PTFE-4 | 7 | PTFE | 10 |
| Chemical liquid 103 | — | — | — | PTFE-3 | 15 | — | — |
| Chemical liquid 104 | — | — | — | PTFE-4 | 7 | — | — |

TABLE 2 (1-3)

| | BD-2 | | | | Evaluation 1 | | |
|---|---|---|---|---|---|---|---|
| | Material component | Pore size (nm) | Tank TD-1 | Circulation | Particle-like defect inhibition performance | Stain-like defect inhibition performance | Evaluation 2 Pot life |
| Chemical liquid 101 | PTFE | 10 | Present | Performed | A | A | A |
| Chemical liquid 102 | PTFE | 10 | Present | Performed | A | A | A |
| Chemical liquid 103 | — | — | — | — | C | B | Standard |
| Chemical liquid 104 | — | — | — | — | C | B | D |

Table 2 is divided into Table 2 (1-1) to Table 2 (1-3). In the corresponding lines of the tables subdivided from Table 2, the filtering devices used for purifying the chemical liquids and the obtained evaluation results of chemical liquids are described.

For example, in the first line of each of the subdivision tables, the chemical liquid 101 is described.

The first line shows that the chemical liquid 101 was manufactured by the filtering device illustrated in FIG. 20, and the liquid to be purified used for manufacturing the chemical liquid 101 was SPM (4:1). In addition, the first line shows that the filter of the filtering device used for manufacturing the chemical liquid 101 was washed in advance under the condition of "PGMEA 1 day immersion". Furthermore, the first line shows that the filtering device has BU-1 (a PTFE-containing filter having a pore size of 200 nm), BU-2 (a PTFE-containing filter having a pore size of 20 nm), a tank TU-1 disposed on the upstream side of the filter F-A, a PTFE-3 filter having a pore size of 15 nm as F-A (filter A), and has BD-1 (a PTFE-containing filter having a pore size of 10 nm), BD-2 (a PTFE-containing filter having a pore size of 10 nm), and a tank TD-1 which are disposed on the downstream side of F-A. The first line also shows that the circulation filtration was "performed".

As is evident from the first line, the chemical liquid 101 was evaluated as A for the particle defect inhibition performance, A for the stain-like defect inhibition performance, and A for the pot life of the filter of the filtering device.

Likewise, for the chemical liquids 102 to 104, the results are described in the above tables.

TABLE 14

Figure 27:
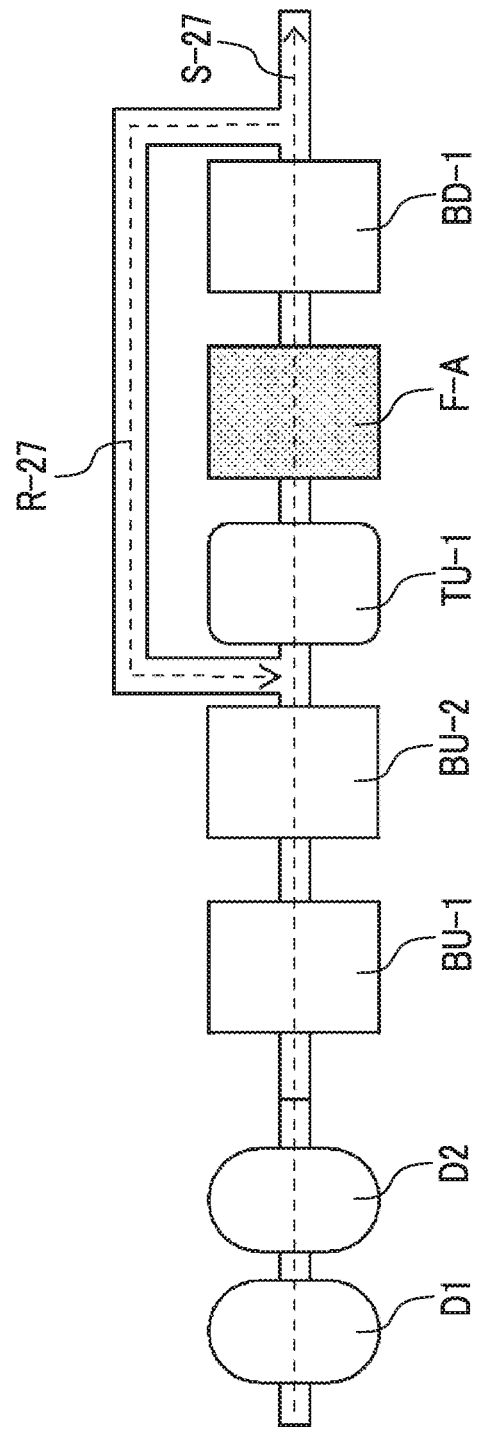
FIG. 27 is a schematic view illustrating a purification device according to an embodiment of the present invention.

| Table 3 (1-1) | Filtering device | Liquid to be purified | Pre-washing of filter | Distiller |
|---|---|---|---|---|
| Chemical liquid 201 | FIG. 26 | Resist resin composition 2 | PGMEA 1 day immersion | — |
| Chemical liquid 202 | FIG. 27 | Resist resin composition 2 | PGMEA 1 day immersion | — |
| Chemical liquid 203 | FIG. 25 | Resist resin composition 2 | PGMEA 1 day immersion | — |
| Chemical liquid 204 | FIG. 26 | Resist resin composition 3 | PGMEA 1 day immersion | — |
| Chemical liquid 205 | FIG. 27 | Resist resin composition 3 | PGMEA 1 day immersion | — |
| Chemical liquid 206 | FIG. 25 | Resist resin composition 3 | PGMEA 1 day immersion | — |
| Chemical liquid 207 | FIG. 26 | Resist resin composition 4 | PGMEA 1 day immersion | — |
| Chemical liquid 208 | FIG. 27 | Resist resin composition 4 | PGMEA 1 day immersion | — |
| Chemical liquid 209 | FIG. 25 | Resist resin composition 4 | PGMEA 1 day immersion | — |

TABLE 3 (1-2)

| | BU-1 | | BU-2 | | | F-A | |
|---|---|---|---|---|---|---|---|
| | Material component | Pore size (nm) | Material component | Pore size (nm) | Tank TU-1 | Material component | Pore size (nm) |
| Chemical liquid 201 | Nylon | 10 | — | — | Present | PTFE-3 | 10 |
| Chemical liquid 202 | Nylon | 20 | Nylon | 10 | Present | PTFE-3 | 10 |
| Chemical liquid 203 | — | — | — | — | — | PTFE-3 | 10 |
| Chemical liquid 204 | Nylon | 10 | — | — | Present | PTFE-4 | 7 |
| Chemical liquid 205 | Nylon | 20 | Nylon | 10 | Present | PTFE-4 | 7 |
| Chemical liquid 206 | — | — | — | — | — | PTFE-4 | 7 |
| Chemical liquid 207 | Nylon | 10 | — | — | Present | PTFE-1 | 15 |
| Chemical liquid 208 | Nylon | 20 | Nylon | 10 | Present | PTFE-1 | 15 |
| Chemical liquid 209 | — | — | — | — | — | PTFE-1 | 15 |

TABLE 3 (1-3)

| | BD-1 | | | | Evaluation 1 Bridge defect inhibition performance | Evaluation 2 Post-development defect inhibition performance | Evaluation 3 Pot life |
|---|---|---|---|---|---|---|---|
| | Material component | Pore size (nm) | Tank TD-1 | Circulation | | | |
| Chemical liquid 201 | UPE | 1 | — | Performed | A | A | A |
| Chemical liquid 202 | UPE | 1 | — | Performed | A | A | AA |
| Chemical liquid 203 | — | — | — | — | C | C | Standard |
| Chemical liquid 204 | UPE | 1 | — | Performed | A | A | A |
| Chemical liquid 205 | UPE | 1 | — | Performed | A | A | AA |
| Chemical liquid 206 | — | — | — | — | C | C | D |
| Chemical liquid 207 | UPE | 1 | — | Performed | A | A | A |
| Chemical liquid 208 | UPE | 1 | — | Performed | A | A | AA |
| Chemical liquid 209 | — | — | — | — | C | C | D |

Table 3 is divided into Table 3 (1-1) to Table 3 (1-3). In the corresponding lines of the tables subdivided from Table 3, the filtering devices used for purifying the chemical liquids and the obtained evaluation results of chemical liquids are described.

For example, in the first line of each of the subdivision tables, the chemical liquid 201 is described.

The first line shows that the chemical liquid 201 was manufactured by the filtering device illustrated in FIG. 26, and the liquid to be purified used for manufacturing the chemical liquid 201 was the resist resin composition 2. In addition, the first line shows that the filter of the filtering device used for manufacturing the chemical liquid 201 was washed in advance under the condition of "PGMEA 1 day immersion". Furthermore, the first line shows that the filtering device has BU-1 (a nylon-containing filter having a pore size of 10 nm), a tank TU-1 on the upstream side of the filter F-A, a PTFE-3 filter having a pore size of 10 nm as F-A (filter A), and BD-1 (a UPE-containing filter having a pore size of 1 nm) on the downstream side of F-A. The first line also shows that the circulation filtration was "performed".

As is evident from the first line, the chemical liquid 201 was evaluated as A for the bridge defect inhibition performance, A for the post-development defect inhibition performance, and A for the pot life of the filter of the filtering device.

Likewise, for the chemical liquids 202 to 209, the results are described in the above tables.

For the chemical liquids 1 to 13, the chemical liquids 15 to 28, the chemical liquids 30 to 33, the chemical liquids 35 to 56, the chemical liquids 101 and 102, the chemical liquids 201 and 202, the chemical liquids 204 and 205, the chemical liquids 207 and 208, and the chemical liquids 210 to 213, chemical liquids were prepared using the same filtering device (purification device) as that described in the tables. In this case, circulation filtration was not performed. The obtained chemical liquids were evaluated in terms of the items described in the tables. As a result, the obtained chemical liquids were found to have excellent defect inhibition performance. Furthermore, it has been confirmed that the pot life of the filter is also excellent as described above.

Generally, from the viewpoint of productivity and costs, it is preferable to perform purification without circulation filtration. In contrast, because the filter A included in the filtering device according to an embodiment of the present invention uses a porous base material made of polyfluorocarbon as a base material, the amount of impurities that are caused by the circulation filtration and unintentionally mixed into the liquid to be purified from the filter A is further reduced. In this respect, as the filter A, a porous base material made of PTFE is more preferable.

As is evident from the results described in Tables 1 to 3, the chemical liquids 1 to 33, the chemical liquids 35 to 64, the chemical liquids 101 and 102, the chemical liquids 201 and 202, the chemical liquids 204 and 205, and the chemical liquids 207 and 208 manufactured using the filtering device (or purification device) according to an embodiment of the present invention had excellent defect inhibition performance required according to the type of the chemical liquids (a prewet solution, a developer, a rinsing solution, a peeling solution, a resist resin composition, and the like).

In contrast, the chemical liquid 34, the chemical liquid 103, the chemical liquid 104, the chemical liquid 203, the chemical liquid 206, and the chemical liquid 209 manufactured using the filtering device (or purification device) according to the conventional technique did not have the desired defect inhibition performance.

EXPLANATION OF REFERENCES 100, 200, 300, 400, 500, 600, 700, 800, 900, 1000: filtering device
101: inlet portion
102: outlet portion
103, 104, 201, 601, 104-1, 104-2: filter
105, 202, 301, 302, 402, 501, 502, 602, 701, 801, 802, 803, 804, 901, 1001, 1002, 1003, 1104, 1105, 1305: piping
401, 401(a), 401(b): tank
1100: manufacturing plant
1101: distillation device
1102, 1203, 1303, 1304: distiller
1103: portable tank
1106: transporting unit
1200, 1300: purification device
1201, 1301: second inlet portion
1202, 1302: second outlet portion

What is claimed is:

1. A filtering device for obtaining a chemical liquid by purifying a liquid to be purified, the filtering device comprising:
an inlet portion;
an outlet portion;
a filter A;
at least one filter B different from the filter A; and
a flow path which includes the filter A and the filter B arranged in series between the inlet portion and the outlet portion and extends from the inlet portion to the outlet portion,
wherein the filter A has a porous base material made of polyfluorocarbon and a coating layer which is disposed to cover the porous base material and contains a first resin,
the first resin has a hydrophilic group selected from the group consisting of a polyoxyalkylene group, a carbonic acid ester group, a thiol group, a thioether group, a phosphoric acid group and a phosphoric acid ester group,
the filter B includes at least one filter BU disposed on an upstream side of the filter A on the flow path,
the filter B includes at least a filter BD disposed on a downstream side of the filter A on the flow path,
the at least one filter BU has a pore size equal to or greater than 20 nm,
the at least one filter BD has a pore size equal to or smaller than 20 nm,
the at least one filter BU has a pore size larger than a pore size of the filter A, and
in a case where the hydrophilic group is a polyoxyalkylene group, the first resin includes a repeating unit C represented by the following formula, in which m represents the molar fraction of the repeating unit C in the resin,

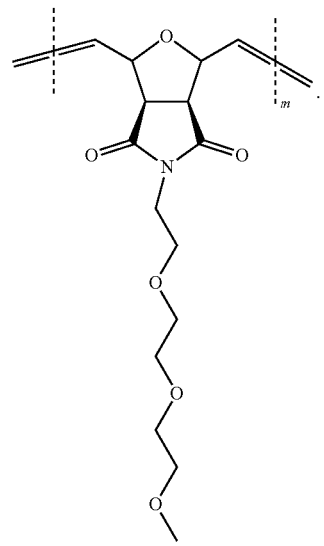

2. The filtering device according to claim 1, wherein the hydrophilic group is a polyoxyalkylene group.

3. The filtering device according to claim 1, wherein the at least one filter BU contains a resin having an ion exchange group.

4. The filtering device according to claim 3, wherein the ion exchange group is at least one selected from the group consisting of an acid group, a base group, an amide group, and an imide group.

5. The filtering device according to claim 1,
wherein the at least one filter BU is different from the filter A at least in terms of material.

6. The filtering device according to claim 1, further comprising:
a return flow path capable of returning the liquid to be purified to an upstream side of a first reference filter from a downstream side of the first reference filter,
wherein the first reference filter consists of at least one selected from the group consisting of the filter A and the filter BU.

7. The filtering device according to claim 1,
wherein the at least one filter BD has a pore size smaller than a pore size of the filter A.

8. The filtering device according to claim 1,
wherein the filter BD contains at least one selected from the group consisting of polyolefin, polyamide, polyfluorocarbon, polystyrene, polysulfone, and polyethersulfone.

9. The filtering device according to claim 1,
wherein the filter BD contains a second resin having a hydrophilic group.

10. The filtering device according to claim 1, further comprising:
a return flow path capable of returning the liquid to be purified to an upstream side of a second reference filter from a downstream side of the second reference filter,
wherein the second reference filter consists of at least one selected from the group consisting of the filter A and the filter BD.

11. The filtering device according to claim 1, further comprising:
a tank arranged in series with the filter A on the flow path.

12. The filtering device according to claim 11, further comprising:
a filter C which is arranged in series with the tank on an upstream side of the tank in the flow path and has a pore size equal to or greater than 20 nm.

13. The filtering device according to claim 1,
wherein the chemical liquid is at least one selected from the group consisting of a developer, a rinsing solution, a wafer washing solution, a line washing solution, a prewet solution, a wafer rinsing solution, a resist solution, a solution for forming an underlayer film, a solution for forming an overlayer film, and a solution for forming a hardcoat, or at least one selected from the group consisting of an aqueous developer, an aqueous rinsing solution, a peeling solution, a remover, an etching solution, an acidic washing solution, and a phosphoric acid, and a phosphoric acid-aqueous hydrogen peroxide mixture.

14. A purification device comprising:
the filtering device according to claim 1; and
at least one distiller connected to the inlet portion of the filtering device.

15. The purification device according to claim 14,
wherein the at least one distiller includes a plurality of distillers connected in series.

16. A method for manufacturing a chemical liquid that is for obtaining a chemical liquid by purifying a liquid to be purified, the method comprising:
a filtration step of purifying the liquid to be purified by using the filtering device according to claim 1 so as to obtain a chemical liquid.

17. The method for manufacturing a chemical liquid according to claim 16, further comprising:
a filter washing step of washing the filter A and the filter B before the filtration step.

18. The method for manufacturing a chemical liquid according to claim 16, further comprising:
a device washing step of washing a liquid contact portion of the filtering device before the filtration step.

19. A method for manufacturing a chemical liquid by purifying a liquid to be purified, the method comprising:
a step of filtering the liquid to be purified by using a filter A including a porous base material made of polyfluorocarbon and a coating layer which is disposed to cover the porous base material and contains a first resin having a hydrophilic group, selected from the group consisting of a polyoxyalkylene group, a carbonic acid ester group, a thiol group, a thioether group, a phosphoric acid group and a phosphoric acid ester group, and a filter B different from the filter A so as to obtain a chemical liquid,
the filter B includes at least one filter BU disposed on an upstream side of the filter A on a flow path,
the filter B includes at least a filter BD disposed on a downstream side of the filter A on the flow path,
the at least one filter BU has a pore size equal to or greater than 20 nm,
the at least one filter BD has a pore size equal to or smaller than 20 nm,
the at least one filter BU has a pore size larger than a pore size of the filter A, and
in a case where the hydrophilic group is a polyoxyalkylene group, the first resin includes a repeating unit C represented by the following formula, in which m represents the molar fraction of the repeating unit C in the resin, 20. The filtering device according to claim 1,
wherein a pore size of the filter A is equal to or smaller than 200 nm.

21. A filtering device for obtaining a chemical liquid by purifying a liquid to be purified, the filtering device comprising:
an inlet portion;
an outlet portion;
a filter A;
at least one filter B different from the filter A;
a flow path which includes the filter A and the filter B arranged in series between the inlet portion and the outlet portion and extends from the inlet portion to the outlet portion;
a return flow path connected to the flow path in parallel capable of returning the liquid to be purified to an upstream side of the filter A from a downstream side of the filter A; and
a tank arranged in series with the filter A on the flow path,
wherein the filter A has a porous base material made of polyfluorocarbon and a coating layer which is disposed to cover the porous base material and contains a first resin,
the first resin has a hydrophilic group selected from the group consisting of a polyoxyalkylene group, a carbonic acid ester group, a thiol group, a thioether group, a phosphoric acid group and a phosphoric acid ester group,
one end of the return flow path is connected to the flow path on a downstream side of the tank, and
in a case where the hydrophilic group is a polyoxyalkylene group, the first resin includes a repeating unit C represented by the following formula, in which m represents the molar fraction of the repeating unit C in the resin,

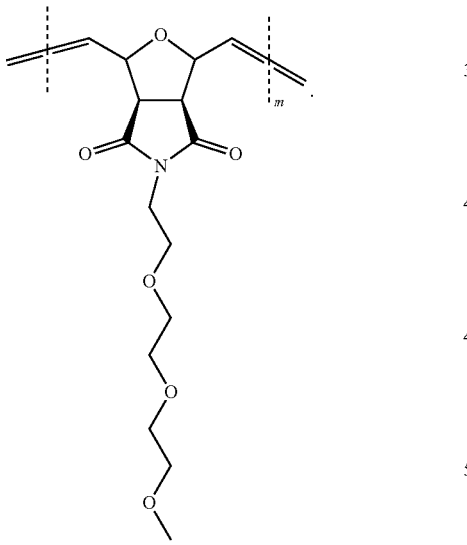

22. A filtering device for obtaining a chemical liquid by purifying a liquid to be purified, the filtering device comprising:
an inlet portion;
an outlet portion;
a filter A;
at least one filter B different from the filter A;
a flow path which includes the filter A and the filter B arranged in series between the inlet portion and the outlet portion and extends from the inlet portion to the outlet portion; and
a return flow path connected to the flow path in parallel capable of returning the liquid to be purified to an upstream side of a first reference filter from a downstream side of the first reference filter, wherein the filter A has a porous base material made of polyfluorocarbon and a coating layer which is disposed to cover the porous base material and contains a first resin,
the first resin has a hydrophilic group selected from the group consisting of a polyoxyalkylene group, a carbonic acid ester group, a thiol group, a thioether group, a phosphoric acid group and a phosphoric acid ester group,
the filter B includes at least one filter BU disposed on an upstream side of the filter A on the flow path,
the at least one filter BU contains a resin having an ion exchange group,
the first reference filter consists of at least one selected from the group consisting of the filter A and the filter BU, and
in a case where the hydrophilic group is a polyoxyalkylene group, the first resin includes a repeating unit C represented by the following formula, in which m represents the molar fraction of the repeating unit C in the resin,

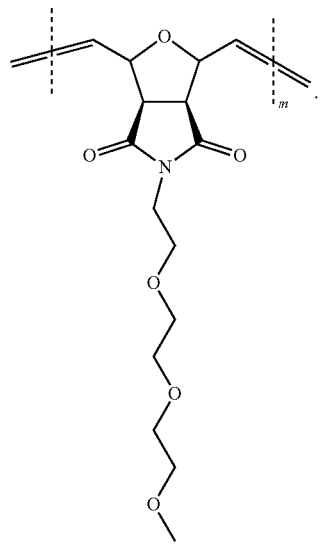

23. A filtering device for obtaining a chemical liquid by purifying a liquid to be purified, the filtering device comprising:
an inlet portion;
an outlet portion;
a filter A;
at least one filter B different from the filter A;
a flow path which includes the filter A and the filter B arranged in series between the inlet portion and the outlet portion and extends from the inlet portion to the outlet portion; and
a tank arranged in series between the filter A and the filter B on the flow path,
wherein the filter A has a porous base material made of polyfluorocarbon and a coating layer which is disposed to cover the porous base material and contains a first resin,
the first resin has a hydrophilic group, selected from the group consisting of a polyoxyalkylene group, a carbonic acid ester group, a thiol group, a thioether group, a phosphoric acid group and a phosphoric acid ester group,
the at least one filter BU has a pore size larger than a pore size of the filter A, and in a case where the hydrophilic group is a polyoxyalkylene group, the first resin includes a repeating unit C represented by the following formula, in which m represents the molar fraction of the repeating unit C in the resin,
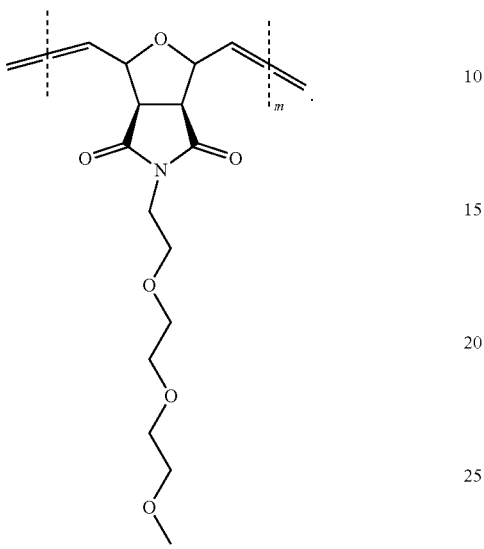
24. The filter device according to claim 16, wherein the hydrophilic group is a polyoxyalkylene group.
* * * * *